(12) United States Patent
Lee et al.

(10) Patent No.: US 12,512,045 B2
(45) Date of Patent: Dec. 30, 2025

(54) DISPLAY APPARATUS

(71) Applicant: Samsung Display Co., LTD., Yongin-si (KR)

(72) Inventors: Sunhwa Lee, Yongin-si (KR); Hyeongseok Kim, Yongin-si (KR); Heejean Park, Yongin-si (KR); Mukyung Jeon, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 18/903,934

(22) Filed: Oct. 1, 2024

(65) Prior Publication Data
US 2025/0124855 A1 Apr. 17, 2025

(30) Foreign Application Priority Data
Oct. 11, 2023 (KR) .................. 10-2023-0135410

(51) Int. Cl.
*G09G 3/32* (2016.01)
*H01L 25/075* (2006.01)
*H01L 25/16* (2023.01)
*H10D 86/40* (2025.01)
*H10D 86/60* (2025.01)
*H10H 20/857* (2025.01)

(52) U.S. Cl.
CPC ............ *G09G 3/32* (2013.01); *H01L 25/0753* (2013.01); *H01L 25/167* (2013.01); *H10D 86/443* (2025.01); *H10D 86/60* (2025.01); *H10H 20/857* (2025.01); *G09G 2300/0426* (2013.01); *G09G 2310/0267* (2013.01)

(58) Field of Classification Search
CPC ...... H10H 29/30; H10H 20/857; H10H 29/49; H10D 86/443; H10D 86/60; G09G 3/32; G09G 3/3266; G09G 2310/0267; G09G 2300/0426; H01L 25/167; H01L 25/0753
See application file for complete search history.

(56) References Cited

U.S. PATENT DOCUMENTS 9,841,548 B2 * 12/2017 Kim ...................... G06F 1/1643
11,659,742 B2 * 5/2023 Won .................... H10K 59/1216
257/72

(Continued)

FOREIGN PATENT DOCUMENTS

CN 115223449 A 10/2022
JP 2021128186 A 9/2021

(Continued)

*Primary Examiner* — Vinh T Lam
(74) *Attorney, Agent, or Firm* — CANTOR COLBURN LLP

(57) ABSTRACT

A display apparatus includes a substrate including a first island portion and a second island portion spaced apart from each other and a bridge portion connected between the first island portion and the second island portion, a gate driving circuit arranged in the first island portion, a plurality of first input lines arranged in the second island portion, an output line arranged in the bridge portion and connected to the gate driving circuit, and a connection line arranged in the bridge portion and connected to at least one of the plurality of first input lines, where the output line and the connection line are arranged in different layers, respectively, and arranged to overlap each other.

28 Claims, 34 Drawing Sheets

(56) References Cited

U.S. PATENT DOCUMENTS

| | | | |
|---|---|---|---|
| 11,688,350 B2 * | 6/2023 | Park | G09G 3/3258 345/204 |
| 12,021,090 B2 * | 6/2024 | Hu | H10K 77/111 |
| 12,136,392 B2 * | 11/2024 | Choi | H10K 59/88 |
| 12,148,378 B2 * | 11/2024 | Lee | G09G 3/32 |
| 12,150,356 B2 * | 11/2024 | Sin | H10K 59/124 |
| 12,159,571 B2 * | 12/2024 | Kim | G09G 3/3233 |
| 12,376,461 B2 * | 7/2025 | Zhang | H10D 89/931 |
| 2015/0263256 A1 * | 9/2015 | Hsieh | H01L 25/0753 257/91 |
| 2020/0035778 A1 | 1/2020 | Kim et al. | |
| 2020/0168824 A1 * | 5/2020 | Park | H10K 77/111 |
| 2022/0140264 A1 * | 5/2022 | Park | H10K 59/131 257/770 |
| 2022/0199736 A1 * | 6/2022 | Wang | G09G 3/3266 |
| 2022/0328604 A1 * | 10/2022 | Yang | H10K 59/131 |
| 2022/0415988 A1 | 12/2022 | Ikeda et al. | |
| 2023/0019182 A1 | 1/2023 | Lee et al. | |
| 2023/0225159 A1 | 7/2023 | Yoon et al. | |
| 2023/0232678 A1 | 7/2023 | Cho et al. | |
| 2023/0247879 A1 | 8/2023 | Cho et al. | |
| 2024/0213267 A1 * | 6/2024 | Jeong | H10D 86/60 |
| 2025/0008787 A1 * | 1/2025 | Zhang | H10K 59/1216 |
| 2025/0015097 A1 * | 1/2025 | Choi | H10D 86/60 |
| 2025/0022886 A1 * | 1/2025 | Xue | H10K 77/111 |
| 2025/0081698 A1 * | 3/2025 | Kim | H10H 20/018 |
| 2025/0098458 A1 * | 3/2025 | Park | H10K 59/131 |
| 2025/0107238 A1 * | 3/2025 | Park | H01L 25/0753 |
| 2025/0107300 A1 * | 3/2025 | Kim | H10D 86/60 |

FOREIGN PATENT DOCUMENTS

| | | |
|---|---|---|
| KR | 1020200012255 A | 2/2020 |
| KR | 1020200064231 A | 6/2020 |
| KR | 102519417 B1 | 4/2023 |
| KR | 102528403 B1 | 4/2023 |
| KR | 1020230108761 A | 7/2023 |
| KR | 1020230111703 A | 7/2023 |
| KR | 1020230117011 A | 8/2023 |

* cited by examiner

DISPLAY APPARATUS

This application claims priority to Korean Patent Application No. 10-2023-0135410, filed on Oct. 11, 2023, and all the benefits accruing therefrom under 35 U.S.C. § 119, the content of which in its entirety is herein incorporated by reference.

BACKGROUND

1. Field

One or more embodiments relate to a display apparatus, and more particularly, to a flexible display apparatus or a stretchable display apparatus.

2. Description of the Related Art

As display apparatuses visually displaying electrical signals have developed, various display apparatuses with desired characteristics such as slimness, lightweightness, and low power consumption have been introduced. For example, flexible display apparatuses capable of being folded or rolled into a roll shape have been introduced. Recently, research and development have been actively conducted on stretchable display apparatuses capable of changing into various forms.

SUMMARY

One or more embodiments include a display apparatus that is stretchable while minimizing a load of lines.

According to one or more embodiments, a display apparatus includes a substrate including a first island portion and a second island portion spaced apart from each other and a bridge portion connected between the first island portion and the second island portion, a gate driving circuit arranged in the first island portion, a plurality of first input lines arranged in the second island portion, an output line arranged in the bridge portion and connected to the gate driving circuit, and a connection line arranged in the bridge portion and connected to at least one of the plurality of first input lines, where the output line and the connection line are arranged in different layers, respectively, and arranged to overlap each other.

In an embodiment, the bridge portion may be arranged at a center of a side surface of each of the first island portion and the second island portion.

In an embodiment, the first island portion and the second island portion may be arranged alternately in a first row in a first direction, the first island portion may be continuously arranged in a first column in a second direction intersecting the first direction, and the second island portion may be continuously arranged in a second column in the second direction.

In an embodiment, a first bridge portion and a second bridge portion may be arranged on opposing sides of the second island portion in the first direction, the connection line may be arranged in only one of the first bridge portion and the second bridge portion, and the output line may extend through the first bridge portion and the second bridge portion.

In an embodiment, a third bridge portion and a fourth bridge portion may be arranged on opposing sides of the second island portion in the second direction, and the plurality of first input lines may extend through the third bridge portion and the fourth bridge portion.

In an embodiment, the substrate may include a display area and a non-display area surrounding the display area, and the first island portion and the second island portion may be arranged in the non-display area.

In an embodiment, the substrate may further include a plurality of main island portions arranged in the display area, and a planar area of each of the first island portion and the second island portion may be greater than a planar area of one of the plurality of main island portions.

In an embodiment, the gate driving circuit may include at least one selected from an emission control driving circuit, a bypass driving circuit, an initialization driving circuit, and a data write driving circuit.

In an embodiment, the output line may include at least one selected from an emission control output line which transmits an output signal of the emission control driving circuit, a bypass output line which transmits an output signal of the bypass driving circuit, an initialization output line which transmits an output signal of the initialization driving circuit, and a data write output line which transmits an output signal of the data write driving circuit.

In an embodiment, the plurality of first input lines may include at least one of a gate high voltage line, a gate low voltage line, and a start signal line.

In an embodiment, the connection line may include at least one selected from a high voltage connection line connected to the gate high voltage line and a low voltage connection line connected to the gate low voltage line.

In an embodiment, the display apparatus may further include a plurality of second input lines arranged in the first island portion, where the plurality of second input lines may include at least one selected from a clock line, a carry line, and a reset signal line.

In an embodiment, the plurality of second input lines may extend through a bridge portion connected between the first island portion and another first island portion adjacent to the first island portion.

In an embodiment, the bridge portion may have a serpentine shape.

In an embodiment, the output line may extend from the bridge portion to be also arranged in the second island portion and may extend in a direction intersecting the plurality of first input lines.

In an embodiment, the display apparatus may further include a bridge electrode arranged in an area overlapping the plurality of first input lines in the second island portion, and intersecting the plurality of first input lines, where the output line may be connected to opposing ends of the bridge electrode, and the bridge electrode may be disposed under the output line and the plurality of first input lines.

In an embodiment, the connection line may be disposed over the output line, and at least one insulating layer may be arranged between the connection line and the output line.

In an embodiment, the output line may include a plurality of lines in the bridge portion, and the plurality of lines may be arranged apart from each other in a plan view.

In an embodiment, the substrate may further include a plurality of main island portions arranged in a display area, where a pixel driving circuit unit and a light emitting element connected to the pixel driving circuit unit may be arranged in each of the plurality of main island portions, and the pixel driving circuit unit and the light emitting element may be connected through a first connection electrode disposed over the pixel driving circuit unit and a second connection electrode disposed over the first connection electrode.

In an embodiment, the output line may be arranged in a same layer as at least one selected from a source electrode and a drain electrode of the pixel driving circuit unit and may include a same material as the source electrode or the drain electrode, and the connection line may be arranged in a same layer as the first connection electrode and may include a same material as the first connection electrode.

In an embodiment, the output line may have a dual-line structure including a lower output line and an upper output line disposed over the lower output line, and at least one insulating layer may be arranged between the lower output line and the upper output line.

In an embodiment, the lower output line and the upper output line may be connected to each other through a contact hole, and the contact hole may be arranged in the first island portion.

In an embodiment, the lower output line may be arranged in a same layer as at least one selected from a source electrode and a drain electrode of the pixel driving circuit unit, the upper output line may be arranged in a same layer as the first connection electrode, and the connection line may be arranged in a same layer as the second connection electrode.

In an embodiment, the display apparatus may further include a shielding line arranged between the output line and the connection line, where at least one insulating layer may be arranged between the output line and the shielding line, and at least one insulating layer may be arranged between the shielding line and the connection line.

In an embodiment, the display apparatus may further include a ground voltage line arranged adjacent to the plurality of first input lines in the second island portion, wherein the shielding line may be connected to the ground voltage line.

In an embodiment, the output line may be arranged in a same layer as at least one selected from a source electrode and a drain electrode of the pixel driving circuit unit, the shielding line may be arranged in a same layer as the first connection electrode, and the connection line may be arranged in a same layer as the second connection electrode.

In an embodiment, the shielding line may include a single line in the bridge portion.

In an embodiment, the shielding line may include a plurality of shielding lines in the bridge portion, and the plurality of shielding lines may be arranged apart from each other.

BRIEF DESCRIPTION OF THE DRAWINGS

The above and other features of certain embodiments of the disclosure will be more apparent from the following description taken in conjunction with the accompanying drawings, in which.

DETAILED DESCRIPTION

Figure 1:
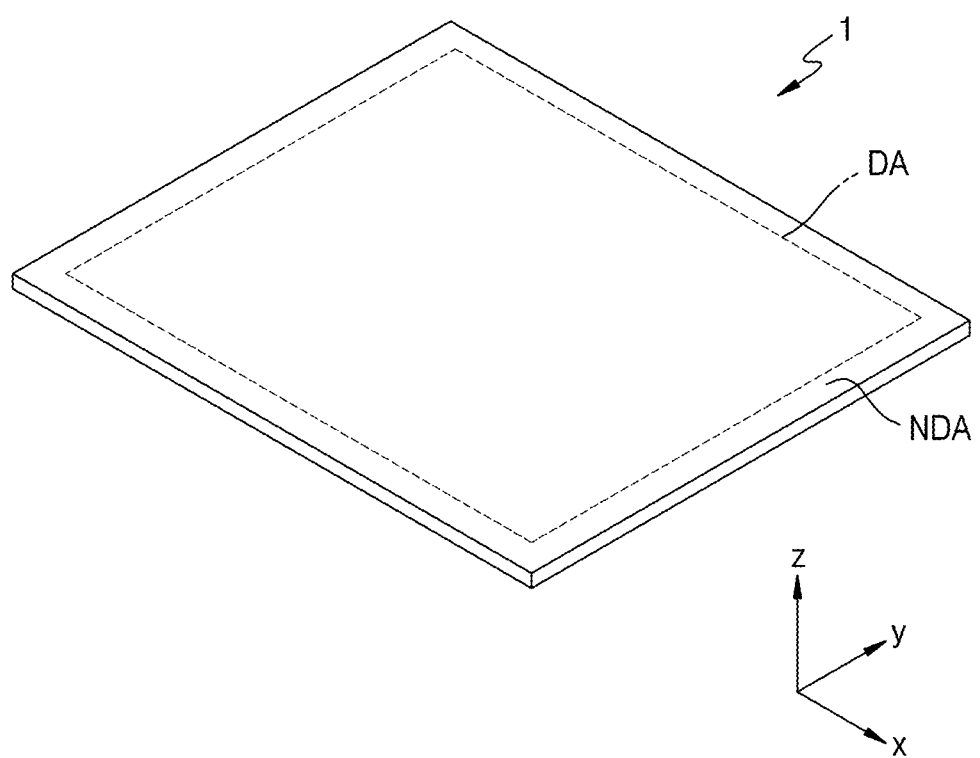
FIG. 1 is a perspective view schematically illustrating a display apparatus according to an embodiment.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art.

As used herein, the term "and/or" includes any and all combinations of one or more of the associated listed items. "Or" means "and/or." Throughout the disclosure, the expression "at least one of a, b or c" or "at least one selected from a, b and c" indicates only a, only b, only c, both a and b, both a and c, both b and c, all of a, b, and c, or variations thereof.

The disclosure may include various embodiments and modifications, and particular embodiments thereof are illustrated in the drawings and will be described herein in detail. The effects and features of the disclosure and the accomplishing methods thereof will become apparent from the embodiments described below in detail with reference to the accompanying drawings. However, the disclosure is not limited to the embodiments described below, and may be embodied in various modes.

Hereinafter, embodiments will be described in detail with reference to the accompanying drawings, and in the following description, like reference numerals will denote like elements and redundant descriptions thereof will be omitted.

It will be understood that although terms such as "first" and "second" may be used herein to describe various elements, these elements should not be limited by these terms and these terms are only used to distinguish one element from another element.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. Thus, reference to "an" element in a claim followed by reference to "the" element is inclusive of one element and a plurality of the elements. For example, "an element" has the same meaning as "at least one element," unless the context clearly indicates otherwise. "At least one" is not to be construed as limiting "a" or "an.".

It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

It will be understood that when a layer, region, area, component, or element is referred to as being "on" another layer, region, area, component, or element, it may be "directly on" the other layer, region, area, component, or element or may be "indirectly on" the other layer, region, area, component, or element with one or more intervening layers, regions, areas, components, or elements therebetween.

Sizes of elements in the drawings may be exaggerated for convenience of description. In other words, because the sizes and shapes of components in the drawings are arbitrarily illustrated for convenience of description, the disclosure is not limited thereto.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The terms "below" or "beneath" can, therefore, encompass both an orientation of above and below.

When a certain embodiment may be implemented differently, a particular process order may be performed differently from the described order. For example, two processes described in succession may be performed substantially at the same time or may be performed in an order opposite to the described order.

As used herein, "A and/or B" represents the case of A, B, or A and B. Also, "at least one of A and B" represents the case of A, B, or A and B.

It will be understood that when a layer, region, or component is referred to as being "connected to" another layer, region, or component, it may be "directly connected to" the other layer, region, or component or may be "indirectly connected to" the other layer, region, or component with one or more intervening layers, regions, or components therebetween. For example, it will be understood that when a layer, region, or component is referred to as being "electrically connected to" another layer, region, or component, it may be "directly electrically connected to" the other layer, region, or component and/or may be "indirectly electrically connected to" the other layer, region, or component with one or more intervening layers, regions, or components therebetween.

The x axis, the y axis, and the z axis are not limited to three axes of the rectangular coordinate system and may be interpreted in a broader sense. For example, the x-axis, y-axis, and z-axis may be perpendicular to each other or may refer to different directions that are not perpendicular to each other.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Figure 2A:
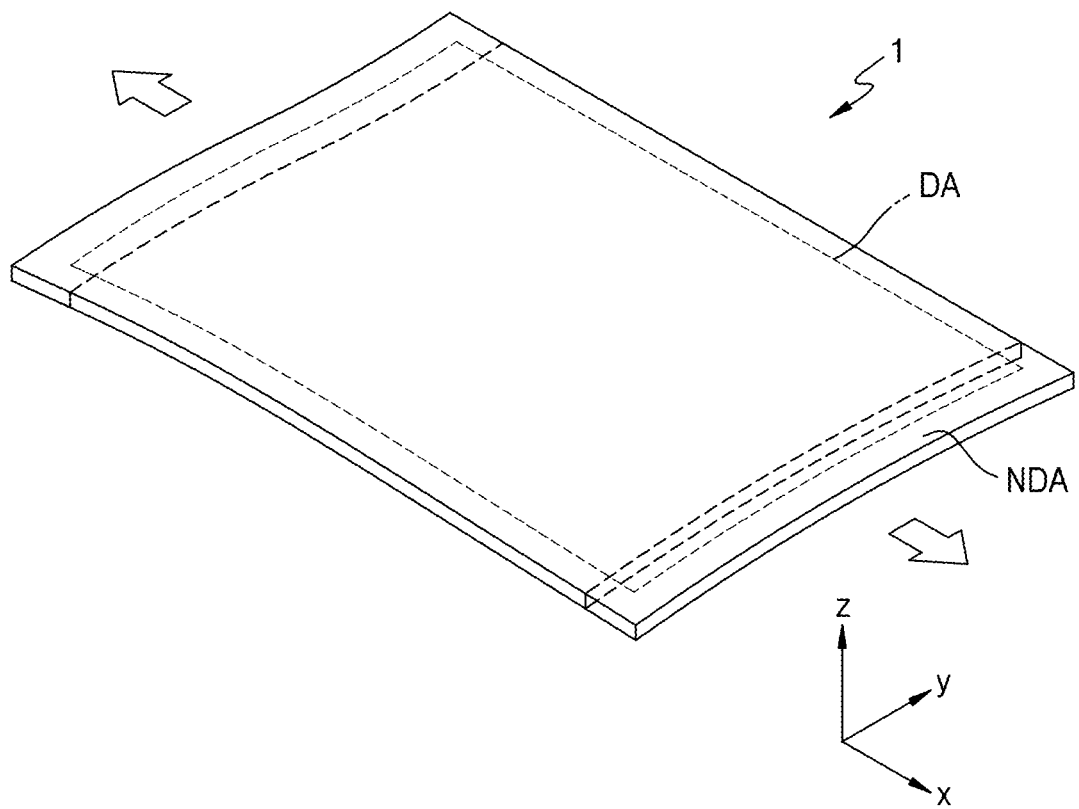
FIGS. 2A and 2B are perspective views illustrating the display apparatus of FIG. 1 stretched in a first direction.
Figure 2B:
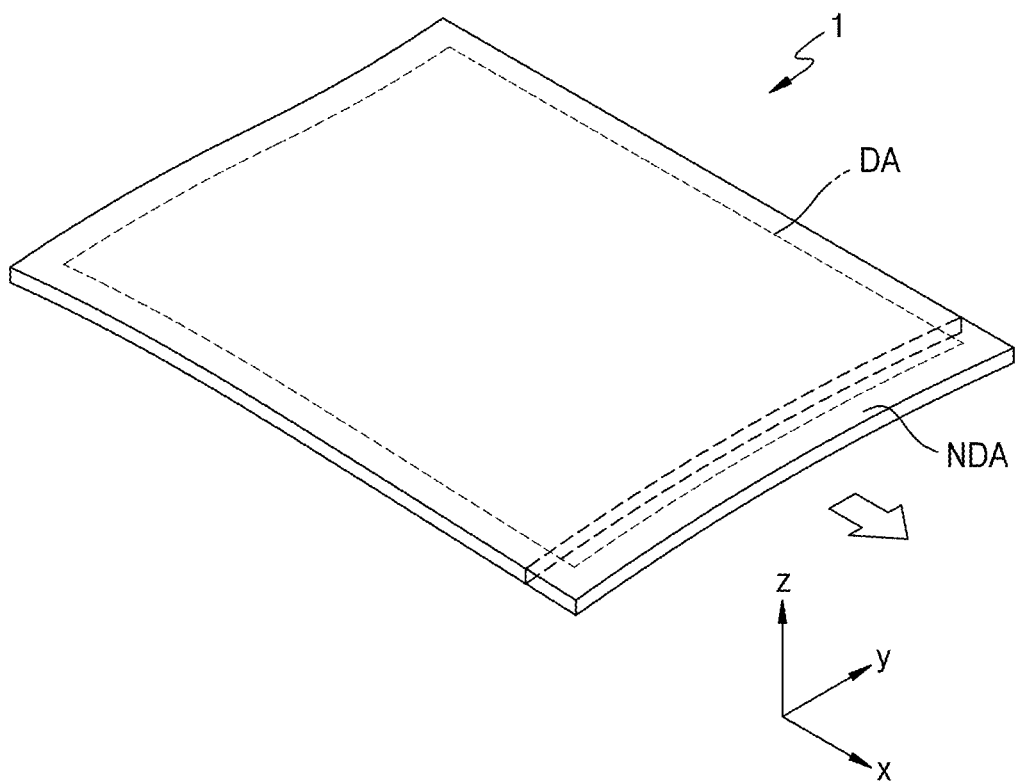
Figure 2C:
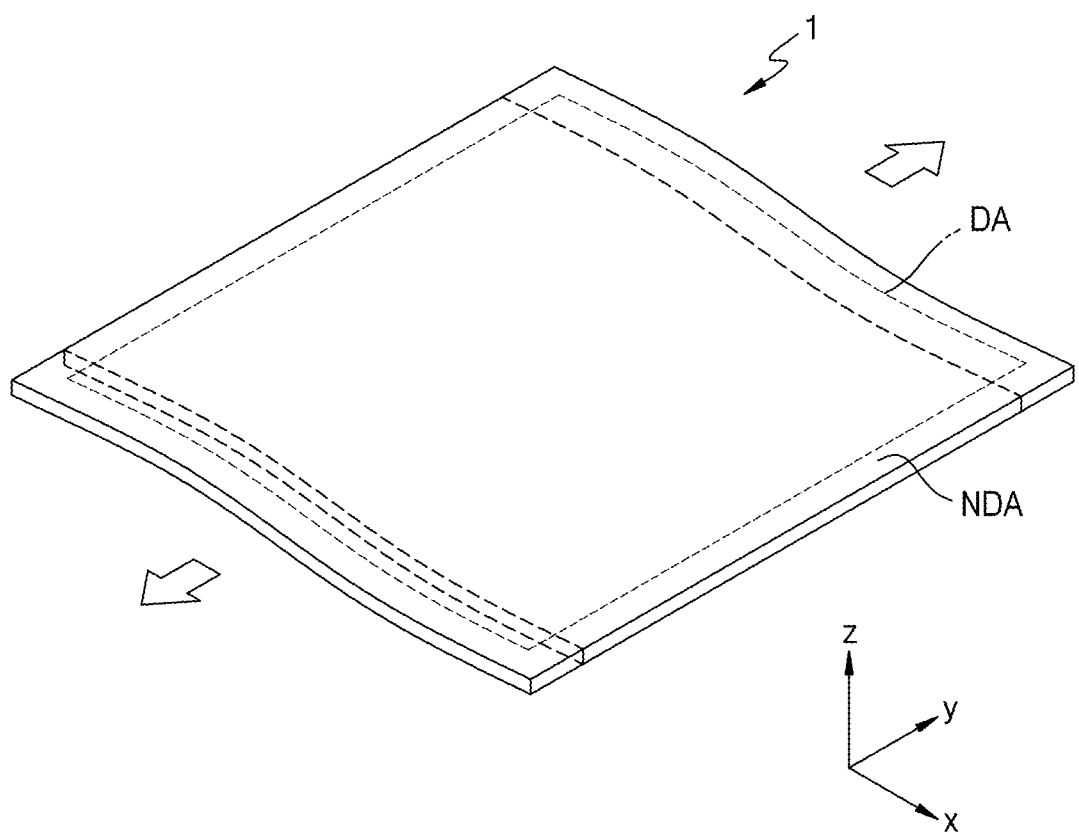
FIG. 2C is a perspective view illustrating the display apparatus of FIG. 1 stretched in a second direction.
Figure 2D:
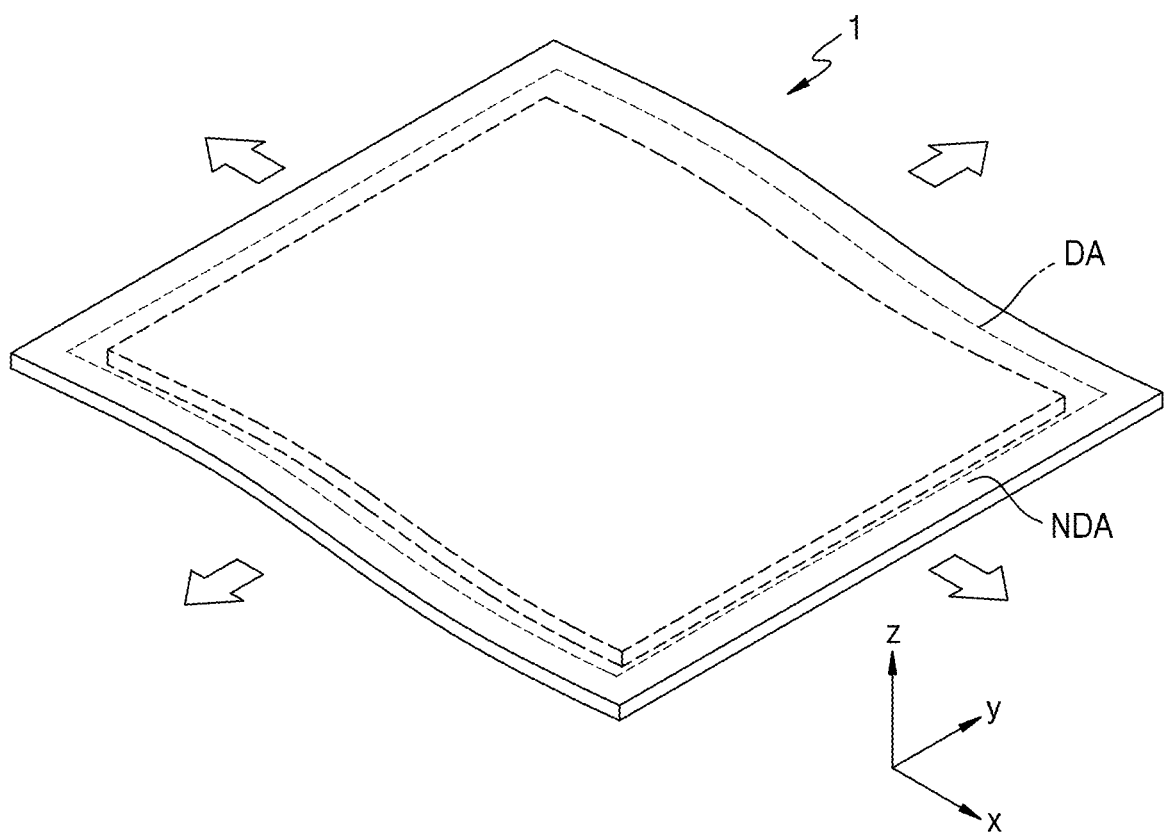
FIG. 2D is a perspective view illustrating the display apparatus of FIG. 1 stretched in the first direction and the second direction.
Figure 2E:
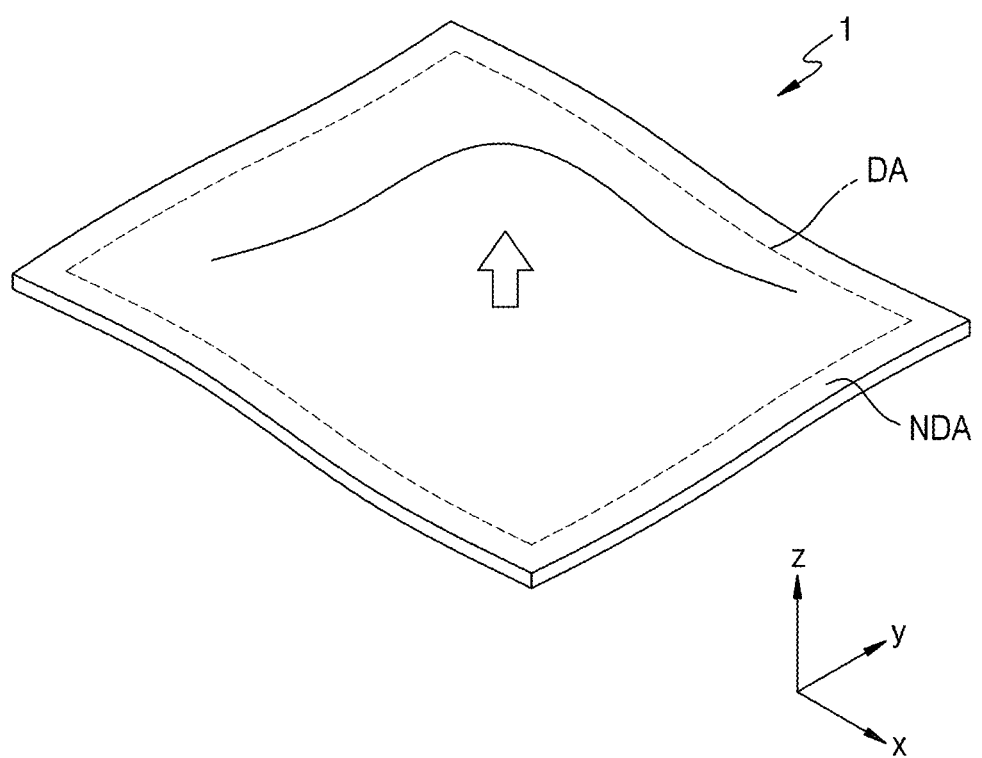
FIG. 2E is a perspective view illustrating the display apparatus of FIG. 1 stretched in a third direction.

FIG. 1 is a perspective view schematically illustrating a display apparatus 1 according to an embodiment. FIGS. 2A and 2B are perspective views illustrating the display apparatus 1 of FIG. 1 stretched in a first direction. FIG. 2C is a perspective view illustrating the display apparatus 1 of FIG. 1 stretched in a second direction. FIG. 2D is a perspective view illustrating the display apparatus 1 of FIG. 1 stretched in the first direction and the second direction. FIG. 2E is a perspective view illustrating the display apparatus 1 of FIG. 1 stretched in a third direction.

Referring to FIG. 1, an embodiment of the display apparatus 1 may include a display area DA and a non-display area NDA. The display area DA may include a plurality of pixels. The display apparatus 1 may display a certain image by using light emitted from a plurality of pixels. The non-display area NDA may be arranged outside the display area DA. In an embodiment, for example, the non-display area NDA may entirely surround the display area DA.

The display apparatus 1 may be stretched or shrunk in various directions. The display apparatus 1 may be stretched in a first direction (e.g., x direction and/or −x direction) by an external force applied by an external object or a user. In an embodiment, as illustrated in FIGS. 2A and 2B, the display area DA and/or the non-display area NDA of the display apparatus 1 may be stretched in the first direction (e.g., x direction and/or −x direction). For example, as illustrated in FIG. 2A, the display apparatus 1 may be stretched in the x direction and the −x direction, or as illustrated in FIG. 2B, the display apparatus 1 may be stretched in the x direction with one side thereof fixed.

The display apparatus 1 may be stretched in a second direction (e.g., y direction and/or −y direction) by an external force applied by an external object or a user. In an embodiment, as illustrated in FIG. 2C, the display area DA and/or the non-display area NDA of the display apparatus 1 may be stretched in the y direction and the −y direction. In another embodiment, the display apparatus 1 may be stretched in the y direction or the −y direction with one side thereof fixed.

The display apparatus 1 may be stretched in a plurality of directions, for example, the first direction (e.g., x direction and/or −x direction) and the second direction (e.g., y direction and/or −y direction), by an external force applied by an external object or a portion of a human body. In an embodiment, as illustrated in FIG. 2D, the display area DA and/or the non-display area NDA of the display apparatus 1 may be stretched in the +x direction and the ty direction.

The display apparatus 1 may be stretched in a third direction (e.g., z direction or −z direction) by an external force applied by an external object or a portion of a human body. In an embodiment, as illustrated in FIG. 2E, a portion of the display apparatus 1, for example, a partial area of the display area DA, may become convex in the z direction. In another embodiment, a portion of the display apparatus 1, for example, a partial area of the display area DA, may become convex in the z direction (or concaved in the −z direction).

FIGS. 2A to 2E illustrate embodiments where the display apparatus 1 is stretched in the first direction, the second direction, and/or the third direction; however, the disclosure is not limited thereto. In other embodiments, the display apparatus 1 may be variously modified into atypical shapes, such as being bent or twisted along two or more axes.

Figure 3:
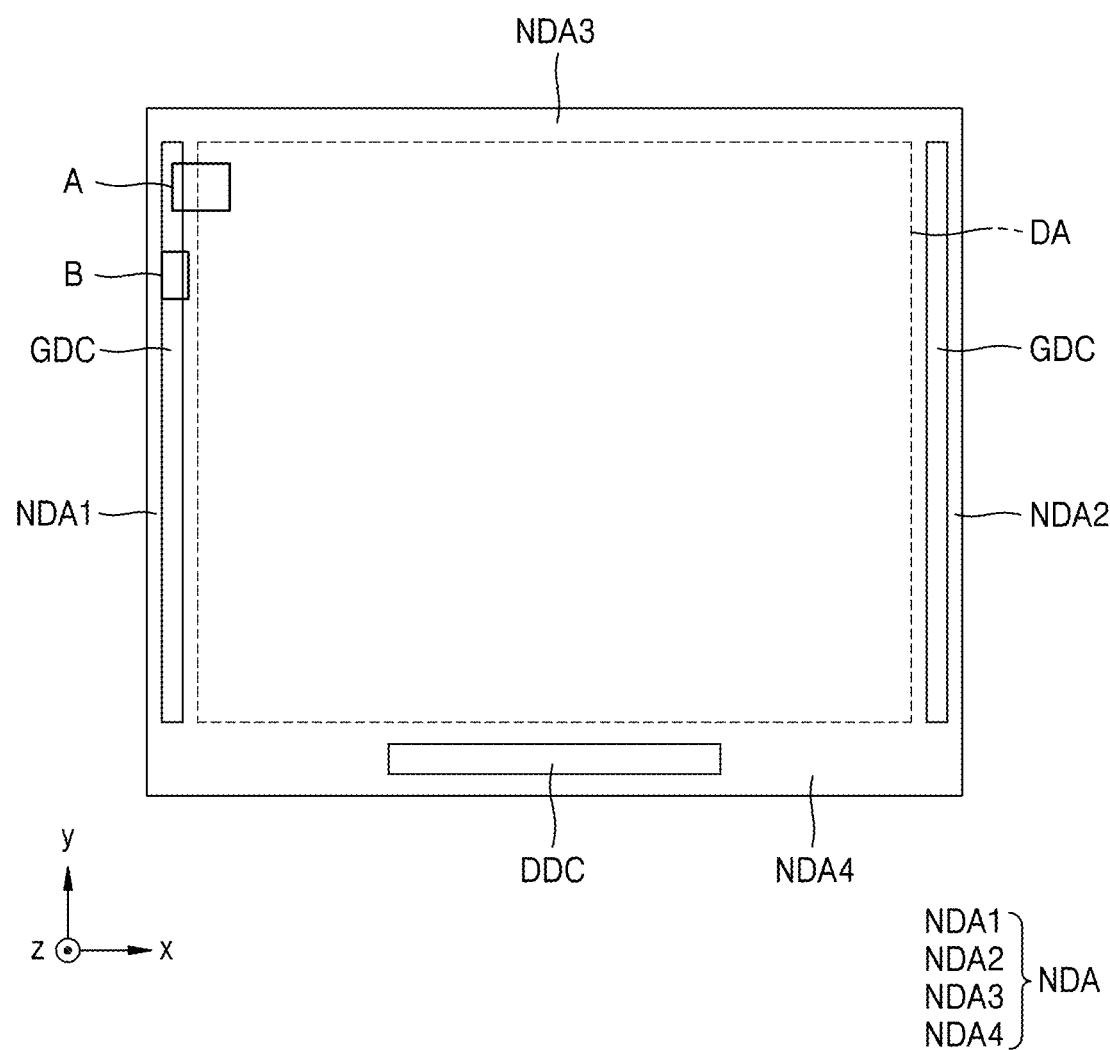
FIG. 3 is a plan view schematically illustrating a display apparatus according to an embodiment.

FIG. 3 is a plan view schematically illustrating a display apparatus 1 according to an embodiment.

In an embodiment, a plurality of pixels may be arranged in a display area DA of the display apparatus 1 (see FIG. 1). Each pixel may include subpixels that emit light of different colors. A light emitting element corresponding to each subpixel may be arranged in the display area DA. A circuit for providing electrical signals to light emitting elements arranged in the display area DA and transistors electrically connected to the light emitting elements may be located in a non-display area NDA around the display area DA. A gate driving circuit GDC may be arranged in each of a first non-display area NDA1 and a second non-display area NDA2 arranged on both sides of the display area DA. The gate driving circuit GDC may include drivers for providing an electrical signal to a gate electrode of each of the transistors electrically connected to the light emitting elements. FIG. 3 illustrates an embodiment where the gate driving circuit GDC is arranged in each of the first non-display area NDA1 and the second non-display area NDA2; however, the disclosure is not limited thereto. In another embodiment, the gate driving circuit GDC may be arranged in any one of the first non-display area NDA1 and the second non-display area NDA2.

A data driving circuit DDC may be arranged in a third non-display area NDA3 and/or a fourth non-display area NDA4 that connect the first non-display area NDA1 with the second non-display area NDA2. in an embodiment, as illustrated in FIG. 3, the data driving circuit DDC is arranged in the fourth non-display area NDA4. In another embodiment, the data driving circuit DDC may be arranged in each of the third non-display area NDA3 and the fourth non-display area NDA4.

FIG. 3 illustrates an embodiment where the data driving circuit DDC is arranged in the fourth non-display area NDA4 of the display apparatus 1 (see FIG. 3); however, the disclosure is not limited thereto. In another embodiment, the display apparatus 1 (see FIG. 3) may further include a flexible circuit board (not illustrated) electrically connected through a terminal unit (not illustrated) arranged in the fourth non-display area NDA4, and the data driving circuit DDC may be disposed on the flexible circuit board.

In some embodiments, the elongation rate of the non-display area NDA may be equal to or less than the elongation rate of the display area DA. In an embodiment, the elongation rate of the non-display area NDA may be different for each area. In an embodiment, for example, the first non-display area NDA1, the second non-display area NDA2, and the third non-display area NDA3 may have substantially the same elongation rate, but the elongation rate of the fourth non-display area NDA4 may be less than the elongation rate of each of the first non-display area NDA1, the second non-display area NDA2, and the third non-display area NDA3.

Figure 4:
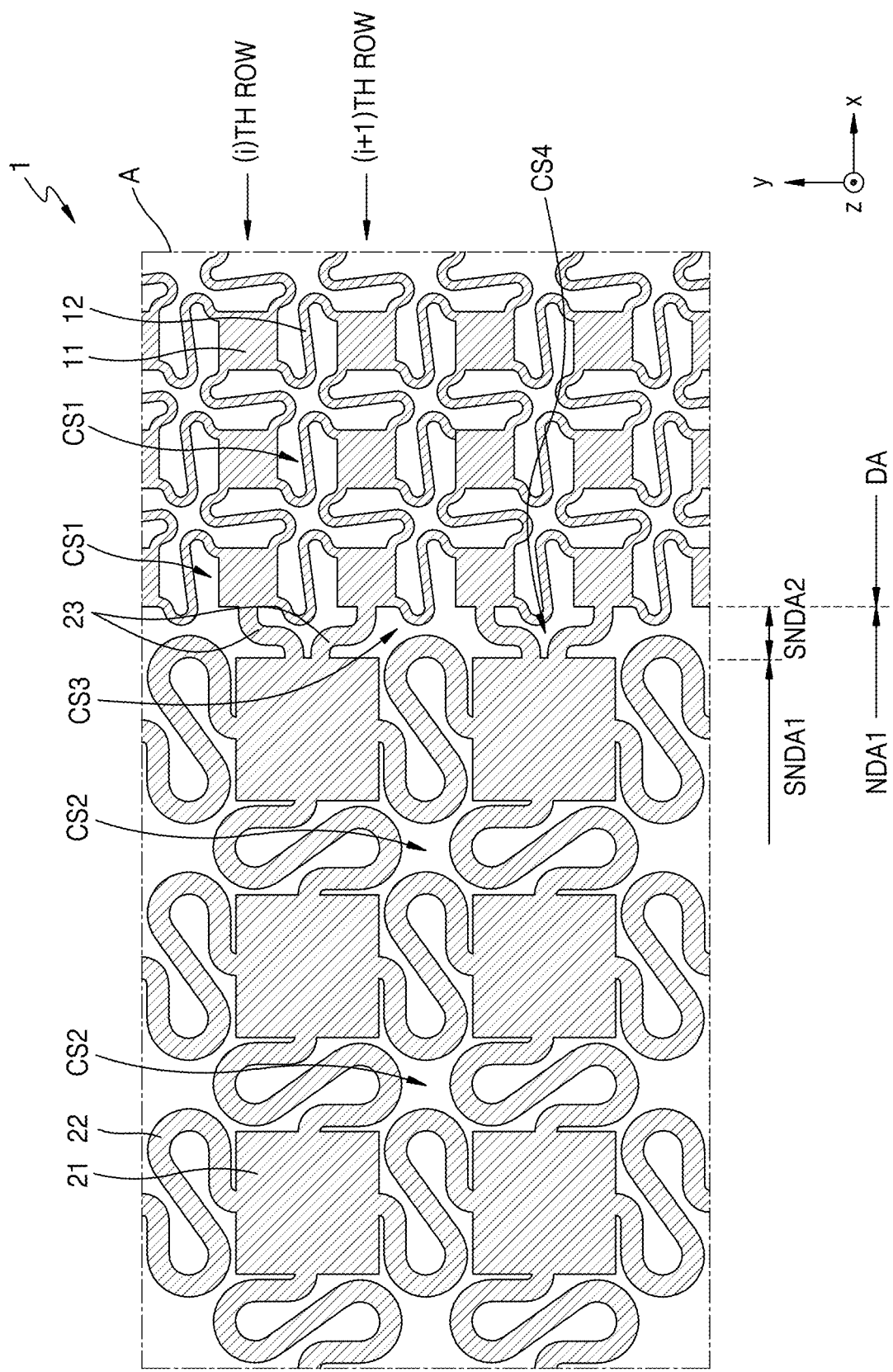
FIG. 4 is an enlarged plan view of region A of FIG. 3 as a portion of a display apparatus according to an embodiment.

FIG. 4 is an enlarged plan view of region A of FIG. 3 as a portion of a display apparatus 1 according to an embodiment.

Referring to FIG. 4, in the display area DA, an embodiment of the display apparatus 1 may include main island portions 11 spaced apart from each other in the first direction (e.g., x direction or −x direction) and the second direction (e.g., y direction or −y direction) and main bridge portions 12 connected between adjacent main island portions 11.

The main bridge portions 12 may be arranged apart from each other by a first opening portion CS1 located between the main bridge portions 12. The main bridge portion 12 may have a serpentine shape. In an embodiment, for example, as illustrated in FIG. 4, the main bridge portion 12 may substantially have an 'S'-like shape.

Each main island portion 11 may be connected to a plurality of main bridge portions 12. In an embodiment, for example, each main island portion 11 may be connected to four main bridge portions 12. Two main bridge portions 12 may be arranged on both opposing sides of the main island portion 11, which are opposite to each other in the first direction (e.g., x direction or −x direction), and the other two main bridge portions 12 may be arranged on both opposing sides of the main island portion 11, which are opposite to each other in the second direction (e.g., y direction or −y direction). The four main bridge portions 12 may be respectively connected to the four sides of the main island portion 11. Each of the four main bridge portions 12 may be connected to each of the corners of the main island portion 11.

In a non-display area, for example, in the first non-display area NDA1 illustrated in FIG. 4, the display apparatus 1 may include peripheral island portions 21 spaced apart from each other in the first direction (e.g., x direction or −x direction) and the second direction (e.g., y direction or −y direction) and peripheral bridge portions 22 connected between adjacent peripheral island portions 21.

The peripheral bridge portions 22 may be arranged apart from each other by a second opening portion CS2 located between the peripheral bridge portions 22. The peripheral bridge portion 22 may have a serpentine shape. In an embodiment, for example, as illustrated in FIG. 4, the peripheral bridge portion 22 may substantially have an 'S'-like shape. The size and/or width of the peripheral bridge portion 22 may be different from the size and/or width of the main bridge portion 12. In an embodiment, for example, the size and/or width of the peripheral bridge portion 22 may be greater than the size and/or width of the main bridge portion 12. The curvature radius of a rounded portion of the peripheral bridge portion 22 may be different from the curvature radius of a rounded portion of the main bridge portion 12. In an embodiment, for example, the curvature radius of a rounded portion of the peripheral bridge portion 22 may be greater than the curvature radius of a rounded portion of the main bridge portion 12.

Each peripheral island portion 21 may be connected to a plurality of peripheral bridge portions 22. The size and/or width of each peripheral island portion 21 may be different from the size and/or width of the main island portion 11. In an embodiment, for example, the planar area of the peripheral island portion 21 may be greater than the planar area of the main island portion 11. Each peripheral island portion 21 may be connected to four peripheral bridge portions 22. Two peripheral bridge portions 22 may be arranged on both opposing sides of the peripheral island portion 21, which are opposite to each other in the first direction (e.g., x direction or −x direction), and the other two peripheral bridge portions 22 may be arranged on both opposing sides of the peripheral island portion 21, which are opposite to each other in the second direction (e.g., y direction or −y direction). In an embodiment, the four peripheral bridge portions 22 may be respectively connected to the four sides of the peripheral island portion 21. Each peripheral bridge portion 22 may be connected to a center portion of each side of the peripheral island portion 21.

The peripheral island portions 21 of any one row arranged in the first non-display area NDA1 may correspond to the main island portions 11 of a plurality of rows arranged in the display area DA1. In an embodiment, for example, the peripheral island portions 21 of any one row arranged in the first non-display area NDA1 may correspond to the main island portions 11 arranged in an i-th row of the display area DA and the main island portions 11 arranged in an (i+1)-th row (where "i" is a positive number greater than 0). In another embodiment, the peripheral island portions 21 of any one row may correspond to n rows of the main island portions 11 (where n is a positive number greater than or equal to 3).

A non-display area, for example, the first non-display area NDA1, may include a first sub non-display area SNDA1 in which the above peripheral island portions 21 and peripheral bridge portions 22 are arranged, and a second sub non-display area SNDA2 between the first sub non-display area SNDA1 and the display area DA. Sub bridge portions 23 for connecting the display area DA with the first sub non-display area SNDA1 may be arranged in the second sub non-display area SNDA2. One end of the sub bridge portion 23 may be connected to the peripheral island portion 21 and the other end of the sub bridge portion 23 may be connected to the main island portion 11. In an embodiment, for example, one end of the sub bridge portion 23 may be connected to a center portion of one side of the peripheral island portion 21, and the other end of the sub bridge portion 23 may be connected to a center portion of one side of the main island portion 11.

The sub bridge portion 23 may have a serpentine shape. In an embodiment, the shape of the sub bridge portion 23 may be different from the shape of each of the main bridge portion 12 and the peripheral bridge portion 22. The width of the sub bridge portion 23 may be different from the width of the main bridge portion 12 and the width of the peripheral bridge portion 22. The width of the sub bridge portion 23 may be greater than the width of the main bridge portion 12 and less than the width of the peripheral bridge portion 22. A third opening portion CS3 and a fourth opening portion CS4 of different shapes may be alternately arranged between the sub bridge portions 23 in the second direction (e.g., y direction or −y direction).

Figure 5:
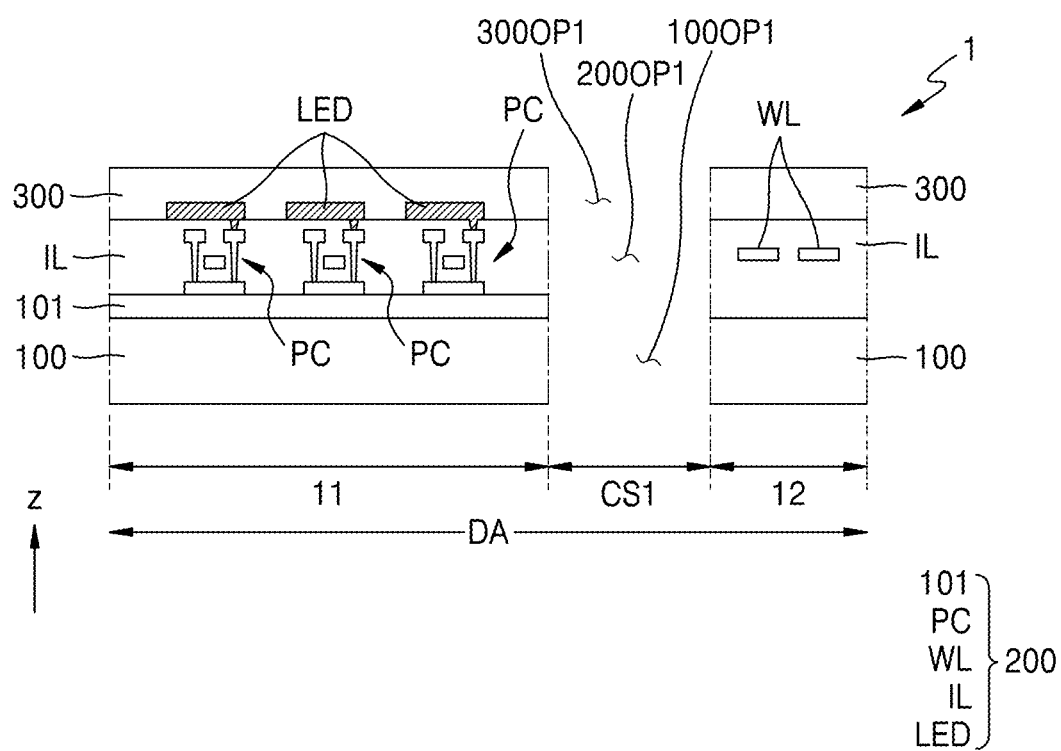
FIG. 5 is a cross-sectional view schematically illustrating a main island portion and a main bridge portion arranged in a display area of a display apparatus according to an embodiment.

FIG. 5 is a cross-sectional view schematically illustrating a main island portion 11 and a main bridge portion 12 arranged in a display area DA of a display apparatus 1 according to an embodiment.

Referring to FIG. 5, in an embodiment, the main island portion 11 and the main bridge portion 12 arranged in the display area DA may be spaced apart from each other with a first opening portion CS1 therebetween. The main island portion 11 may include light emitting elements LED and a circuit for driving a light emitting element electrically connected thereto, for example, a pixel driving circuit unit PC, and the main bridge portion 12 may include a line WL electrically connected to the pixel driving circuit units PC respectively arranged in adjacent main island portions 11.

In the main island portion 11, a buffer layer 101 including an inorganic insulating material may be disposed over a substrate 100, and a pixel driving circuit unit PC may be disposed over the buffer layer 101. An insulating layer IL including an inorganic insulating material and/or an organic insulating material may be arranged between the pixel driving circuit unit PC and the light emitting element LED. The light emitting element LED may be disposed over the insulating layer IL and may be electrically connected to the pixel driving circuit unit PC corresponding thereto. The light emitting elements LED may emit light of different colors from each other or emit light of a same color as each other. In an embodiment, the light emitting elements LED may respectively emit red, green, and blue light. In some embodiments, the light emitting elements LED may emit white light. In another embodiment, the light emitting elements LED may respectively emit red, green, blue, and white light.

The substrate 100 may include a polymer resin such as polyether sulfone, polyarylate, polyether imide, polyethylene naphthalate, polyethylene terephthalate, polyphenylene sulfide, polyimide, polycarbonate, cellulose triacetate, or cellulose acetate propionate, for example. In an embodiment, the substrate 100 may be a single layer including the above polymer resin. In an embodiment, the substrate 100 may have a multilayer structure including a base layer including the above polymer resin and a barrier layer including an inorganic insulating layer. The substrate 100 including the polymer resin may be flexible, rollable, or bendable.

In an embodiment, as illustrated in FIG. 5, three pixel driving circuit units PC are arranged in each main island portion 11 and three light emitting elements LED are respectively connected to the three pixel driving circuit units PC; however, the disclosure is not limited thereto. In other embodiments, the number of pixel driving circuit units PC and light emitting elements LED arranged in the main island portion 11 may be one, two, or four or more.

An encapsulation layer 300 may be disposed over the light emitting element LED and may protect the light emitting element LED from an external force and/or moisture penetration. The encapsulation layer 300 may include an inorganic encapsulation layer and/or an organic encapsulation layer. In some embodiments, the encapsulation layer 300 may include a structure in which an inorganic encapsulation layer including an inorganic insulating material, an organic encapsulation layer including an organic insulating material, and an inorganic encapsulation layer including an inorganic insulating material are stacked. In another embodiment, the encapsulation layer 300 may include an organic material such as a resin. In some embodiments, the encapsulation layer 300 may include urethane epoxy acrylate. The encapsulation layer 300 may include a photosensitive material such as a photoresist.

In the main bridge portion 12, an insulating layer IL including an organic insulating material may be disposed over the substrate 100. In an embodiment, the main bridge portion 12, which is relatively greatly modified when the display apparatus 1 is stretched, may not have a layer including an inorganic insulating material that may be prone to crack.

In an embodiment, the substrate 100 corresponding to the main bridge portion 12 may have a same stack structure as the substrate 100 corresponding to the main island portion 11. In an embodiment, the substrate 100 corresponding to the main bridge portion 12 and the substrate 100 corresponding to the main island portion 11 may be polymer resin layers formed together in a same process. In another embodiment, the substrate 100 corresponding to the main bridge portion 12 may a different stack structure than the substrate 100 corresponding to the main island portion 11. In some embodiments, the substrate 100 corresponding to the main bridge portion 12 may have a multilayer structure including a base layer including a polymer resin and a barrier layer including an inorganic insulating material, and the substrate 100 corresponding to the main bridge portion 12 may have a structure of a polymer resin layer without a layer including an inorganic insulating material.

As described above, the lines WL of the main bridge portion 12 may be signal lines (e.g., a gate line, a data line, and the like) for providing electrical signals to the transistor included in the pixel driving circuit unit PC of the main island portion 11 or may be voltage lines (e.g., a driving voltage line, an initialization voltage line, and the like) for providing voltages thereto. The encapsulation layer 300 may also be disposed over the main bridge portion 12. In another embodiment, the encapsulation layer 300 may be omitted in the main bridge portion 12.

Referring to FIGS. 4 and 5, the substrate 100 corresponding to the main island portion 11 and the substrate 100 corresponding to the main bridge portion 12 may be connected to each other. In other words, the plan view illustrated in FIG. 4 may be substantially the same as a plan view of the substrate 100 of FIG. 5. In other words, the substrate 100 may include an area corresponding to the main island portion 11, an area corresponding to the main bridge portion 12, and an opening 100OP1 having the same shape as the first opening portion CS1.

Similarly, the encapsulation layer 300 corresponding to the main island portion 11 and the encapsulation layer 300 corresponding to the main bridge portion 12 may be connected to each other. For example, the plan view illustrated in FIG. 4 may be substantially the same as a plan view of the encapsulation layer 300. In other words, the encapsulation layer 300 may include an area corresponding to the main island portion 11, an area corresponding to the main bridge portion 12, and an opening 300OP1 having the same shape as the first opening portion CS1.

A circuit-light emitting element layer 200 between the substrate 100 and the encapsulation layer 300 may include a buffer layer 101, a pixel driving circuit unit PC, a line WL, an insulating layer IL, and a light emitting element LED. Similarly to the substrate 100, the plan view illustrated in FIG. 4 may be substantially the same as a plan view of the circuit-light emitting element layer 200. In other words, the circuit-light emitting element layer 200 may include an opening 200OP1 having the same shape as the first opening portion CS1.

Figure 6A:
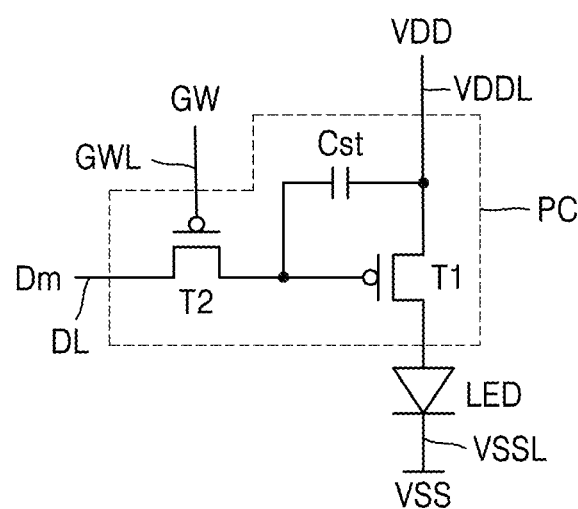
FIGS. 6A to 6C are each an equivalent circuit diagram of a subpixel of a display apparatus according to an embodiment.
Figure 6B:
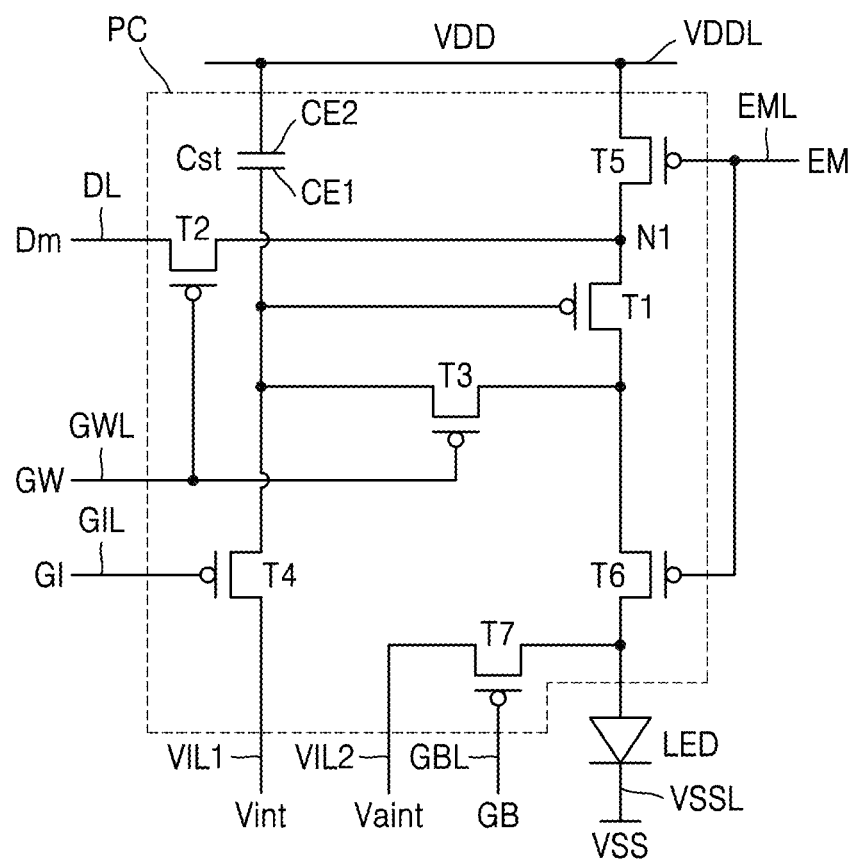
Figure 6C:
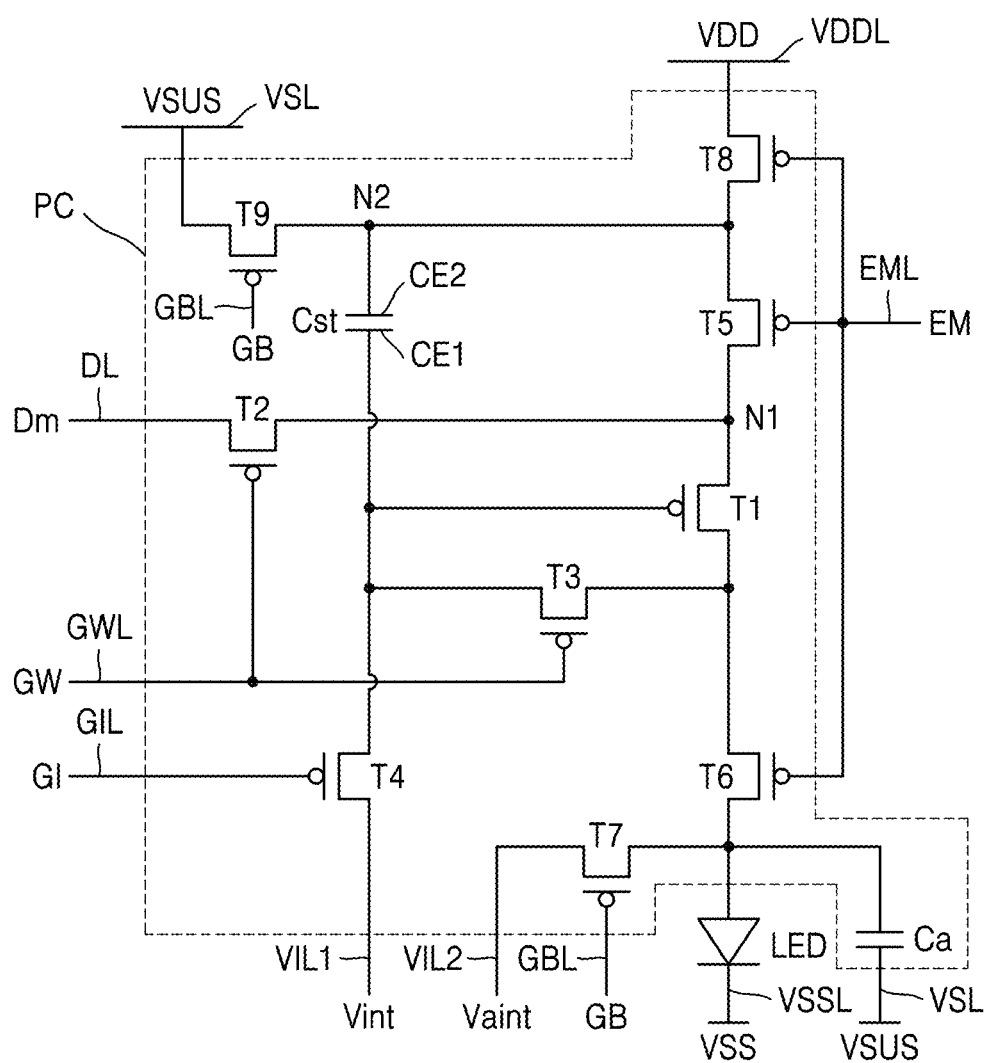

FIGS. 6A to 6C are each an equivalent circuit diagram of a subpixel of a display apparatus 1 according to an embodiment.

Referring to FIG. 6A, in an embodiment, the light emitting element LED corresponding to the subpixel may be electrically connected to a pixel driving circuit unit PC, and the pixel driving circuit unit PC may include a first transistor T1, a second transistor T2, and a storage capacitor Cst. The pixel driving circuit unit PC may be electrically connected to a signal line and a voltage line. The signal line may include a gate line such as a scan signal line GWL, and a data line DL, and the voltage line may include a first voltage line VDDL and a second voltage line VSSL.

The second transistor T2 may be electrically connected to the scan signal line GWL and the data line DL. The scan signal line GWL may be configured to provide a scan signal GW to a gate electrode of the second transistor T2. The second transistor T2 may be configured to transmit a data signal Dm input from the data line DL, to the first transistor T1 in response to the scan signal GW input from the scan signal line GWL.

The storage capacitor Cst may be connected to the second transistor T2 and the first voltage line VDDL and may be configured to store a voltage corresponding to the difference between a voltage received from the second transistor T2 and a first power voltage VDD supplied from the first voltage line VDDL.

The first transistor T1 may be a driving transistor and may control a driving current flowing through the light emitting element LED. The first transistor T1 may be connected to the first voltage line VDDL and the storage capacitor Cst. The first transistor T1 may be configured to control a driving current flowing from the first voltage line VDDL through the light emitting element LED, in response to a voltage value stored in the storage capacitor Cst. The light emitting element LED may emit light with a certain brightness corresponding to the driving current. A first electrode of the light emitting element LED may be electrically connected to the first transistor T1, and a second electrode thereof may be electrically connected to the second voltage line VSSL configured to supply a second power voltage VSS.

FIG. 6A illustrates an embodiment where the pixel driving circuit unit PC includes two transistors and one storage capacitor; however, in other embodiments, the pixel driving circuit unit PC may include three or more transistors.

Referring to FIG. 6B, in an embodiment, the pixel driving circuit unit PC may include a first transistor T1, a second transistor T2, a third transistor T3, a fourth transistor T4, a fifth transistor T5, a sixth transistor T6, a seventh transistor T7, and a storage capacitor Cst.

The pixel driving circuit unit PC may be electrically connected to signal lines and voltage lines. The signal lines may include a gate line such as a scan signal line GWL, a bypass control line GBL, an initialization control line GIL, and an emission control line EML, and a data line DL. The voltage lines may include first and second initialization voltage lines VIL1 and VIL2, a first voltage line VDDL and a second voltage line VSSL.

The first voltage line VDDL may be configured to transmit a first power voltage VDD to the first transistor T1. The second voltage line VSSL may be configured to supply a second power voltage VSS to a second electrode of the light emitting element LED. The first initialization voltage line VIL1 may be configured to transmit a first initialization voltage Vint for initializing the first transistor T1 to the pixel driving circuit unit PC. The second initialization voltage line VIL2 may be configured to transmit a second initialization voltage Vaint for initializing a first electrode of the light emitting element LED to the pixel driving circuit unit PC.

The first transistor T1 may be electrically connected to the first voltage line VDDL via the fifth transistor T5 and may be electrically connected to the light emitting element LED via the sixth transistor T6. The first transistor T1 may function as a driving transistor and may receive a data signal Dm based on a switching operation of the second transistor T2 to supply a driving current to the light emitting element LED.

The second transistor T2 may be a data write transistor and may be electrically connected to the scan signal line GWL and the data line DL. The second transistor T2 may be electrically connected to the first voltage line VDDL via the fifth transistor T5. The second transistor T2 may be configured to perform a switching operation of transmitting the data signal Dm received through the data line DL to a first node N1 by being turned on in response to a scan signal GW received through the scan signal line GWL.

The third transistor T3 may be electrically connected to the scan signal line GWL and may be electrically connected to the light emitting element LED via the sixth transistor T6. In response to the scan signal GW received through the scan signal line GWL, the third transistor T3 may be turned on to diode-connect the first transistor T1.

The fourth transistor T4 may be a first initialization transistor and may be electrically connected to the initialization control line GIL and the first initialization voltage line VIL1. In response to an initialization control signal GI received through the initialization control line GIL, the fourth transistor T4 may be turned on to transmit the first initialization voltage Vint from the first initialization voltage line VIL1 to a gate electrode of the first transistor T1 to initialize a voltage of the gate electrode of the first transistor T1. The initialization control signal GI may correspond to a scan signal from another pixel driving circuit unit arranged in the previous row to the pixel driving circuit unit PC.

The fifth transistor T5 may be an operation control transistor, and the sixth transistor T6 may be an emission control transistor. The fifth transistor T5 and the sixth transistor T6 may be electrically connected to the emission control line EML and may be simultaneously turned on in response to an emission control signal EM received through the emission control line EL, to form a current path such that a driving current may flow from the first voltage line VDDL toward the light emitting element LED.

The seventh transistor T7 may be a second initialization transistor and may be electrically connected to the bypass control line GBL, the second initialization voltage line VIL2, and the sixth transistor T6. In response to a bypass control signal GB received through the bypass control line GBL, the seventh transistor T7 may be turned on to transmit the second initialization voltage Vaint from the second initialization voltage line VIL2 to the first electrode of the light emitting element LED to initialize the first electrode of the light emitting element LED.

The storage capacitor Cst may include a first electrode CE1 and a second electrode CE2. The first electrode CE1 may be electrically connected to the gate electrode of the first transistor T1, and the second electrode CE2 may be electrically connected to the first voltage line VDDL. The storage capacitor Cst may be configured to store and maintain a voltage corresponding to the voltage difference between the first voltage line VDDL and the gate electrode of the first transistor T1 to maintain a voltage applied to the gate electrode of the first transistor T1.

Referring to FIG. 6C, in an embodiment, the pixel driving circuit unit PC may include a first transistor T1, a second transistor T2, a third transistor T3, a fourth transistor T4, a fifth transistor T5, a sixth transistor T6, a seventh transistor T7, an eighth transistor T8, a ninth transistor T9, a storage capacitor Cst, and an auxiliary capacitor Ca.

The pixel driving circuit unit PC may be electrically connected to signal lines and voltage lines. The signal lines may include a gate line such as a scan signal line GWL, a bypass control line GBL, an initialization control line GIL, and an emission control line EML, and a data line DL. The voltage lines may include first and second initialization voltage lines VIL1 and VIL2, a sustain voltage line VSL, a first voltage line VDDL, and a second voltage line VSSL.

The first voltage line VDDL may be configured to transmit a first power voltage VDD to the first transistor T1. The second voltage line VSSL may be configured to supply a second power voltage VSS to a second electrode of the light emitting element LED. The first initialization voltage line VIL1 may be configured to transmit a first initialization voltage Vint for initializing the first transistor T1 to the pixel driving circuit unit PC. The second initialization voltage line VIL2 may be configured to transmit a second initialization voltage Vaint for initializing a first electrode of the light emitting element LED to the pixel driving circuit unit PC. The sustain voltage line VSL may be configured to provide a sustain voltage VSUS to a second node N2, for example, to a second electrode CE2 of the storage capacitor Cst, in the initialization period and the data write period.

The first transistor T1 may be electrically connected to the first voltage line VDDL via the fifth transistor T5 and the eighth transistor T8 may be electrically connected to the light emitting element LED via the sixth transistor T6. The first transistor T1 may function as a driving transistor and may receive a data signal Dm based on a switching operation of the second transistor T2 to supply a driving current to the light emitting element LED.

The second transistor T2 may be electrically connected to the scan signal line GWL and the data line DL and may be electrically connected to the first voltage line VDDL via the fifth transistor T5 and the eighth transistor T8. The second transistor T2 may be configured to perform a switching operation of transmitting the data signal Dm received through the data line DL to a first node N1 by being turned on in response to a scan signal GW received through the scan signal line GWL.

The third transistor T3 may be electrically connected to the scan signal line GWL and may be electrically connected to the light emitting element LED via the sixth transistor T6. In response to the scan signal GW received through the scan signal line GWL, the third transistor T3 may be turned on to diode-connect the first transistor T1 to compensate for a threshold voltage of the first transistor T1.

The fourth transistor T4 may be electrically connected to the initialization control line GIL and the first initialization voltage line VIL1 and may be turned on in response to an initialization control signal GI received through the initialization control line GIL, to transmit the first initialization voltage Vint from the voltage line VIL1 to a gate electrode of the first transistor T1 to initialize a voltage of the gate electrode of the first transistor T1. The initialization control signal GI may correspond to a scan signal from another pixel driving circuit unit arranged in the previous row to the pixel driving circuit unit PC.

The fifth transistor T5, the sixth transistor T6, and the eighth transistor T8 may be electrically connected to the emission control line EML and may be simultaneously turned on according to an emission control signal EM received through the emission control line EL, to form a current path such that a driving current may flow from the first voltage line VDDL toward the light emitting element LED.

The seventh transistor T7 may be a second initialization transistor and may be electrically connected to the bypass control line GBL, the second initialization voltage line VIL2, and the sixth transistor T6. In response to a bypass control signal GB received through the bypass control line GBL, the seventh transistor T7 may be turned on to transmit the second initialization voltage Vaint from the second initialization voltage line VIL2 to the first electrode of the light emitting element LED to initialize the first electrode of the light emitting element LED.

The ninth transistor T9 may be electrically connected to the bypass control line GBL, the second electrode CE2 of the storage capacitor Cst, and the sustain voltage line VSL. The ninth transistor T9 may be turned on in response to the bypass control signal GB received through the bypass control line GBL and may be configured to transmit the sustaining voltage VSUS to the second node N2, for example, to the second electrode CE2 of the storage capacitor Cst, in the initialization period and the data write period.

Each of the eighth transistor T8 and the ninth transistor T9 may be electrically connected to the second node N2, for example, to the second electrode CE2 of the storage capacitor Cst. In some embodiments, the eighth transistor T8 may be turned off and the ninth transistor T9 may be turned on in the initialization period and the data write period, and the eighth transistor T8 may be turned on and the ninth transistor T9 may be turned off in the emission period. Because the sustain voltage VSUS is transmitted to the second node N2 in the initialization period and the data write period, the luminance uniformity (e.g., long range uniformity (LRU)) of the display apparatus depending on the voltage drop of the first voltage line VDDL may be improved.

The storage capacitor Cst may include a first electrode CE1 and a second electrode CE2. The first electrode CE1 may be electrically connected to the gate electrode of the first transistor T1, and the second electrode CE2 may be electrically connected to the eighth transistor T8 and the ninth transistor T9.

The auxiliary capacitor Ca may be electrically connected to the sixth transistor T6, the sustain voltage line VSL, and the first electrode of the light emitting element LED. The auxiliary capacitor Ca may be configured to store and maintain a voltage corresponding to the voltage difference between the first electrode of the light emitting element LED and the sustain voltage line VSL while the seventh transistor T7 and the ninth transistor T9 are turned on, to prevent the increase of the black luminance when the sixth transistor T6 is turned off.

Figure 7A:
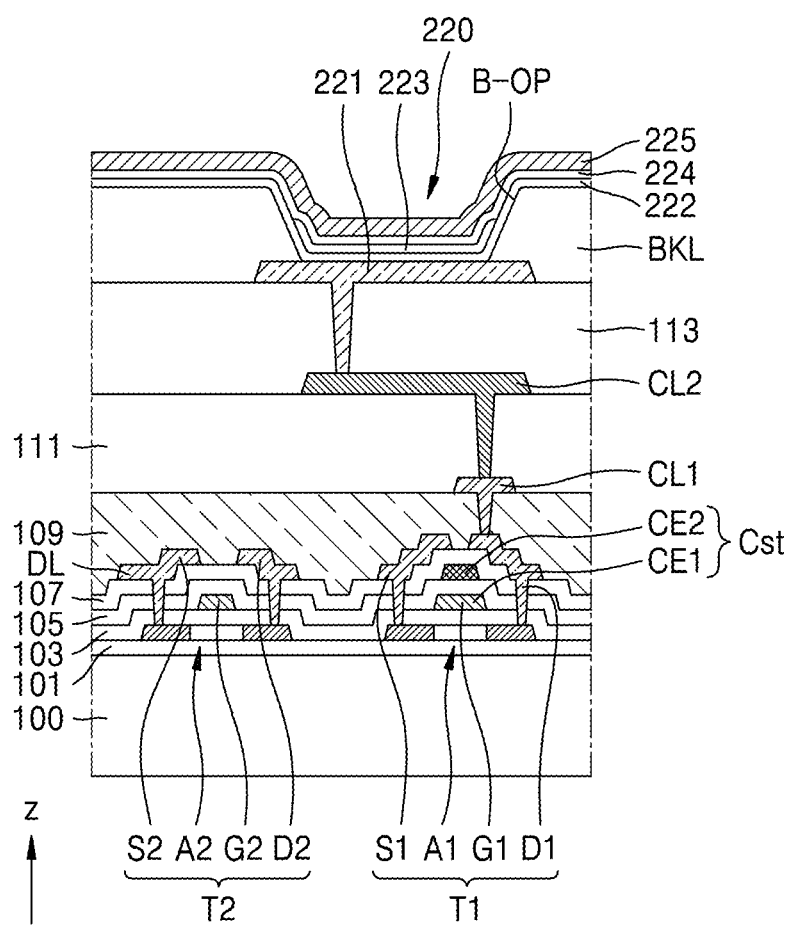
FIGS. 7A and 7B are each a cross-sectional view schematically illustrating a main island portion of a display apparatus according to an embodiment.
Figure 7B:
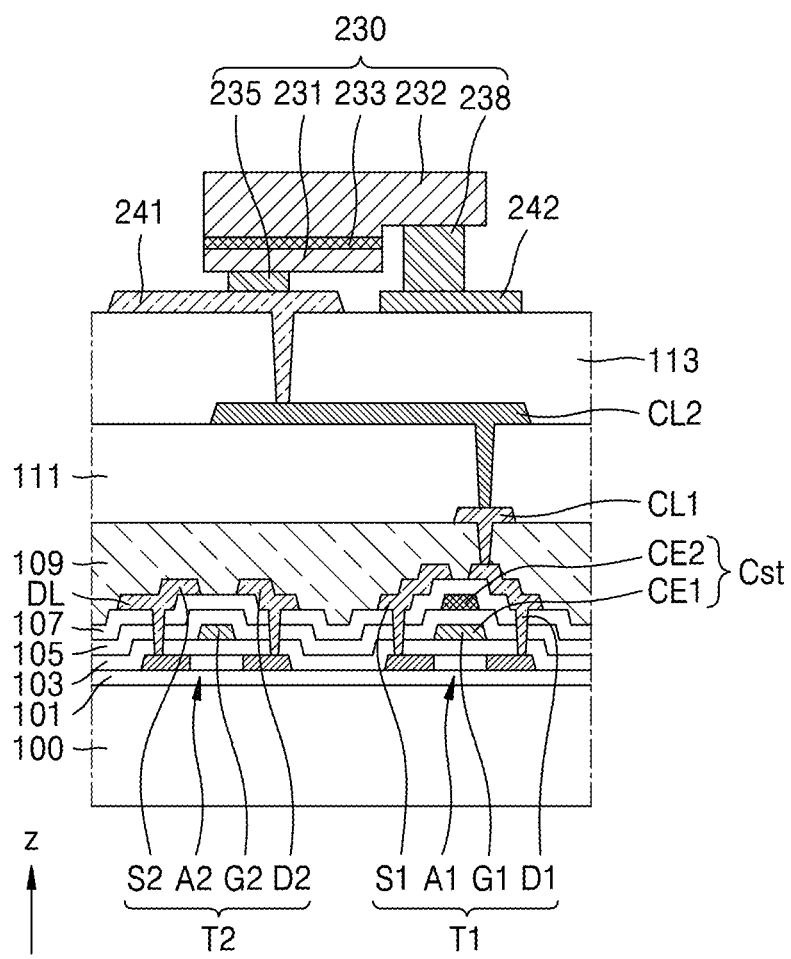

FIGS. 7A and 7B are each a cross-sectional view schematically illustrating a main island portion of a display apparatus according to an embodiment.

Referring to FIGS. 7A and 7B, the main island portion 11 (see FIG. 4) of the display apparatus according to an embodiment may include a pixel driving circuit unit and a light emitting element. For convenience of illustration and description, FIGS. 7A and 7B illustrate only the first transistor T1, the second transistor T2, and the storage capacitor Cst in the pixel driving circuit unit PC (see FIG. 6A). The pixel driving circuit unit illustrated in FIG. 7B may include the same structure as that of FIG. 7A and thus any repetitive detailed description thereof may be omitted.

In an embodiment, referring to FIG. 7A, a buffer layer 101 may be disposed over an upper surface of a substrate 100. The buffer layer 101 may prevent impurities from penetrating into a semiconductor layer of a transistor. The buffer layer 101 may include an inorganic insulating material such as silicon nitride, silicon oxynitride, and silicon oxide and may be defined by a single layer or multiple layers including the inorganic insulating material.

The pixel driving circuit unit PC (see FIG. 6A) may be disposed over the buffer layer 101. The pixel driving circuit unit PC (see FIG. 6A) may include a plurality of transistors and a storage capacitor as described above with reference to FIGS. 6A to 6C. For convenience of illustration and description, FIG. 7A illustrates the first transistor T1, the second transistor T2, and the storage capacitor Cst of the pixel driving circuit unit PC (see FIG. 6A).

The first transistor T1 may include a first semiconductor layer A1 over the buffer layer 101 and a first gate electrode G1 overlapping a channel area of the first semiconductor layer A1. The first semiconductor layer A1 may include a silicon-based semiconductor material, for example, polysilicon. The first semiconductor layer A1 may include a channel area and a first area and a second area arranged on opposing sides of the channel area. The first area and the second area may be areas including a higher concentration of impurities than the channel area, and one of the first area and the second area may correspond to a source area and the other of the first area and the second area may correspond to a drain area.

The second transistor T2 may include a second semiconductor layer A2 over the buffer layer 101 and a second gate electrode G2 overlapping a channel area of the second semiconductor layer A2. The second semiconductor layer A2 may include a silicon-based semiconductor material, for example, polysilicon. The second semiconductor layer A2 may include a channel area and a first area and a second area arranged on both sides of the channel area. The first area and the second area may be areas including a higher concentration of impurities than the channel area, and one of the first area and the second area may correspond to a source area and the other of the first area and the second area may correspond to a drain area.

The first gate electrode G1 and the second gate electrode G2 may include a conductive material including molybdenum (Mo), aluminum (Al), copper (Cu), titanium (Ti), or the like and may have a single-layer or multiple-layer structure, each layer therein including the conductive material.

A first gate insulating layer 103 for electrical insulation from the first semiconductor layer A1 and the second semiconductor layer A2 may be disposed under the first gate electrode G1 and the second gate electrode G2. The first gate insulating layer 103 may include an inorganic insulating material such as silicon nitride, silicon oxynitride, and silicon oxide and may be defined by a single layer or multiple layers including the inorganic insulating material.

The storage capacitor Cst may include a lower electrode CE1 and an upper electrode CE2 overlapping each other. In an embodiment, the lower electrode CE1 of the storage capacitor Cst may include the first gate electrode G1. In other words, the first gate electrode G1 may include the lower electrode CE1 of the storage capacitor Cst. In an embodiment, for example, the first gate electrode G1 and the lower electrode CE1 of the storage capacitor Cst may be integrated with each other.

A first interlayer insulating layer 105 may be arranged between the lower electrode CE1 and the upper electrode CE2 of the storage capacitor Cst. The first interlayer insulating layer 105 may include an inorganic insulating material such as silicon oxide, silicon nitride, or silicon oxynitride and may have a single-layer or multiple-layer structure, each layer therein including the inorganic insulating material.

The upper electrode CE2 of the storage capacitor Cst may include a low-resistance conductive material such as molybdenum (Mo), aluminum (Al), copper (Cu), and/or titanium (Ti) and may have a single-layer or multiple-layer structure, each layer therein including the low-resistance conductive material.

A second interlayer insulating layer 107 may be disposed over the storage capacitor Cst. The second interlayer insulating layer 107 may include an inorganic insulating material such as silicon oxide, silicon nitride, or silicon oxynitride and may have a single-layer or multiple-layer structure, each layer therein including the inorganic insulating material.

A source electrode S1 and/or a drain electrode D1 electrically connected to the first semiconductor layer A1 of the first transistor T1 may be disposed over the second interlayer insulating layer 107. A source electrode S2 and/or a drain electrode D2 electrically connected to the second semiconductor layer A2 of the second transistor T2 may be disposed over the second interlayer insulating layer 107. The source electrodes S1 and S2 and/or the drain electrodes D1 and D2 may include aluminum (Al), copper (Cu), and/or titanium (Ti) and may be defined by a single layer or multiple layers including the aforementioned material.

A first organic insulating layer 109 may be disposed over the pixel driving circuit unit. The first organic insulating layer 109 may include an organic insulating material such as acryl, benzocyclobutene (BCB), polyimide, or hexamethyldisiloxane (HMDSO).

A first connection electrode CL1 may be disposed over the first organic insulating layer 109. The first connection electrode CL1 may include aluminum (Al), copper (Cu), and/or titanium (Ti) and may be defined by a single layer or multiple layers including the aforementioned material.

A second organic insulating layer 111 may be disposed over the first connection electrode CL1. The second organic insulating layer 111 may include an organic insulating material such as acryl, benzocyclobutene (BCB), polyimide, or hexamethyldisiloxane (HMDSO).

A second connection electrode CL2 may be disposed over the second organic insulating layer 111. The second connection electrode CL2 may include aluminum (Al), copper (Cu), and/or titanium (Ti) and may be defined by a single layer or multiple layers including the aforementioned material.

A third organic insulating layer 113 may be disposed over the second connection electrode CL2. The third organic insulating layer 113 may include an organic insulating material such as acryl, benzocyclobutene (BCB), polyimide, or hexamethyldisiloxane (HMDSO).

According to an embodiment, as shown in FIGS. 7A and 7B, the pixel driving circuit unit and the light emitting element may be electrically connected to each other through the first connection electrode CL1 and the second connection electrode CL2; however, according to other embodiments, the first connection electrode CL1 and/or the second connection electrode CL2 may be omitted.

Referring to FIG. 7A, the light emitting element according to an embodiment may include an organic light emitting diode 220 including an organic material. The organic light emitting diode 220 may include a first electrode 221 disposed over an insulating layer, a second electrode 225 facing the first electrode 221, and an emission layer 223 arranged between the first electrode 221 and the second electrode 225. A first functional layer 222 may be arranged between the first electrode 221 and the emission layer 223, and a second functional layer 224 may be arranged between the emission layer 223 and the second electrode 225.

An edge of the first electrode 221 may be covered with a bank layer BKL including an insulating material. The bank layer BKL may be provided with an opening B-OP defined therethrough to overlap a center portion of the first electrode 221.

The first electrode 221 may include a conductive oxide such as indium tin oxide (ITO), indium zinc oxide (IZO), zinc oxide (ZnO), indium oxide ($In_2O_3$), indium gallium oxide (IGO), or aluminum zinc oxide (AZO). In other embodiments, the first electrode 221 may include a reflective layer including silver (Ag), magnesium (Mg), aluminum (Al), platinum (Pt), palladium (Pd), gold (Au), nickel (Ni), neodymium (Nd), iridium (Ir), chromium (Cr), or any compound thereof. In other embodiments, the first electrode 221 may further include a layer including or formed of ITO, IZO, ZnO, AZO, or $In_2O_3$ over/under the reflective layer.

The emission layer 223 may include a high-molecular weight or low-molecular weight organic material for emitting light of a certain color. The first functional layer 222 may include a hole transport layer (HTL) and/or a hole injection layer (HIL). The second functional layer 224 may include an electron transport layer (ETL) and/or an electron injection layer (EIL).

The second electrode 225 may include a conductive material having a low work function. In an embodiment, for example, the second electrode 225 may include a (semi) transparent layer including silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), or any alloy thereof. Alternatively, the second electrode 225 may further include a layer such as ITO, IZO, ZnO, AZO, or $In_2O_3$ over the (semi) transparent layer including the above material.

Referring to FIG. 7B, the light emitting element according to an embodiment may include an inorganic light emitting diode 230 including an inorganic material. The inorganic light emitting diode 230 may include a first semiconductor layer 231, a second semiconductor layer 232, an intermediate layer 233 between the first semiconductor layer 231 and the second semiconductor layer 232, a first electrode 235 electrically connected to the first semiconductor layer 231, and a second electrode 238 electrically connected to the second semiconductor layer 232. The first electrode 235 and the second electrode 238 of the inorganic light emitting diode 230 may be respectively electrically connected to a first electrode pad 241 and a second electrode pad 242 arranged on the same layer.

In some embodiments, the first semiconductor layer 231 may include a p-type semiconductor layer. The p-type semiconductor layer may include a semiconductor material with a composition of InxAlyGa1-x-yN ($0 \leq x \leq 1$, $0 \leq y \leq 1$, $0 \leq x+y \leq 1$), for example, GaN, AlN, AlGaN, InGaN, InN, InAlGaN, or AlInN, and may be doped with a p-type dopant such as Mg, Zn, Ca, Sr, or Ba.

The second semiconductor layer 232 may include, for example, an n-type semiconductor layer. The n-type semiconductor layer may include a semiconductor material with a composition of InxAlyGa1-x-yN ($0 \leq x \leq 1$, $0 \leq y \leq 1$, $0 \leq x+y \leq 1$), for example, GaN, AlN, AlGaN, InGaN, InN, InAlGaN, or AlInN, and may be doped with an n-type dopant such as Si, Ge, or Sn.

The intermediate layer 233 may be an area in which electrons and holes recombine with each other and, with the recombination of electrons and holes, may transition to a lower energy level and generate light with a wavelength corresponding thereto. In an embodiment, for example, the intermediate layer 233 may be formed to include a semiconductor material with a composition of InxAlyGa1-x-yN ($0 \leq x \leq 1$, $0 \leq y \leq 1$, $0 \leq x+y \leq 1$) and may be formed to have a single quantum well structure or a multi quantum well (MQW) structure. Also, the intermediate layer 233 may include a quantum wire structure or a quantum dot structure.

FIG. 7B illustrates an embodiment where the first semiconductor layer 231 includes a p-type semiconductor layer and the second semiconductor layer 232 includes an n-type semiconductor layer; however, the disclosure is not limited thereto. In another embodiment, the first semiconductor layer 231 may include an n-type semiconductor layer and the second semiconductor layer 232 may include a p-type semiconductor layer.

As described above, the display apparatus 1 according to embodiments may be used in various electronic apparatuses capable of providing images. Here, the electronic apparatuses may refer to apparatuses capable of providing certain images by using electricity.

FIGS. 8A to 8G are respectively perspective views schematically illustrating embodiments of an electronic apparatus including a display apparatus according to an embodiment.

Figure 8A:
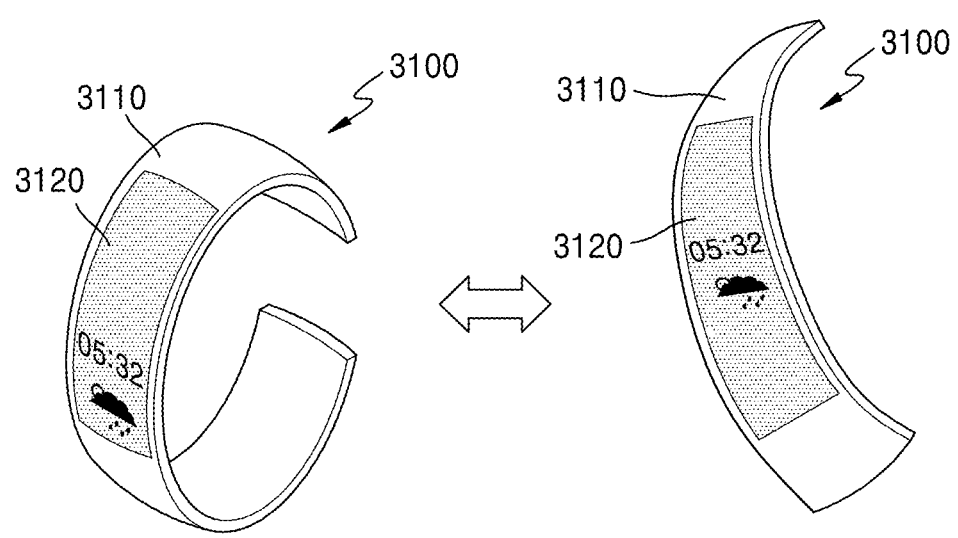
FIGS. 8A to 8G are respectively perspective views schematically illustrating embodiments of an electronic apparatus including a display apparatus according to an embodiment.

Referring to FIG. 8A, the display apparatus according to an embodiment may be used (or included) in a wearable electronic apparatus 3100 wearable on a portion of the user's body. The wearable electronic apparatus 3100 may include a body unit 3110 and a display unit 3120 provided on the body unit 3110. The display apparatus according to embodiments may be used as the display unit 3120 of the wearable electronic apparatus 3100. As illustrated in FIG. 8A, the shape of the wearable electronic apparatus 3100 may be modifiable. In an embodiment, the wearable electronic apparatus 3100 may be used as a smart watch or a smart phone depending on the user's selection.

Figure 8B:
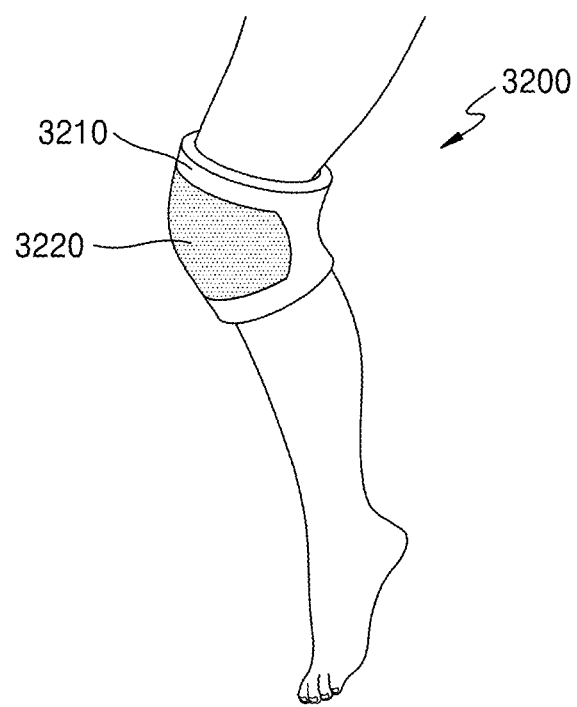

FIG. 8B illustrates an embodiment where the electronic apparatus is a medical electronic apparatus 3200. In an embodiment, the medical electronic apparatus 3200 may include a body unit 3210 and a light emitting unit 3220. The display apparatus according to embodiments may be used as the light emitting unit 3220 of the medical electronic apparatus 3200. The light emitting unit 3220 may emit light of a certain wavelength band (e.g., infrared light or visible light) to the patient's body. In an embodiment, the body unit 3210 may include a stretchable fiber material and may have a structure wearable on the body of the user of the light emitting unit 3220.

Figure 8C:
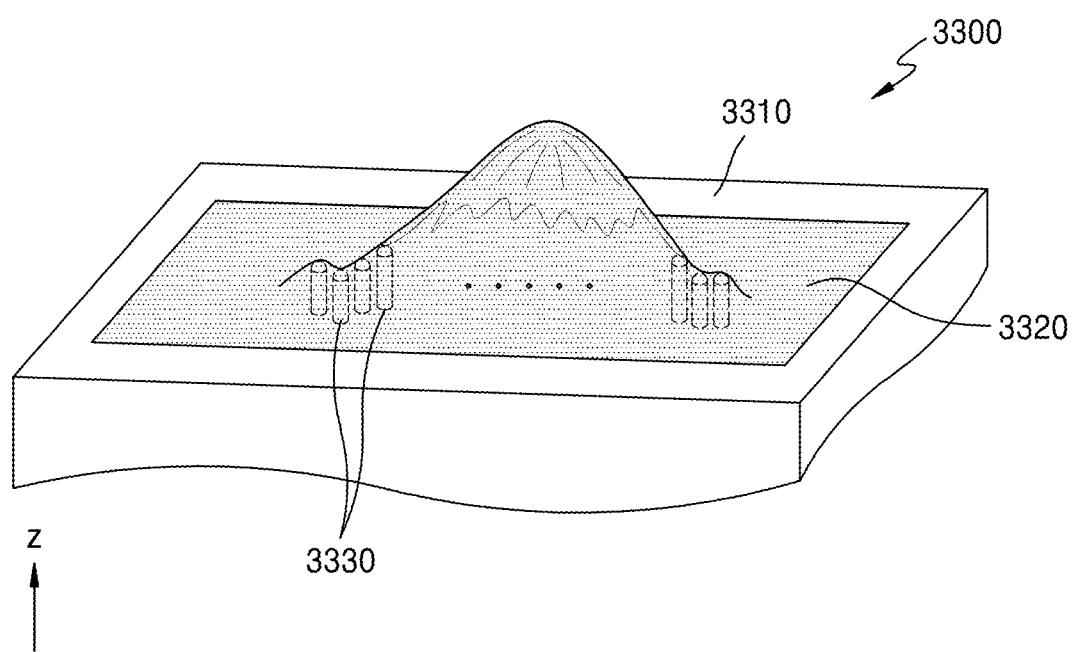

FIG. 8C illustrates an embodiment where the electronic apparatus is an educational electronic apparatus 3300. In an embodiment, the educational electronic apparatus 3300 may include a display unit 3320 provided in a frame 3310. The display unit 3320 may include the display apparatus according to embodiments. The display unit 3320 may provide an image such as a sea with waves, a mountain covered with snow, or a volcano with flowing lava, and in this case, the display unit 3320 may be stretched in the height direction (e.g., z direction) by reflecting the height of the waves, the mountain, or the volcano. In some embodiments, a portion of the display unit 3320 may three-dimensionally display the movement of the lava by sequentially varying in height in the direction in which the lava flows. The educational electronic apparatus 3300 may include a plurality of pins (or stroke units) 3330 arranged on the rear surface of the display unit 3320 such that the display unit 3320 may be stretched in the height direction. As the pins 3330 move in the third direction (e.g., z direction or −z direction), an image displayed on the display unit 3320 may be implemented to have a three-dimensional height. FIG. 8C illustrates an embodiment where the display apparatus is included in the educational electronic apparatus 3300; however, its use is not limited as long as it provides certain image information.

The electronic apparatus illustrated in FIGS. 8A to 8C is described as a display apparatus that is variable in shape; however, the disclosure is not limited thereto. In embodiments, as will be described below, the display apparatus may be used in an electronic apparatus in which a portion (e.g., a screen) capable of displaying an image is fixed.

Figure 8D:
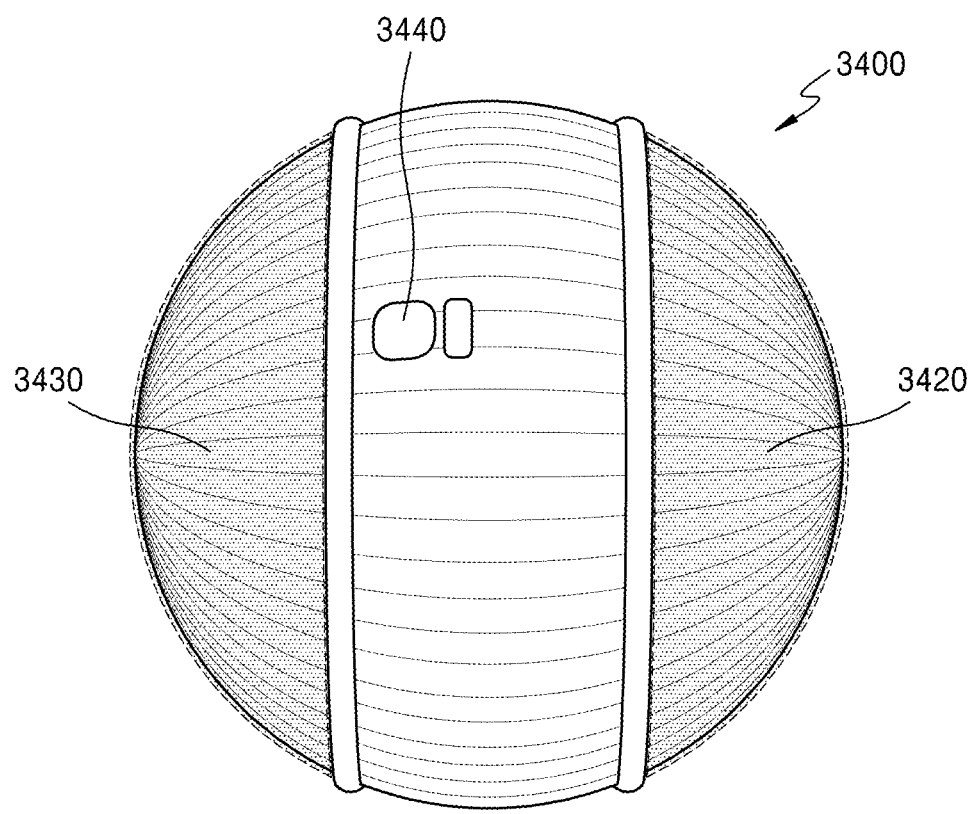

FIG. 8D illustrates a robot 3400 as another electronic apparatus according to an embodiment. The robot 3400 may recognize a movement or an object by using a camera unit 3440 and may display a certain image to the user through display units 3420 and 3430. In some embodiments, each of the display apparatuses according to an embodiment may be stretched in various directions as described above and thus may be assembled into a body frame having a hemispherical shape, and thus, the robot 3400 may include hemispherical display units 3420 and 3430.

Figure 8E:
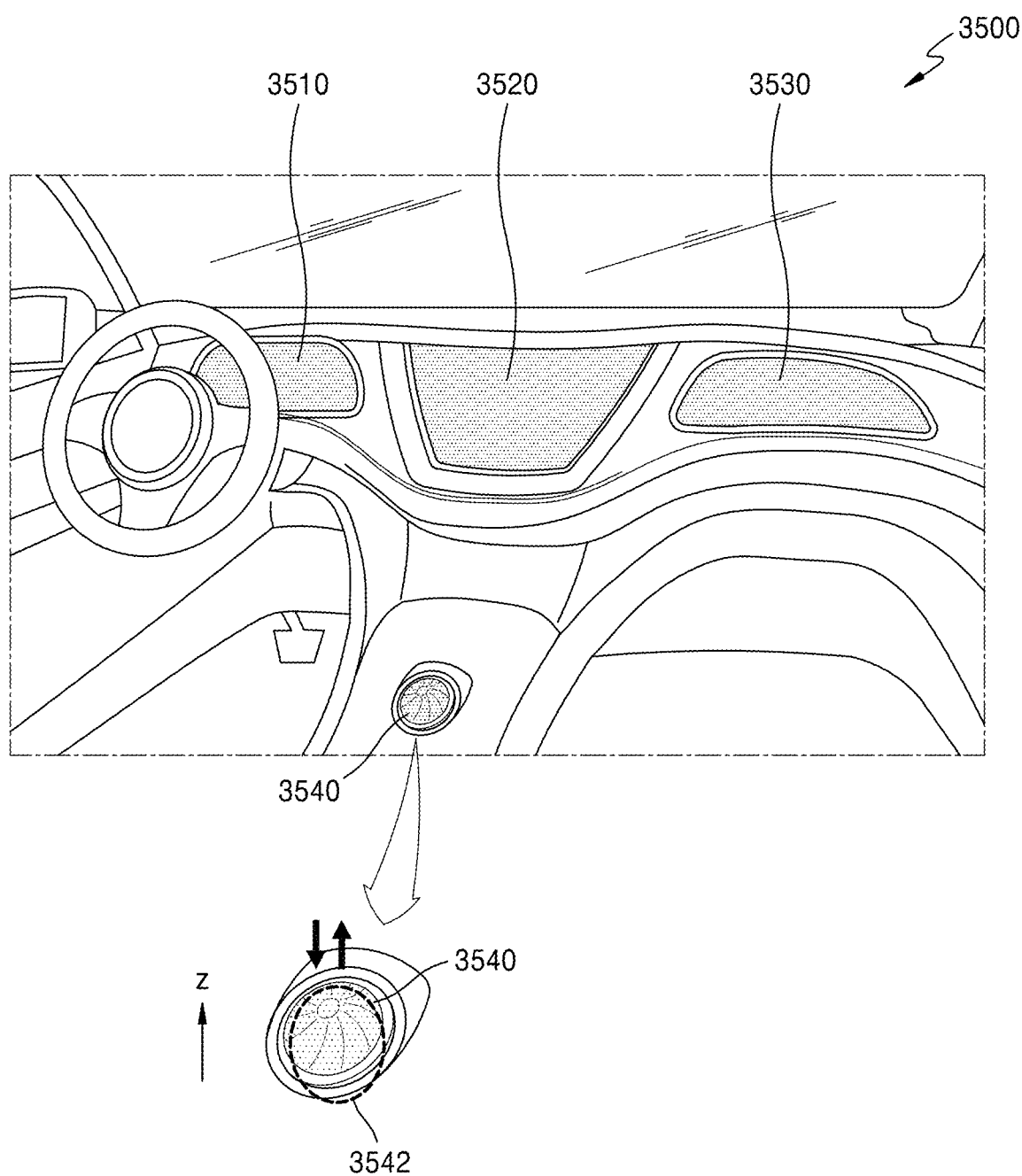

FIG. 8E illustrates a vehicle display apparatus 3500 as another electronic apparatus according to an embodiment. The vehicle display apparatus 3500 may include a cluster 3510, a center information display (CID) 3520, and/or a co-driver display 3530. The display apparatus according to an embodiment may be stretched in various directions and thus may be used in the cluster 3510, the CID 3520, and/or the co-driver display 3530 without regard to the shape of an internal frame of the vehicle.

FIG. 8E illustrates an embodiment where the cluster 3510, the CID 3520, and/or the co-driver display 3530 are separated from each other; however, the disclosure is not limited thereto. In other embodiments, two or more of the cluster 3510, the CID 3520, and the co-driver display 3530 may be integrally connected to each other.

In some embodiments, the vehicle display apparatus 3500 may include a button 3540 that may represent a certain image. Referring to an enlarged view of FIG. 8E, a hemispherical button 3540 may include an object 3542 that provides the feeling of using the button while moving in the z direction or the −z direction, and a display apparatus that is arranged on the object 3542. In some embodiments, when the object 3542 has a three-dimensionally rounded surface, the display apparatus may also have a three-dimensionally rounded surface.

Figure 8F:
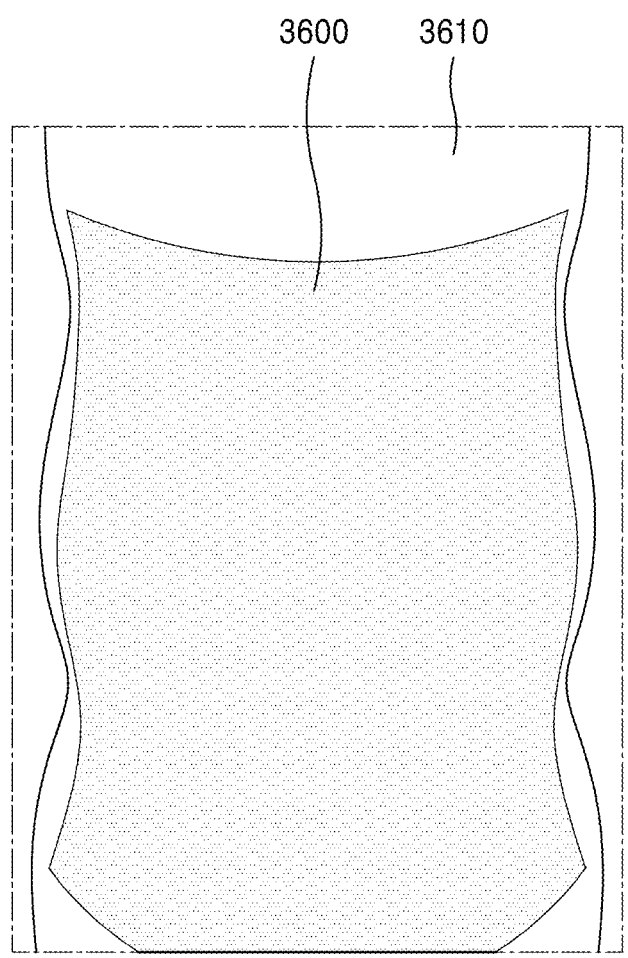

FIG. 8F illustrates that the electronic apparatus according to an embodiment is an advertisement or exhibition electronic apparatus 3600. In some embodiments, the advertisement or exhibition electronic apparatus 3600 may be installed on a fixed structure 3610 such as a wall or a pillar. As illustrated in FIG. 8F, when the fixed structure 3610 includes an uneven surface, the advertisement or exhibition electronic apparatus 3600 may also be arranged along the uneven surface of the fixed structure 3610. In some embodiments, the advertisement or exhibition electronic apparatus 3600 may be installed on the fixed structure 3610 by using a heat-shrinkable film or the like.

Figure 8G:
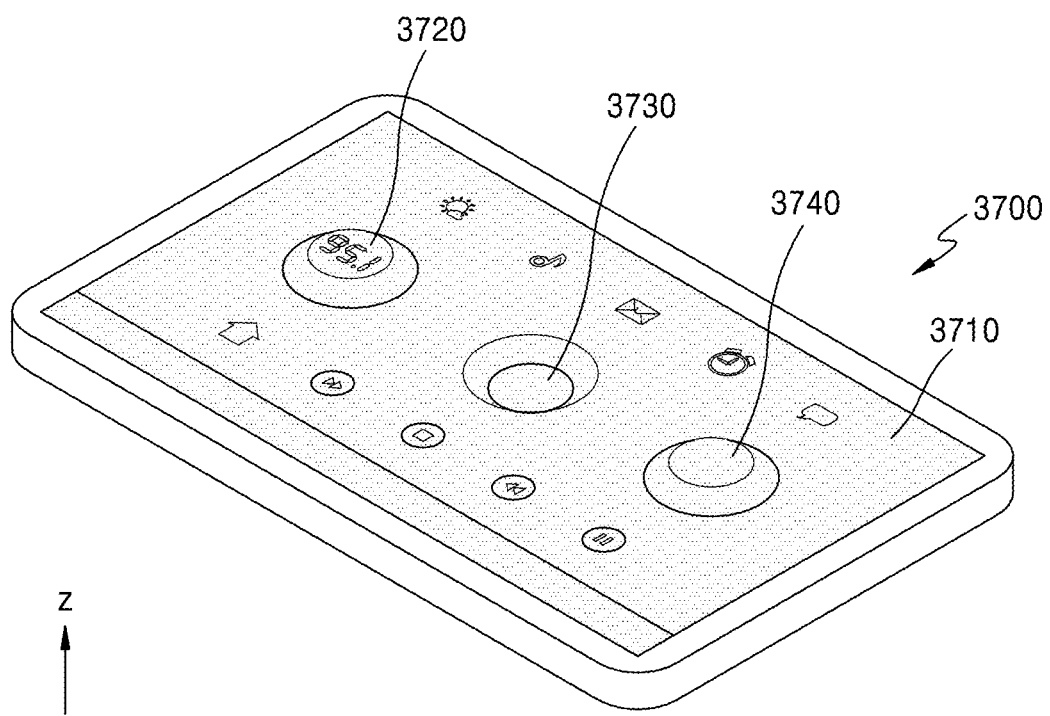

FIG. 8G illustrates that the electronic apparatus according to an embodiment is a controller 3700. The controller 3700 may include an image-type button. In an embodiment, for example, some areas of a display unit 3710 of the controller 3700 may include first to third button areas 3720, 3730, and 3740 that are convex in the z direction or convex in the −z direction (or concaved in the z direction). In some embodiments, the first and third button areas 3720 and 3740 may become convex in the z direction, and the second button area 3730 may become convex in the −z direction (or concaved in the z direction).

Figure 9:
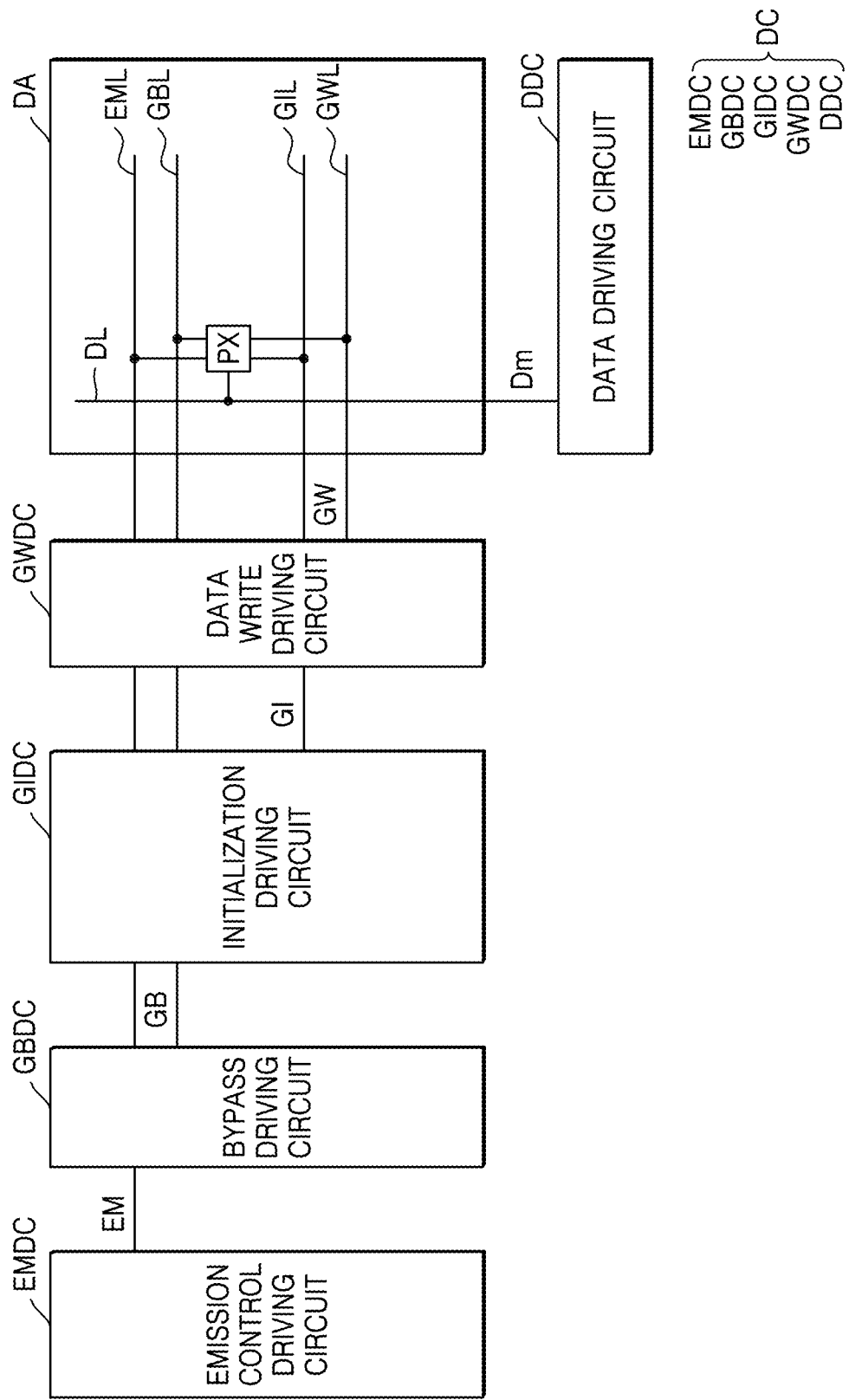
FIG. 9 is a schematic block diagram of a display apparatus according to an embodiment.

FIG. 9 is a schematic block diagram of a display apparatus according to an embodiment.

Referring to FIG. 9, in an embodiment of a display apparatus, a plurality of pixels PX and signal lines for applying electrical signals to the plurality of pixels PX may be located in a display area DA. The signal lines for applying electrical signals to the pixels PX may include a plurality of data lines DL, a plurality of emission control lines EML, a plurality of scan signal lines GWL, a plurality of initialization control lines GIL, and a plurality of bypass control lines GBL.

A driving circuit DC that supplies signals for driving the pixels PX may be located outside the display area DA. The driving circuit DC may include a data driving circuit DDC and a gate driving circuit GDC (see FIG. 3), and the gate driving circuit GDC (see FIG. 3) may include an emission control driving circuit EMDC, a bypass driving circuit GBDC, an initialization driving circuit GIDC, and a data write driving circuit GWDC. The data driving circuit DDC may be arranged adjacent to the lower side of the display area DA to be connected to the data lines DL and output a data signal Dm to the data lines DL.

The emission control driving circuit EMDC, the bypass driving circuit GBDC, the initialization driving circuit GIDC, and the data write driving circuit GWDC may be arranged adjacent to the left or right side of the display area DA. The emission control driving circuit EMDC may be connected to the emission control lines EML to output an emission control signal EM to the emission control lines EML. The bypass driving circuit GBDC may be connected to the bypass control lines GBL to output a bypass control signal GB to the bypass control lines GBL. The initialization driving circuit GIDC may be connected to the initialization control lines GIL to output an initialization control signal GI to the initialization control lines GIL. The data write driving circuit GWDC may be connected to the scan signal lines GWL to output a scan signal GW to the scan signal lines GWL.

Figure 10:
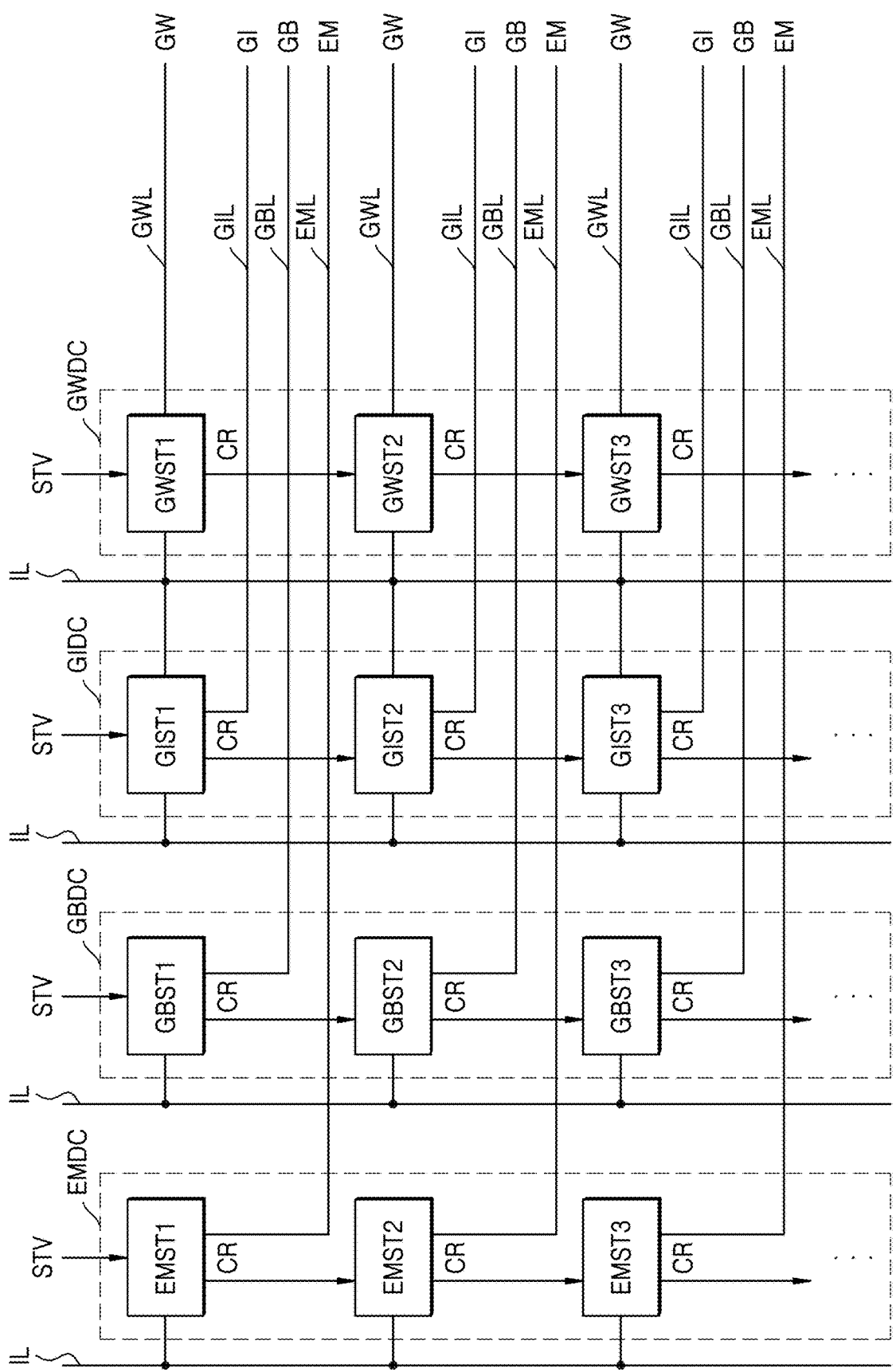
FIG. 10 is a diagram schematically illustrating a gate driving circuit according to an embodiment.

FIG. 10 is a diagram schematically illustrating a gate driving circuit according to an embodiment. FIG. 10 is a diagram illustrating a schematic configuration of the emission control driving circuit EMDC, the bypass driving circuit GBDC, the initialization driving circuit GIDC, and the data write driving circuit GWDC.

Referring to FIG. 10, in an embodiment of a gate driving circuit, the emission control driving circuit EMDC may be implemented as a shift register including a plurality of emission control stages EMST1, EMST2, EMST3, . . . . Each of the emission control stages EMST1, EMST2, EMST3, . . . may be a sub driving circuit. Each of the emission control stages EMST1, EMST2, EMST3, . . . may be connected to a corresponding emission control line EML to output an emission control signal EM to the corresponding emission control line EML. The first emission control stage EMST1 may output an emission control signal EM in response to an external start signal STV, and each of the other emission control stages EMST2, EMST3, . . . other than the first emission control stage EMST1 may receive a carry signal CR output from a previous stage, as a start signal. Each of the emission control stages EMST1, EMST2, EMST3, . . . may be connected to a plurality of input lines IL arranged outside the emission control stages EMST1, EMST2, EMST3, . . . .

The bypass driving circuit GBDC may include or be implemented as a shift register including a plurality of bypass stages GBST1, GBST2, GBST3, Each of the bypass stages GBST1, GBST2, GBST3, . . . may be a sub driving circuit. Each of the bypass stages GBST1, GBST2, GBST3, . . . may be connected to a corresponding bypass control line GBL to output a bypass control signal GB to the corresponding bypass control line GBL. The first bypass stage GBST1 may output a bypass control signal GB in response to an external start signal STV, and each of the other bypass stages GBST2, GBST3, . . . other than the first bypass stage GBST1 may receive a carry signal CR output from the previous stage, as a start signal. Each of the bypass stages GBST1, GBST2, GBST3, . . . may be connected to a plurality of input lines IL arranged outside the bypass stages GBST1, GBST2, GBST3, . . . .

The initialization driving circuit GIDC may be implemented as a shift register including a plurality of initialization stages GIST1, GIST2, GIST3, . . . . Each of the initialization stages GIST1, GIST2, GIST3, . . . may be a sub driving circuit. Each of the initialization stages GIST1, GIST2, GIST3, . . . may be connected to a corresponding initialization control line GIL to output an initialization control signal GI to the corresponding initialization control line GIL. The first initialization stage GIST1 may output an initialization control signal GI in response to an external start signal STV, and each of the other initialization stages GIST2, GIST3, . . . other than the first initialization stage GIST1 may receive a carry signal CR output from the previous stage, as a start signal. Each of the initialization stages GIST1, GIST2, GIST3, . . . may be connected to a plurality of input lines IL arranged outside the initialization stages GIST1, GIST2, GIST3, . . . .

The data write driving circuit GWDC may be implemented as a shift register including a plurality of data write stages GWST1, GWST2, GWST3, Each of the data write stages GWST1, GWST2, GWST3, . . . may be a sub driving circuit. Each of the data write stages GWST1, GWST2, GWST3, . . . may be connected to a corresponding scan signal line GWL to output a scan signal GW to the corresponding scan signal line GWL. The first data write stage GWST1 may output a scan signal GW in response to an external start signal STV, and each of the other data write stages GWST2, GWST3, . . . other than the first data write stage GWST1 may receive a carry signal CR output from the previous stage, as a start signal. Each of the data write stages GWST1, GWST2, GWST3, . . . may be connected to a plurality of input lines IL arranged outside the data write stages GWST1, GWST2, GWST3, . . . .

The plurality of input lines IL may be signal lines including a plurality of voltage lines and a plurality of clock lines. For convenience of illustration and description, only one line among the signal lines is illustrated in FIG. 10.

Figure 11A:
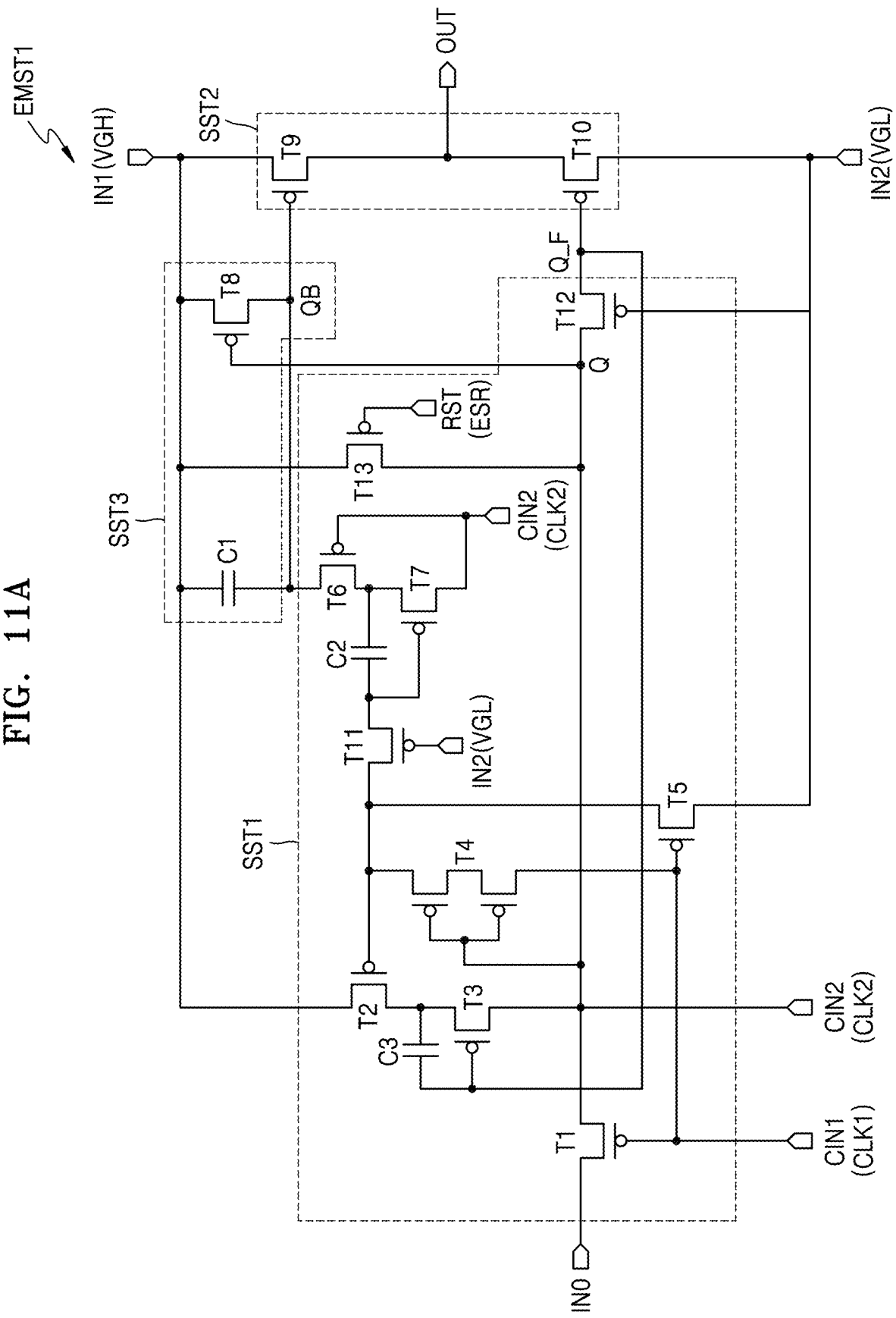
FIG. 11A is a circuit diagram illustrating an embodiment of a first emission control stage included in the gate driving circuit of FIG. 10.
Figure 11B:
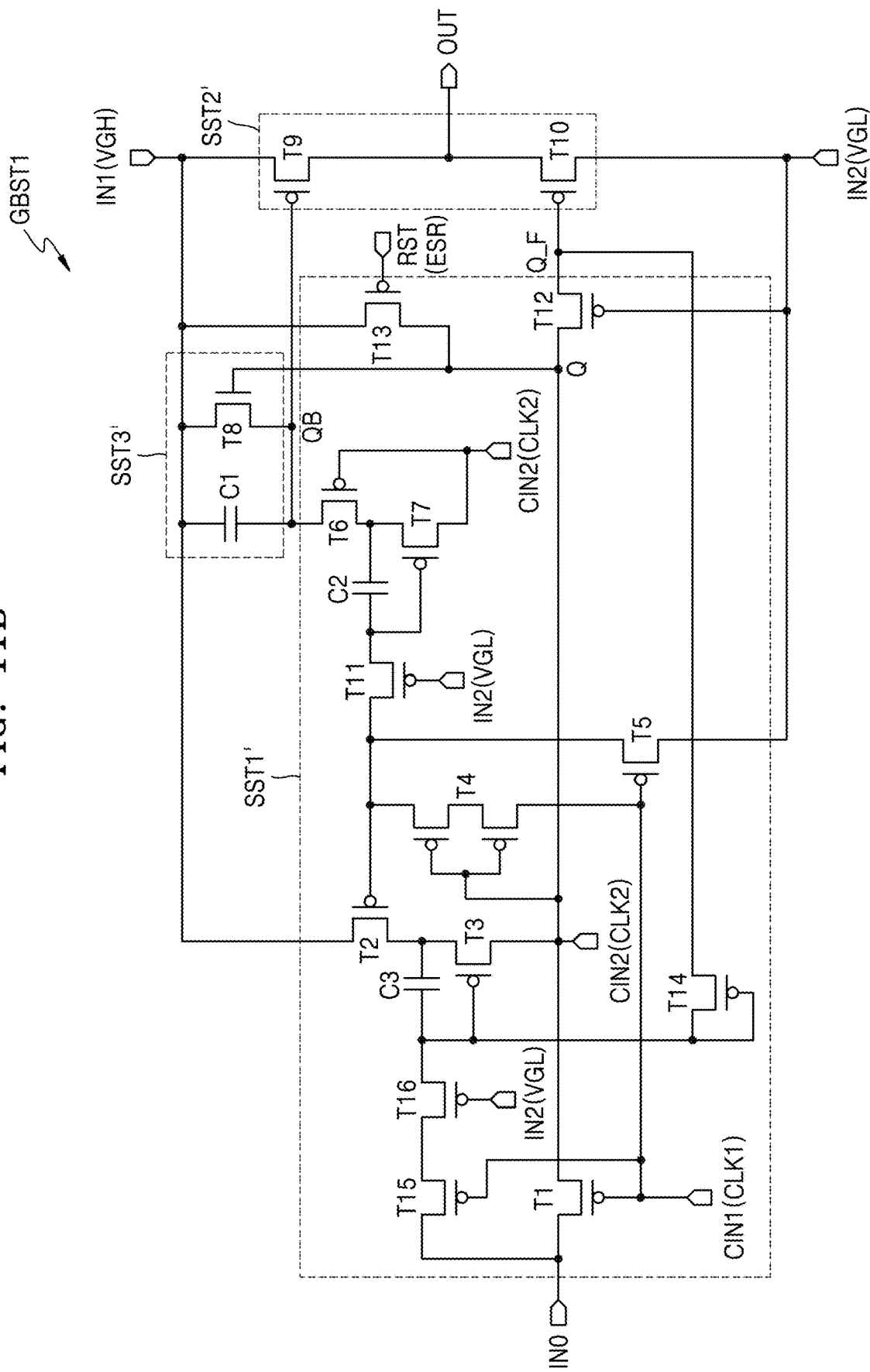
FIG. 11B is a circuit diagram illustrating an embodiment of a first bypass stage included in the gate driving circuit of FIG. 10.
Figure 11C:
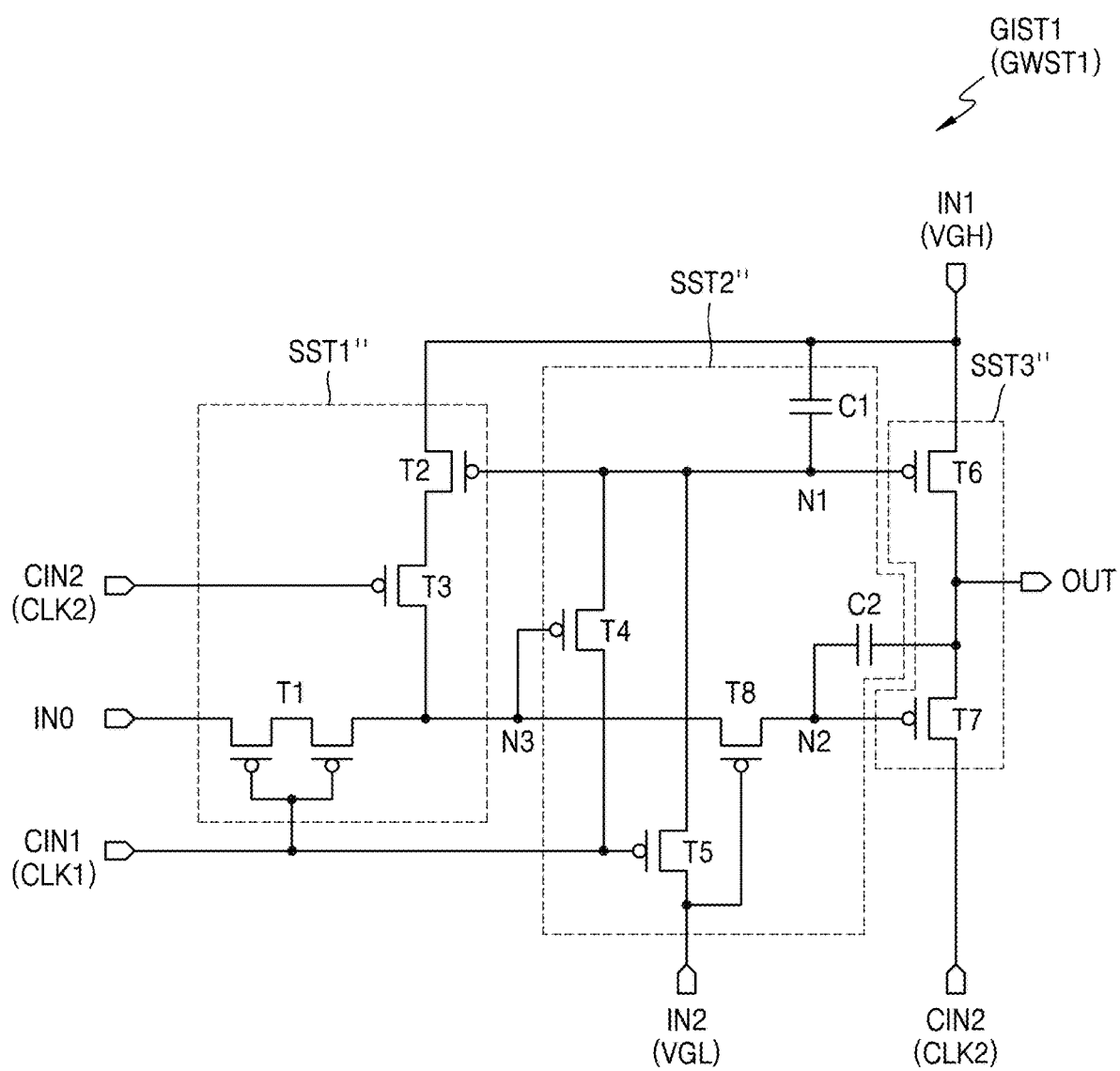
FIG. 11C is a circuit diagram illustrating an embodiment of a first initialization stage included in the gate driving circuit of FIG. 10.

FIG. 11A is a circuit diagram illustrating an embodiment of the first emission control stage included in the gate driving circuit of FIG. 10, FIG. 11B is a circuit diagram illustrating an embodiment of the first bypass stage included in the gate driving circuit of FIG. 10, and FIG. 11C is a circuit diagram illustrating an embodiment of the first initialization stage included in the gate driving circuit of FIG. 10.

First, referring to FIG. 11A, the first emission control stage EMST1 may include an input terminal IN0, a first power input terminal IN1, a second power input terminal IN2, a first clock input terminal CIN1, a second clock input terminal CIN2, a reset terminal RST, and an output terminal OUT. The internal circuit configuration of the first emission control stage EMST1 may be substantially the same as that of other emission stages.

Figure 13:
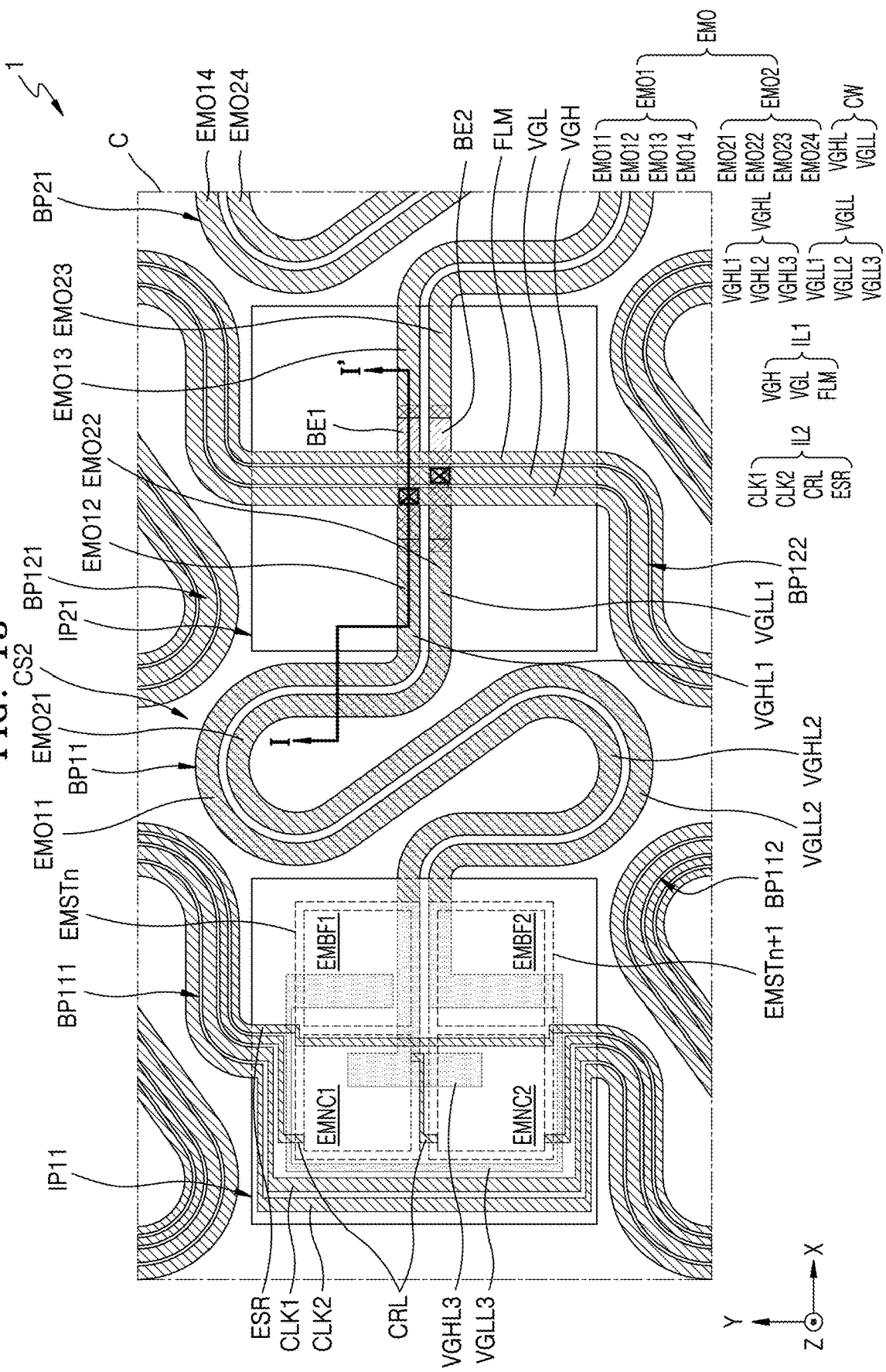
FIG. 13 is a schematic enlarged plan view of a portion of a display apparatus according to an embodiment, which is an enlarged view of region C of FIG. 12.

The first power input terminal IN1 may be connected to a gate high voltage line VGH (see FIG. 13), the second power input terminal IN2 may be connected to a gate low voltage line VGL (see FIG. 13), and the reset terminal RST may be connected to a reset signal line ESR (see FIG. 13). Also, the first clock input terminal CIN1 may be connected to a first clock line CLK1, and the second clock input terminal CIN2 may be connected to a second clock line CLK2. The input terminal IN0 may be connected to a start signal line FLM (see FIG. 13), and other emission control stages other than the first emission control stage EMST1 may be connected to a carry line CRL (see FIG. 13) connected to the output terminal OUT of the previous stage.

The first emission control stage EMST1 may include a node control unit SST1, an output unit SST2 (or a buffer unit), and a node maintenance unit SST3.

In an embodiment, the output unit SST2 may be connected to the first power input terminal IN1 and the second power input terminal IN2, and the output unit SST2 may output a gate power voltage as a first gate signal to the output terminal OUT based on the voltage of a second control node Q_F and the voltage of a first control node QB.

The output unit SST2 may include a ninth transistor T9 (or a pull-up transistor) and a tenth transistor T10 (or a pull-down transistor). The ninth transistor T9 may include a first electrode connected to the first power input terminal IN1, a second electrode connected to the output terminal OUT, and a gate electrode connected to the first control node QB.

The tenth transistor T10 may include a first electrode connected to the output terminal OUT, a second electrode connected to the second power input terminal IN2, and a gate electrode connected to the second control node Q_F.

The node control unit SST1 may be connected to the input terminal IN0, the first power input terminal IN1, the second power input terminal IN2, the first clock input terminal CIN1, and the second clock input terminal CIN2. The node control unit SST1 may control the voltage of the first control node QB and the voltage of the second control node Q_F based on a start signal (or the previous gate signal) provided through the input terminal IN0 and a gate high voltage received from the gate high voltage line VGH.

The node control unit SST1 may include first, second, third, fourth, fifth, sixth, seventh, eleventh, twelfth, and thirteenth transistors T1, T2, T3, T4, T5, T6, T7, T11, T12, and T13, a second capacitor C2, and a third capacitor C3.

The first transistor T1 may include a first electrode connected to the input terminal IN0, a second electrode connected to a third control node Q (or a first electrode of the twelfth transistor T12), and a gate electrode connected to the first clock input terminal CIN1. The second transistor T2 may include a first electrode connected to the first power input terminal IN1, a second electrode connected to a first electrode of the third transistor T3, and a gate electrode connected to a first electrode of the eleventh transistor T11.

The third transistor T3 may include a first electrode connected to the second electrode of the second transistor T2, a second electrode connected to the second clock input terminal CIN2, and a gate electrode connected to the second control node Q_F. The third capacitor C3 may be connected between the second electrode of the second transistor T2 and the second control node Q_F and may include a first electrode connected to the second electrode of the second transistor T2 and a second electrode connected to the second control node Q_F.

The fourth transistor T4 may include a pair of transistors and may include electrodes connected in series between the gate electrode of the second transistor T2 and the first clock input terminal CIN1 and a gate electrode connected to the third control node Q. The fifth transistor T5 may include a first electrode connected to the gate electrode of the second transistor T2, a second electrode connected to the second power input terminal IN2, and a gate electrode connected to the first clock input terminal CIN1.

The sixth transistor T6 may include a first electrode connected to the first control node QB, a second electrode connected to a first electrode of the seventh transistor T7, and a gate electrode connected to the second clock input terminal CIN2. The seventh transistor T7 may include a first electrode connected to the second electrode of the sixth transistor T6, a second electrode connected to the second clock input terminal CIN2, and a gate electrode connected to a second electrode of the eleventh transistor T11.

The second capacitor C2 may be connected between the second electrode of the eleventh transistor T11 and the second electrode of the sixth transistor T6 and may include a first electrode connected to the second electrode of the eleventh transistor T11 and a second electrode connected to the second electrode of the sixth transistor T6. The eleventh transistor T11 may include a first electrode connected to the gate electrode of the second transistor T2, a second electrode connected to the first electrode of the second capacitor C2, and a gate electrode connected to the second power input terminal IN2.

The twelfth transistor T12 may include a first electrode connected to the third control node Q (or the second electrode of the first transistor T1), a second electrode connected to the second control node Q_F, and a gate electrode connected to the second power input terminal IN2. The thirteenth transistor T13 may include a first electrode connected to the first power input terminal IN1, a second electrode connected to the third control node Q (or the second electrode of the first transistor T1), and a gate electrode connected to the reset terminal RST. Here, the reset terminal RST may be connected to the reset signal line ESR (see FIG. 13). When the display apparatus is turned on or off, a low-level reset signal may be applied to the reset terminal RST, the thirteenth transistor T13 may be turned on in response to a logic-low-level reset signal, and a reset operation may be performed such that the voltage at the second electrode of the first transistor T1 (or the third control node Q) may have a high level.

The node maintenance unit SST3 may maintain the voltage of the first control node QB constant in response to the voltage of the third control node Q. The node maintenance unit SST3 may include a first capacitor C1 and an eighth transistor T8.

The first capacitor C1 may be connected between the first power input terminal IN1 and the first control node QB and may include a first electrode connected to the first power input terminal IN1 and a second electrode connected to the first control node QB. The first capacitor C1 may be configured to maintain the voltage difference between the first power input terminal IN1 and the first control node QB constant.

The eighth transistor T8 may be include a first electrode connected to the first power input terminal IN1, a second electrode connected to the first control node QB, and a gate electrode connected to the third control node Q. The eighth transistor T8 may be configured to maintain the voltage of the first control node QB constant in response to the voltage of the third control node Q. For example, when the voltage of the third control node Q has a low level, the eighth transistor T8 may be configured to maintain the voltage of the first control node QB at a high level by using a gate high voltage.

Each of the first to thirteenth transistors T1 to T13 may be a P-type transistor. FIG. 11A illustrates an embodiment where the first to twelfth transistors T1 to T12 are single-gate transistors; however, the disclosure is not limited thereto. In an embodiment, for example, at least one of the first to twelfth transistors T1 to T12 may be implemented as a dual-gate transistor to improve the reliability.

The emission control signal EM (see FIG. 10) output from the first emission control stage EMST1 having the above configuration may be transmitted through the corresponding emission output line to the corresponding emission control line EML (see FIG. 10). Also, the signal output from the first emission control stage EMST1 may be transmitted through the carry line CRL (see FIG. 13) to the second emission control stage EMST2 (see FIG. 10) located at a next stage to the first emission control stage EMST1.

In an embodiment, referring to FIG. 11B, the first bypass stage GBST1 may include an input terminal IN0, a first power input terminal IN1, a second power input terminal IN2, a first clock input terminal CIN1, a second clock input terminal CIN2, a reset terminal RST, and an output terminal OUT. The internal circuit configuration of the first bypass stage GBST1 may be substantially the same as that of other bypass stages.

The first power input terminal IN1 may be connected to a gate high voltage line VGH (see FIG. 13), the second power input terminal IN2 may be connected to a gate low voltage line VGL (see FIG. 13), and the reset terminal RST may be connected to a reset signal line ESR (see FIG. 13). Also, the first clock input terminal CIN1 may be connected to a first clock line CLK1, and the second clock input terminal CIN2 may be connected to a second clock line CLK2. The input terminal IN0 may be connected to a start signal line FLM (see FIG. 13), and other bypass stages other than the first bypass stage GBST1 may be connected to a carry line CRL (see FIG. 13) connected to the output terminal OUT of the previous stage.

The first bypass stage GBST1 may include a node control unit SST1', an output unit SST2' (or a buffer unit), and a node maintenance unit SST3'. The first bypass stage GBST1 may be substantially the same as or similar to the first emission control stage EMST1, except for fourteenth to sixteenth transistors T14, T15, and T16. Thus, any repetitive detailed descriptions thereof will be omitted for conciseness.

The first bypass stage GBST1 may further include fourteenth to sixteenth transistors T14, T15, and T16.

The fourteenth transistor T14 may include a first electrode connected to the gate electrode of the third transistor T3, a second electrode connected to the second control node Q_F, and a gate electrode connected to the gate electrode of the third transistor T3. That is, the fourteenth transistor T14 may be diode-connected between the gate electrode of the third transistor T3 and the second control node Q_F. The fourteenth transistor T14 may be configured to maintain the voltage of the second control node Q_F constant after a certain time point regardless of the voltage change of the gate electrode of the third transistor T3.

The fifteenth transistor T15 may include a first electrode connected to the input terminal IN0, a second electrode connected to a first electrode of the sixteenth transistor T16, and a gate electrode connected to the first clock input terminal CIN1. The fifteenth transistor T15 may be configured to initialize the gate electrode of the third transistor T3 in response to a first clock signal provided through the first clock input terminal CIN1, based on a start signal (or a previous compensation gate signal) provided to the input terminal IN0.

The sixteenth transistor T16 may include a first electrode connected to the second electrode of the fifteenth transistor T15, a second electrode connected to the gate electrode of the third transistor T3, and a gate electrode connected to the second power input terminal IN2. The sixteenth transistor T16 may be configured to reduce or distribute a bias voltage applied to the fifteenth transistor T15 between the input terminal IN0 and the gate electrode of the third transistor T3.

The bypass control signal GB (see FIG. 10) output from the first bypass stage GBST1 having the above configuration may be transmitted through the corresponding bypass output line to the corresponding bypass control line GBL (see FIG. 10). Also, the signal output from the first bypass stage GBST1 may be transmitted through the carry line CRL (see FIG. 13) to the second bypass stage GBST2 (see FIG. 10) located at the next stage to the first bypass stage GBST1.

In an embodiment, referring to FIG. 11C, the first initialization stage GIST1 may include an input terminal IN0, a first power input terminal IN1, a second power input terminal IN2, a first clock input terminal CIN1, a second clock input terminal CIN2, and an output terminal OUT. The internal circuit configuration of the first initialization stage GIST1 may be the same as that of the first data write stage GWST1. Also, the internal circuit configuration of the first initialization stage GIST1 may be substantially the same as that of other initialization stages, and the internal circuit configuration of the first data write stage GWST1 may be substantially the same as that of other data write stages.

The first power input terminal IN1 may be connected to a gate high voltage line VGH (see FIG. 13), and the second power input terminal IN2 may be connected to a gate low voltage line VGL (see FIG. 13). Also, the first clock input terminal CIN1 may be connected to a first clock line CLK1, and the second clock input terminal CIN2 may be connected to a second clock line CLK2. The input terminal IN0 may be connected to a start signal line FLM (see FIG. 13), and other initialization stages other than the first initialization stage GIST1 may be connected to a carry line CRL (see FIG. 13) connected to the output terminal OUT of the previous stage.

The first initialization stage GIST1 may include a first node control unit SST1", a second node control unit SST2", and an output unit SST3".

The output unit SST3" may control a voltage supplied to the output terminal OUT in response to the voltage of a first node N1 and a second node N2. In an embodiment, the output unit SST3" may include a sixth transistor T6 and a seventh transistor T7. The output unit SST3" may be driven or operated as a buffer. The sixth transistor T6 and seventh transistor T7 included in the output unit SST3" may be connected in parallel to each other as illustrated.

The sixth transistor T6 may be connected between the output terminal OUT and the first power input terminal IN1 connected to the gate high voltage line VGH. The sixth transistor T6 may be configured to control the connection of the first power input terminal IN1 and the output terminal OUT in response to a voltage applied to the first node N1. The sixth transistor T6 may include a first electrode connected to the first power input terminal IN1, a second electrode connected to the output terminal OUT, and a gate electrode connected to the first node N1.

The seventh transistor T7 may be connected between the output terminal OUT and the second clock input terminal CIN2 connected to the second clock line CLK2. The seventh transistor T7 may be configured to control the connection of the output terminal OUT and the second clock input terminal CIN2 in response to a voltage applied to the second node N2. The seventh transistor T7 may include a first electrode connected to the output terminal OUT, a second electrode connected to the second clock input terminal CIN2, and a gate electrode connected to the second node N2.

The first node control unit SST1" may control the voltage of a third node N3 in response to signals supplied to the input terminal IN0, the first clock input terminal CIN1, and the second clock input terminal CIN2. In an embodiment, the first node control unit SST1" may include a first transistor T1, a second transistor T2, and a third transistor T3.

The first transistor T1 may be connected between the third node N3 and the input terminal IN0 to which a start signal (or the previous gate signal) is applied. The first transistor T1 may be configured to control the connection between the input terminal IN0 and the third node N3 through a first clock signal supplied to the first clock input terminal CIN1. The first transistor T1 may have a dual-gate structure to prevent a leakage current. The first transistor T1 may include a pair of transistors, may be connected in series between the input terminal IN0 and the third node N3, and may include a gate electrode connected to the first clock input terminal CIN1.

The second transistor T2 and the third transistor T3 may be connected in series between the third node N3 and the first power input terminal IN1. The third transistor T3 may be connected between the second transistor T2 and the third node N3. The third transistor T3 may be configured to control the connection between the second transistor T2 and the third node N3 in response to a second clock signal supplied to the second clock input terminal CIN2. The third transistor T3 may include a first electrode connected to a second electrode of the second transistor T2, a second electrode connected to the third node N3, and a gate electrode connected to the second clock input terminal CIN2.

The second transistor T2 may be connected between the third transistor T3 and the first power input terminal IN1. The second transistor T2 may be configured to control the connection between the third transistor T3 and the first power input terminal IN1 in response to the voltage of the first node N1. The second transistor T2 may include a first electrode connected to the first power input terminal IN1, a second electrode connected to the first electrode of the third transistor T3, and a gate electrode connected to the first node N1.

The second node control unit SST2" may control the voltage of the first node N1 in response to the voltage of the first clock input terminal CIN1 and the third node N3. In an embodiment, the second node control unit SST2" may include an eighth transistor T8, a fourth transistor T4, a fifth transistor T5, a first capacitor C1, and a second capacitor C2.

The first capacitor C1 may be connected between the first node N1 and the first power input terminal IN1. The first capacitor C1 may be configured to charge a voltage applied to the first node N1. The first capacitor C1 may include a first electrode connected to the first node N1 and a second electrode connected to the first power input terminal IN1. The first electrode of the first capacitor C1 may be connected to the gate electrode of the second transistor T2 and the gate electrode of the sixth transistor T6.

The second capacitor C2 may be connected between the second node N2 and the output terminal OUT. The second capacitor C2 may be configured to charge a voltage corresponding to the turn-on and turn-off of the seventh transistor T7. The second capacitor C2 may include a first electrode connected to the second node N2 and a second electrode connected to the output terminal OUT. The first electrode of the second capacitor C2 may be electrically connected to a second electrode of the eighth transistor T8.

The fourth transistor T4 may be connected between the first node N1 and the first clock input terminal CIN1. The fourth transistor T4 may be configured to control the connection between the first node N1 and the first clock input terminal CIN1 in response to the voltage of the third node N3. The fourth transistor T4 may include a first electrode connected to the first clock input terminal CIN1, a second electrode connected to the first node N1, and a gate electrode connected to the third node N3.

The fifth transistor T5 may be located between the first node N1 and the second power input terminal IN2 connected to the gate low voltage line VGL. The fifth transistor T5 may be configured to control the connection between the first node N1 and the second power input terminal IN2 in response to the first clock signal of the first clock input terminal CIN1. The fifth transistor T5 may include a first electrode connected to the first node N1, a second electrode connected to the second power input terminal IN2, and a gate electrode connected to the first clock input terminal CIN1.

The eighth transistor T8 may be located between the third node N3 and the second node N2. The eighth transistor T8 may be configured to maintain the electrical connection between the third node N3 and the second node N2 while maintaining the turn-on state. Also, the eighth transistor T8 may be configured to restrict the voltage drop width of the third node N3 in response to the voltage of the second node N2. The eighth transistor T8 may include a first electrode connected to the third node N3, a second electrode connected to the second node N2, and a gate electrode connected to the second power input terminal IN2.

The initialization control signal GI (see FIG. 10) output from the first initialization stage GIST1 having the above configuration may be transmitted through the corresponding initialization output line to the corresponding initialization control line GIL (see FIG. 10). Also, the signal output from the first initialization stage GIST1 may be transmitted through the carry line CRL (see FIG. 13) to the second initialization stage GIST2 (see FIG. 10) located at the next stage to the first initialization stage GIST1.

Figure 12:
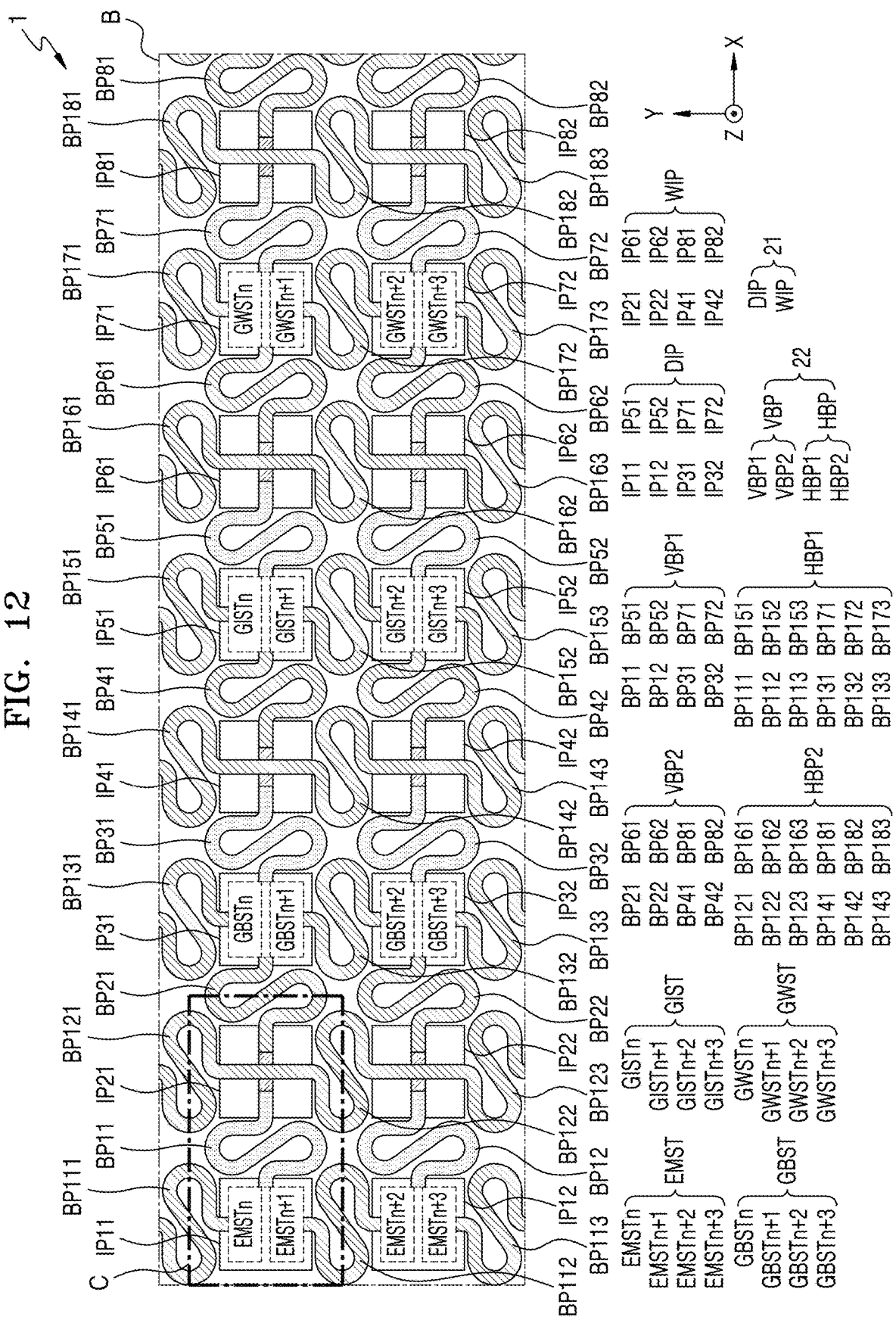
FIG. 12 is a schematic enlarged plan view of a portion of a display apparatus according to an embodiment, which is an enlarged view of region B of FIG. 3.

FIG. 12 is a schematic enlarged plan view of a portion of a display apparatus according to an embodiment, which is an enlarged view of region B of FIG. 3.

Referring to FIG. 12, in an embodiment, a plurality of peripheral island portions 21 and a plurality of peripheral bridge portions 22 may be arranged in the non-display area NDA (see FIG. 3). The plurality of peripheral island portions 21 may be arranged apart from each other, and the peripheral bridge portion 22 may connect adjacent peripheral island portions 21 to each other. Herein, that the adjacent peripheral island portions 21 are connected to each other by the peripheral bridge portion 22 may mean that the peripheral bridge portion 22 extends between the adjacent peripheral island portions 21 and the peripheral island portions 21 and the plurality of peripheral bridge portions 22 are integrally provided or formed as a single unitary and indivisible part.

The peripheral island portion 21 may include a driver island portion DIP in which a driver stage may be arranged and a wiring island portion WIP in which input lines may be arranged. In an embodiment, at least one or more driver stages may be arranged in the driver island portion DIP, and some of the input lines configured to apply signals or voltages to the driver stages may be arranged in the wiring island portion WIP. However, not all of the input lines configured to apply signals or voltages to the driver stage are arranged in the wiring island portion WIP; for example, some may be arranged in the wiring island portion WIP and the others may also be arranged in the driver island portion DIP. Hereinafter, some of a plurality of input lines arranged in the wiring island portion WIP may be referred to as first input lines IL1 (see FIG. 13), and the others of the plurality of input lines arranged in the driver island portion DIP may be referred to as second input lines IL2 (see FIG. 13).

The driver island portion DIP and the wiring island portion WIP may be alternately arranged in a first row in the first direction (e.g., x direction), and the driver island portion DIP and the wiring island portion WIP may be arranged in a second row parallel to the first row in the same way as in the first row. That is, the driver island portion DIP may be continuously arranged in a first column in the second direction (e.g., y direction), and the wiring island portion WIP may be continuously arranged in a second column parallel to the first column. In an embodiment, as a plurality of wiring island portions WIP are continuously arranged in the second direction, a plurality of first input lines IL1 (see FIG. 13) may extend in the second direction (e.g., y direction). In such an embodiment, as a plurality of driver island portions DIP are continuously arranged in the second direction, a plurality of second input lines IL2 (see FIG. 13) may extend in the second direction (e.g., y direction).

In an embodiment, for example, the driver island portion DIP may include a first first island portion (hereinafter, will be referred to as "1st-1 island portion") IP11, a second first island portion (hereinafter, will be referred to as "1st-2 island portion") IP12, a first third island portion (hereinafter, will be referred to as "3rd-1 island portion") IP31, a second third island portion (hereinafter, will be referred to as "3rd-2 island portion") IP32, a first fifth island portion (hereinafter, will be referred to as "5th-1 island portion IP51"), a second fifth island portion (hereinafter, will be referred to as "5th-2 island portion IP52"), a first seventh island portion (hereinafter, will be referred to as "7th-1 island portion IP71"), and a second seventh island portion (hereinafter, will be referred to as "7th-2 island portion") IP72. The wiring island portion WIP may include a first second island portion (hereinafter, will be referred to as "2nd-1 island portion") IP21, a second second island portion (hereinafter, will be referred to as "2nd-2 island portion") IP22, a first fourth island portion (hereinafter, will be referred to as "4th-1 island portion") IP41, a second fourth island portion (hereinafter, will be referred to as "4th-2 island portion") IP42, a first sixth island portion (hereinafter, will be referred to as "6th-1 island portion") IP61, a second sixth island portion (hereinafter, will be referred to as "6th-2 island portion") IP62, aa first eighth island portion (hereinafter, will be referred to as "8th-1 island portion") IP81, and a second eighth island portion (hereinafter, will be referred to as "8th-2 island portion") IP82.

The peripheral bridge portion 22 may be a portion connecting adjacent peripheral island portions 21 to form an elongated structure and may have a serpentine shape. The peripheral bridge portion 22 may be provided with a plurality of output lines configured to transmit an output signal of a driver and a plurality of connection lines connected to an input line to transmit an input signal.

The peripheral bridge portion 22 may include a vertical bridge portion VBP and a horizontal bridge portion HBP. Particularly, the vertical bridge portion VBP may be a peripheral bridge portion 22 connecting the driver island portion DIP with the wiring island portion WIP and may have an 'S' shape in the first direction (e.g., x direction). The horizontal bridge portion HBP may be a peripheral bridge portion 22 connecting adjacent driver island portions DIP to each other or connecting adjacent wiring island portions WIP to each other and may have an 'S' shape in the second direction (e.g., y direction). That is, the horizontal bridge portion HBP may have a shape formed by rotating the shape of the vertical bridge portion VBP by 90 degrees.

The vertical bridge portion VBP may include a first vertical bridge portion VBP1 and a second vertical bridge portion VBP2. The first vertical bridge portion VBP1 may be a peripheral bridge portion 22 arranged between a certain driver island portion DIP and a wiring island portion WIP in which input lines configured to apply a signal to the certain driver island portion DIP are arranged. The second vertical bridge portion VBP2 may be arranged between a certain driver island portion DIP and a wiring island portion WIP in which input lines configured to apply a signal to another driver island portion DIP different from the certain driver island portion DIP are arranged. In other words, the first vertical bridge portion VBP1 may be a peripheral bridge portion 22 arranged between a certain driver island portion DIP and a wiring island portion WIP associated with the certain driver island portion DIP, and the second vertical bridge portion VBP2 may be a peripheral bridge portion 22 arranged between a certain driver island portion DIP and a wiring island portion WIP not associated with the certain driver island portion DIP.

Accordingly, the first vertical bridge portion VBP1 may be provided with both the output line of the driver and the connection line of the input lines, whereas the second vertical bridge portion VBP2 may be provided with only the output line of the driver. The first vertical bridge portion VBP1 and the second vertical bridge portion VBP2 may be alternately arranged in the first direction. In an embodiment, for example, the first vertical bridge portion VBP1 may include a first first bridge portion (hereinafter, will be referred to as "1st-1 bridge portion") BP11, a second first bridge portion (hereinafter, will be referred to as "1st-2 bridge portion") BP12, a first third bridge portion (hereinafter, will be referred to as "3rd-1 bridge portion") BP31, a second third bridge portion (hereinafter, will be referred to as "3rd-2 bridge portion") BP32, a first fifth bridge portion (hereinafter, will be referred to as "5th-1 bridge portion") BP51, a second fifth bridge portion (hereinafter, will be referred to as "5th-2 bridge portion") BP52, a first seventh bridge portion (hereinafter, will be referred to as "7th-1 bridge portion") BP71, and a second seventh bridge portion (hereinafter, will be referred to as "7th-2 bridge portion") BP72. The second vertical bridge portion VBP2 may include a first second bridge portion (hereinafter, will be referred to as "2nd-1 bridge portion") BP21, a second second bridge portion (hereinafter, will be referred to as "2nd-2 bridge portion") BP22, a first fourth bridge portion (hereinafter, will be referred to as "4th-1 bridge portion") BP41, a second fourth bridge portion (hereinafter, will be referred to as "4th-2 bridge portion") BP42, a first sixth bridge portion (hereinafter, will be referred to as "6th-1 bridge portion") BP61, a second sixth bridge portion (hereinafter, will be referred to as "6th-2 bridge portion") BP62, a first eighth bridge portion (hereinafter, will be referred to as "8th-1 bridge portion") BP81, and a second eighth bridge portion (hereinafter, will be referred to as "8th-2 bridge portion") BP82.

The horizontal bridge portion HBP may include a first horizontal bridge portion HBP1 and a second horizontal bridge portion HBP2. The first horizontal bridge portion HBP1 may be a peripheral bridge portion 22 connecting the driver island portions DIP arranged adjacent to each other. The second horizontal bridge portion HBP2 may be a peripheral bridge portion 22 connecting the wiring island portions WIP arranged adjacent to each other. Accordingly, the first horizontal bridge portion HBP1 and the second horizontal bridge portion HBP2 may be alternately arranged in the first direction (e.g., x direction).

In an embodiment, for example, the first horizontal bridge portion HBP1 may include a first eleventh bridge portion (hereinafter, will be referred to as "11th-1 bridge portion") BP111, a second eleventh bridge portion (hereinafter, will be referred to as "$11^{th}$-2 bridge portion") BP112, a third eleventh bridge portion (hereinafter, will be referred to as "11th-3 bridge portion") BP113, a first thirteenth bridge portion (hereinafter, will be referred to as "13th-1 bridge portion") BP131, a second thirteenth bridge portion (hereinafter, will be referred to as "13th-2 bridge portion") BP132, a third thirteenth bridge portion (hereinafter, will be referred to as "13th-3 bridge portion") BP133, a first fifteenth bridge portion (hereinafter, will be referred to as "15th-1 bridge portion") BP151, a second fifteenth bridge portion (hereinafter, will be referred to as "15th-2 bridge portion") BP152, a third fifteenth bridge portion (hereinafter, will be referred to as "15th-3 bridge portion") BP153, a first seventeenth bridge portion (hereinafter, will be referred to as "17th-1 bridge portion") BP171, a second seventeenth bridge portion (hereinafter, will be referred to as "17th-2 bridge portion") BP172, and a third seventeenth bridge portion (hereinafter, will be referred to as "17th-3 bridge portion") BP173. The second horizontal bridge portion HBP2 may include a first twelfth bridge portion (hereinafter, will be referred to as "12th-1 bridge portion") BP121, a second twelfth bridge portion (hereinafter, will be referred to as "12th-2 bridge portion") BP122, a third twelfth bridge portion (hereinafter, will be referred to as "12th-3 bridge portion") BP123, a first fourteenth bridge portion (hereinafter, will be referred to as "14th-1 bridge portion") BP141, a second fourteenth bridge portion (hereinafter, will be referred to as "14th-2 bridge portion") BP142, a third fourteenth bridge portion (hereinafter, will be referred to as "14th-3 bridge portion") BP143, a first sixteenth bridge portion (hereinafter, will be referred to as "16th-1 bridge portion") BP161, a second sixteenth bridge portion (hereinafter, will be referred to as "16th-2 bridge portion") BP162, a third sixteenth bridge portion (hereinafter, will be referred to as "16th-3 bridge portion") BP163, a first eighteenth bridge portion (hereinafter, will be referred to as "18th-1 bridge portion") BP181, a second eighteenth bridge portion (hereinafter, will be referred to as "18th-2 bridge portion") BP182, and a third eighteenth bridge portion (hereinafter, will be referred to as "18th-3 bridge portion") BP183.

In an embodiment, the gate driving circuit GDC (see FIG. 3) arranged in the driver island portion DIP may be arranged in the order of the emission control driving circuit EMDC (see FIG. 10), the bypass driving circuit GBDC (see FIG. 10), the initialization driving circuit GIDC (see FIG. 10), and the data write driving circuit GWDC (see FIG. 10) from the outer side toward the display area DA (see FIG. 3). In an embodiment, as illustrated in FIG. 12, where the size and/or width of the peripheral island portion 21 is greater than the size and/or width of the main island portion 11 (see FIG. 4), two driver stages may be arranged in one driver island portion DIP in an embodiment. However, the disclosure is not limited thereto, and in another embodiment, a single driver stage may be arranged in one driver island portion DIP.

In an embodiment, for example, emission control stages may be arranged in the 1st-1 island portion IP11 and the 1st-2 island portion IP12. In an embodiment, for example, an n-th emission control stage EMSTn and an (n+1)-th emission control stage EMSTn+1 (where n may be a natural number greater than or equal to 1) are arranged in the 1st-1 island portion IP11, and an (n+2)-th emission control stage EMSTn+2 and an (n+3)-th emission control stage EMSTn+3 may be arranged in the 1st-2 island portion IP12.

In such an embodiment, bypass stages may be arranged in the 3rd-1 island portion IP31 and the 3rd-2 island portion IP32. In an embodiment, for example, an n-th bypass stage GBSTn and an (n+1)-th bypass stage GBSTn+1 may be arranged in the 3rd-1 island portion IP31, and an (n+2)-th bypass stage GBSTn+2 and an (n+3)-th bypass stage GBSTn+3 may be arranged in the 3rd-2 island portion IP32.

Initialization stages may be arranged in the 5th-1 island portion IP51 and the 5th-2 island portion IP52. In an embodiment, for example, an n-th initialization stage GISTn and an (n+1)-th initialization stage GISTn+1 may be arranged in the 5th-1 island portion IP51, and an (n+2)-th initialization stage GISTn+2 and an (n+3)-th initialization stage GISTn+3 may be arranged in the 5th-2 island portion IP52.

Data write stages may be arranged in the 7th-1 island portion IP71 and the 7th-2 island portion IP72. In an embodiment, for example, an n-th data write stage GWSTn and an (n+1)-th data write stage GWSTn+1 may be arranged in the 7th-1 island portion IP71, and an (n+2)-th data write stage GWSTn+2 and an (n+3)-th data write stage GWSTn+3 may be arranged in the 7th-2 island portion IP72.

In an embodiment, as described above, the input lines configured to apply signals or voltages to each driver stage may include a first input lines IL1 (see FIG. 13) arranged in the wiring island portion WIP and a second input line IL2 (see FIG. 13) arranged in the driver island portion DIP. The first input lines IL1 (see FIG. 13) may extend by being arranged in the wiring island portion WIP and also being arranged in the second horizontal bridge portion HBP2. The second input lines IL2 (see FIG. 13) may extend by being arranged in the driver island portion DIP and also being arranged in the first horizontal bridge portion HBP1.

In an embodiment, some of the input lines for supplying signals or voltage to the emission control stage EMST may extend through the 12th-1 bridge portion BP121, the 12th-2 bridge portion BP122, and the 12th-3 bridge portion BP 123, and the others may extend through the 11th-1 bridge portion BP111, the 11th-2 bridge portion BP112, and the 11th-3 bridge portion BP113. In such an embodiment, some of the input lines for supplying signals or voltages to the bypass stage GBST may extend through the 14th-1 bridge portion BP141, the 14th-2 bridge portion BP142, and the 14th-3 bridge portion BP143, and the others may extend through the 13th-1 bridge portion BP131, the 13th-2 bridge portion BP132, and the 13th-3 bridge portion BP133. Some of the input lines for supplying signals or voltages to the initialization stage GIST may extend through the 16th-1 bridge portion BP161, the 16th-2 bridge portion BP162, and the 16th-3 bridge portion BP163, and the others may extend through the 15th-1 bridge portion BP151, the 15th-2 bridge portion BP152, and the 15th-3 bridge portion BP153. Some of the input lines for supplying signals or voltages to the data write stage GWST may extend through the 18th-1 bridge portion BP181, the 18th-2 bridge portion BP182, and the 18th-3 bridge portion BP183, and the others may extend through the 17th-1 bridge portion BP171, the 17th-2 bridge portion BP172, and the 17th-3 bridge portion BP173.

In an embodiment, the output line configured to transmit the output signal of each driver stage may extend toward the display area DA (see FIG. 3) in the first direction (e.g., x direction). Accordingly, the output line may be arranged in the same row as the driver island portion DIP in which the connected driver stage is arranged and may extend through a plurality of vertical bridge portions VBP that is more adjacent to the display area DA (see FIG. 3) than the corresponding driver island portion DIP.

In an embodiment, for example, the emission control output line of the n-th emission control stage EMSTn may be arranged in the same row as the 1st-1 island portion IP11 and may extend through the 1st-1 bridge portion BP11, the 2nd-1 bridge portion BP21, the 3rd-1 bridge portion BP31, the 4th-1 bridge portion BP41, the 5th-1 bridge portion BP51, the 6th-1 bridge portion BP61, the 7th-1 bridge portion BP71, and the 8th-1 bridge portion BP81 that are more adjacent to the display area DA (see FIG. 3) than the 1st-1 island portion IP11. In such an embodiment, the bypass output line of the n-th bypass stage GBSTn may be arranged in the same row as the 3rd-1 island portion IP31 and may extend through the 3rd-1 bridge portion BP31, the 4th-1 bridge portion BP41, the 5th-1 bridge portion BP51, the 6th-1 bridge portion BP61, the 7th-1 bridge portion BP71, and the 8th-1 bridge portion BP81 that are more adjacent to the display area DA (see FIG. 3) than the 3rd-1 island portion IP31. The initialization output line of the n-th initialization stage GISTn may be arranged in the same row as the 5th-1 island portion IP51 and may extend through the 5th-1 bridge portion BP51, the 6th-1 bridge portion BP61, the 7th-1 bridge portion BP71, and the 8th-1 bridge portion BP81 that are more adjacent to the display area DA (see FIG. 3) than the 5th-1 island portion IP51. The data write output line of the n-th data write stage GWSTn may be arranged in the same row as the 7th-1 island portion IP71 and may be connected through the 7th-1 bridge portion BP71 and the 8th-1 bridge portion BP81 that are more adjacent to the display area DA (see FIG. 3) than the 7th-1 island portion IP71.

Figure 14:
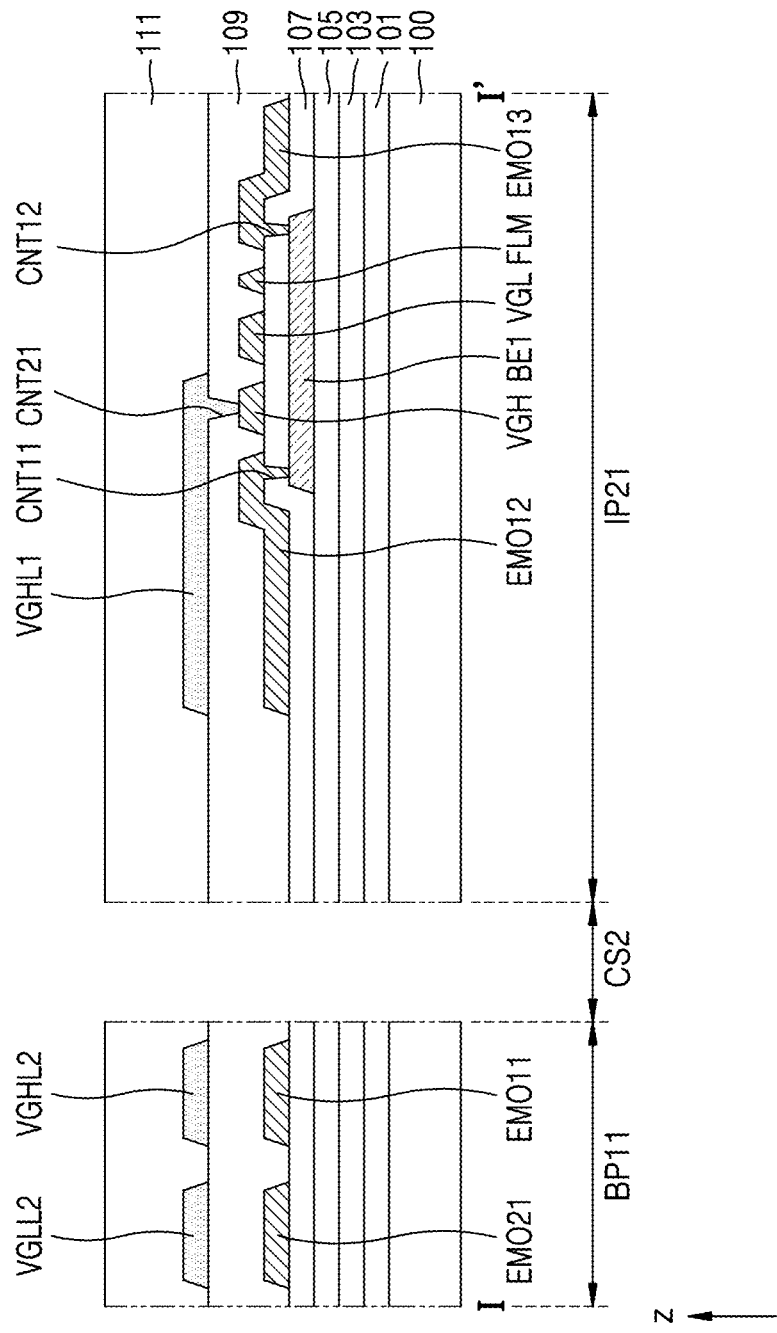
FIG. 14 is a cross-sectional view illustrating a portion of a display apparatus according to an embodiment, which corresponds to a cross-section taken along line I-I' of FIG. 13.

FIG. 13 is a schematic enlarged plan view of a portion of a display apparatus according to an embodiment, which is an enlarged view of region C of FIG. 12. FIG. 14 is a cross-sectional view illustrating a portion of a display apparatus according to an embodiment, which corresponds to a cross-section taken along line I-I' of FIG. 13.

In an embodiment, referring to FIG. 13, the n-th emission control stage EMSTn and the (n+1)-th emission control stage EMSTn+1 may be arranged in the 1st-1 island portion IP11. Each emission control stage EMST (see FIG. 12) may include a node control unit and a buffer transistor. In an embodiment, for example, the n-th emission control stage EMSTn may include a first emission node control unit EMNC1 and a first emission buffer transistor EMBF1, and the (n+1)-th emission control stage EMSTn+1 may include a second emission node control unit EMNC2 and a second emission buffer transistor EMBF2. Each of the first emission node control unit EMNC1 and the second emission node control unit EMNC2 may include a plurality of transistors and capacitors and may control the voltage of the node by using a start signal provided through the input terminal. Each of the first emission buffer transistor EMBF1 and the second emission buffer transistor EMBF2 may be a transistor arranged to isolate a signal source from a circuit driven by the signal source. Each of the bypass stage GBST (see FIG. 12), the initialization stage GIST (see FIG. 12), and the data write stage GWST (see FIG. 12) may also include a node control unit and a buffer transistor.

The output signal of each of the n-th emission control stage EMSTn and the (n+1)-th emission control stage EMSTn+1 may be applied as the emission control signal EM (see FIG. 10) to the display area DA (see FIG. 3) through an emission control output line EMO. In an embodiment, for example, the emission control signal EM output from the emission control stage EMST (see FIG. 12) may be first transmitted to the emission control output line EMO and then supplied to the pixel of the display area DA (see FIG. 3) through the emission control line EML (see FIG. 10) connected to the emission control output line EMO.

The emission control output line EMO may include a first emission control output line EMO1 connected to the n-th emission control stage EMSTn and a second emission control output line EMO2 connected to the (n+1)-th emission control stage EMSTn+1. That is, an output line may be arranged for each stage, and in an embodiment, where only one stage is arranged in the 1st-1 island portion IP11, only one output line may be disposed over the 1st-1 bridge portion BP11.

In an embodiment, the first emission control output line EMO1 may include a first portion EMO11 of the first emission control output line, a second portion EMO12 of the first emission control output line, a third portion EMO13 of the first emission control output line EMO1, and a fourth portion EMO14 of the first emission control output line.

The first portion EMO11 of the first emission control output line may be arranged in the first vertical bridge portion VBP1, for example, the 1st-1 bridge portion BP11. That is, the first portion EMO11 of the first emission control output line may be arranged in the 1st-1 bridge portion BP11 arranged between the 1st-1 island portion IP11 in which the n-th emission control stage EMSTn is arranged and the 2nd-1 island portion IP21 in which the first input lines IL1 configured to apply signals or voltages to the corresponding stage are arranged. Accordingly, the first portion EMO11 of the first emission control output line may have a serpentine shape or an 'S' shape. As described below, because the connection lines of the first input lines IL1 are also arranged in the 1st-1 bridge portion BP11, the first portion EMO11 of the first emission control output line may overlap a portion of the connection line.

The second portion EMO12 of the first emission control output line and the third portion EMO13 of the first emission control output line may be arranged in the wiring island portion WIP (see FIG. 12), for example, the 2nd-1 island portion IP21. The second portion EMO12 of the first emission control output line and the third portion EMO13 of the first emission control output line may extend in the first direction (e.g., x direction) in the 2nd-1 island portion IP21. In such an embodiment, because the first input lines IL1 extend in the second direction (e.g., y direction) in the 2nd-1 island portion IP21, there may be an area in which the first input lines IL1 and the emission control output line EMO intersect and overlap each other.

When the first input lines IL1 and the emission control output line EMO are arranged in (or directly on) a same layer, a collision between the lines may be avoided through a first bridge electrode BE1 as illustrated in FIG. 13. The first bridge electrode BE1 may be arranged lower than the first input lines IL1 and the emission control output line EMO, and at least one insulating layer may be arranged between the emission control output line EMO and the first bridge electrode BE1. The second portion EMO12 of the first emission control output line and the third portion EMO13 of the first emission control output line may be respectively connected to both ends of the first bridge electrode BE1 through contact holes. Accordingly, the output signal of the n-th emission control stage EMSTn may be transmitted through the second portion EMO12 of the first emission control output line, the first bridge electrode BE1, and the third portion EMO13 of the first emission control output line.

The fourth portion EMO14 of the first emission control output line may be arranged in the second vertical bridge portion VBP2, for example, the 2nd-1 bridge portion BP21. That is, the fourth portion EMO14 of the first emission control output line may be arranged in the 2nd-1 bridge portion BP21 connecting the 2nd-1 island portion IP21 with the 3rd-1 island portion IP31 (see FIG. 12) in which the bypass stage GBST (see FIG. 12) is arranged. Accordingly, the fourth portion EMO14 of the first emission control output line may have a serpentine shape or an 'S' shape. Because the connection line of the first input lines IL1 may not be arranged in the 2nd-1 bridge portion BP21, the fourth portion EMO14 of the first emission control output line may not overlap the connection line.

In such an embodiment, the second emission control output line EMO2 may have the same structure as the first emission control output line EMO1. That is, a first portion EMO21 of the second emission control output line, a second portion EMO22 of the second emission control output line, a third portion EMO23 of the second emission control output line, and a fourth portion EMO24 of the second emission control output line may have the same shapes as the first portion EMO11 of the first emission control output line, the second portion EMO12 of the first emission control output line, the third portion EMO13 of the first emission control output line, and the fourth portion EMO14 of the first emission control output line, respectively.

The structure of the emission control output line EMO has been described with reference to only in region C of FIG. 12; however, as described above, the emission control output line EMO may extend through a plurality of peripheral island portions 21 (see FIG. 12) and a plurality of peripheral bridge portions 22 (see FIG. 12). The emission control output line EMO may extend in the non-display area NDA (see FIG. 3) while repeating this structure.

In an embodiment, input lines configured to apply signals or voltages to the n-th emission control stage EMSTn and the (n+1)-th emission control stage EMSTn+1 may be arranged in the non-display area NDA (see FIG. 3). The input lines may include first input lines IL1 arranged in the wiring island portion WIP (see FIG. 12) and second input lines IL2 arranged in the driver island portion DIP (see FIG. 12). That is, among the input lines necessary for the n-th emission control stage EMSTn, the first input lines IL1 may be arranged in the 2nd-1 island portion IP21, and the second input lines IL2 may be arranged in the 1st-1 island portion IP21. Each of the first input lines IL1 and the second input lines IL2 may extend in the second direction (e.g., y direction). Accordingly, the first input lines IL1 may extend through the 12th-1 bridge portion BP121 and the 12th-2 bridge portion BP122, and the second input lines IL2 may extend through the 11th-1 bridge portion BP111 and the 11th-2 bridge portion BP112.

In an embodiment, the first input lines IL1 may include a gate high voltage line VGH, a gate low voltage line VGL, and a start signal line FLM. The gate high voltage line VGH and the gate low voltage line VGL may be lines configured to apply a driving voltage to the emission control stage EMST (see FIG. 12), the gate high voltage line VGH may be configured to apply a gate-off voltage, and the gate low voltage line VGL may be configured to apply a gate-on voltage. The start signal line FLM may be a line configured to apply a start signal to the first emission control stage EMST1 (see FIG. 10).

In an embodiment, the second input lines IL2 may include a first clock line CLK1, a second clock line CLK2, a carry line CRL, and a reset signal line ESR. The first clock line CLK1 and the second clock line CLK2 may be lines configured to transmit a first clock signal and a second clock signal respectively, and the first clock signal and the second clock signal may be square wave signals repeating a logic high level and a logic low level respectively. The carry line CRL may be a line configured to transmit a carry signal, and the carry signal may be a start signal of the next stage. In an embodiment, for example, each of the other emission control stages EMST (see FIG. 12) other than the first emission control stage EMST1 (see FIG. 10) may receive a carry signal output from the previous stage, as a start signal. The reset signal line ESR may be a line configured to transmit a reset signal, and the reset signal may be a signal activated at a low level when the display apparatus 1 (see FIG. 1) is powered on or reset.

In an embodiment, because the second input lines IL2 may be arranged adjacent to the n-th emission control stage EMSTn in the 1st-1 island portion IP11, the second input lines IL2 may be easy to transmit signals. In an embodiment, because the first input lines IL1 are arranged in the 2nd-1 island portion IP21 spaced apart from the 1st-1 island portion IP11, a connection line CW may be additionally provided. The connection line CW may include a high voltage connection line VGHL connected to the gate high voltage line VGH among the first input lines IL1 and a low voltage connection line VGLL connected to the gate low voltage line VGL. In an embodiment where the start signal line FLM among the first input lines IL1 does not transmit a signal to the n-th emission control stage EMSTn and the (n+1)-th emission control stage EMSTn+1, the start signal line FLM may not be connected to the connection line CW.

The high voltage connection line VGHL may include a first portion VGHL1 of the high voltage connection line, a second portion VGHL2 of the high voltage connection line, and a third portion VGHL3 of the high voltage connection line. The first portion VGHL1 of the high voltage connection line VGHL may refer to a portion of the high voltage connection lines VGHL arranged in the 2nd-1 island portion IP21. The first portion VGHL1 of the high voltage connection line may be a portion directly connected to the gate high voltage line VGH and may be connected to the gate high voltage line VGH through a contact hole. Because the gate high voltage line VGH extend in the second direction (e.g., y direction), the first portion VGHL1 of the high voltage connection line may extend in the first direction (e.g., x) intersecting the gate high voltage line VGH.

The second portion VGHL2 of the high voltage connection line VGHL may refer to a portion of the high voltage connection line VGHL arranged in the first vertical bridge portion VBP1, for example, the 1st-1 bridge portion BP11. Accordingly, the second portion VGHL2 of the high voltage connection line may have a serpentine shape or an 'S' shape. The second portion VGHL2 of the high voltage connection line may partially overlap the emission control output line EMO.

The third portion VGHL3 of the high voltage connection line VGHL may refer to a portion of the high voltage connection lines VGHL arranged in the 1st-1 island portion IP11. The third portion VGHL3 of the high voltage connection line may be configured to directly transmit a voltage to the n-th emission control stage EMSTn and the (n+1)-th emission control stage EMSTn+1. Accordingly, the third portion VGHL3 of the high voltage connection line may have a branched shape to extend in the second direction (e.g., y direction) while extending in the first direction (e.g., x direction).

In an embodiment, the low voltage connection line VGLL may have a similar structure to the high voltage connection line VGHL. That is, the low voltage connection line VGLL may include a first portion VGLL1 of the low voltage connection line corresponding to the first portion VGHL1 of the high voltage connection line, a second portion VGLL2 of the low voltage connection line corresponding to the second portion VGHL2 of the high voltage connection line, and a third portion VGLL3 of the low voltage connection line corresponding to the third portion VGHL3 of the high voltage connection line. However, the third portion VGLL3 of the low voltage connection line may have a shape surrounding the outer side of the 1st-1 island portion IP11 not to overlap the third portion VGHL3 of the high voltage connection line and thus may be configured to transmit a voltage to each of the n-th emission control stage EMSTn and the (n+1)-th emission control stage EMSTn+1.

In such an embodiment, the stretchability of the display apparatus 1 may be improved through the structure of the island portions 11 and 21 (see FIG. 4) and the bridge portions 12 and 22 (see FIG. 4) described above. However, in a general display apparatus, because there is a sufficient space to arrange a driving circuit in the non-display area NDA (see FIG. 3), the output lines or input lines of the driving circuit may be easily arranged. In an embodiment of the display apparatus 1, because the output lines or input lines are arranged in the bridge portions 12 and 22 (see FIG. 4), the length of lines may increase in accordance with the 'S' shape, and because various lines are arranged in a restricted space, the width of lines may decrease and thus the load of lines may increase.

In the display apparatus 1 according to an embodiment, the output line and the connection line CW arranged in the peripheral bridge portion 22 (see FIG. 12) may be arranged in different layers to reduce the load of lines. In such an embodiment, where the emission control output line EMO and the connection line CW are arranged in different layers, the width of the emission control output line EMO and the connection line CW may be maximally secured in the peripheral bridge portion 22 (see FIG. 12), such that the load of the emission control output line EMO and connection line CW may be efficiently reduced. This is not limited to the emission control output line EMO but may also be applied to the bypass output line connected to the bypass stage GBST (see FIG. 12), the initialization output line connected to the initialization stage GIST (see FIG. 12), and the data write output line connected to the data write stage GWST (see FIG. 12).

Referring to FIG. 14, the emission control output line EMO may be arranged between the second interlayer insulating layer 107 and the first organic insulating layer 109. That is, the emission control output line EMO may be arranged in (or directly on) substantially the same layer as the source electrode S1 (see FIG. 7A) and the drain electrode D1 (see FIG. 7A) arranged in the main island portion 11 (see FIG. 4) and may include a same material as the source electrode S1 (see FIG. 7A). In an embodiment, for example, the first portion EMO11 of the first emission control output line and the first portion EMO21 of the second emission control output line may extend in (or directly on) substantially the same layer as the source electrode S1 (see FIG. 7A) in the 1st-1 bridge portion BP11. The second portion EMO12 of the first emission control output line and the second portion EMO22 of the second emission control output line may extend in (or directly on) substantially the same layer as the source electrode S1 (see FIG. 7A) in the 2nd-1 island portion IP21. Likewise, the third portion EMO13 of the first emission control output line and the third portion EMO23 of the second emission control output line may also extend in (or directly on) substantially the same layer as the source electrode S1 (see FIG. 7A) in the 2nd-1 island portion IP21.

However, when the first input lines IL1 are arranged in (or directly on) the same layer as the emission control output line EMO as illustrated in FIG. 14, the second portion EMO12 of the first emission control output line and the third portion EMO13 of the first emission control output line may be electrically connected through a first bridge electrode BE1 and the second portion EMO22 of the second emission control output line and the third portion EMO23 of the second emission control output line may be electrically connected through a second bridge electrode BE2. For example, one end of the first bridge electrode BE1 may be connected to the second portion EMO12 of the first emission control output line through a contact hole CNT11, and the other end may be connected to the third portion EMO13 of the first emission control output line through a contact hole CNT12. The first bridge electrode BE1 and the second bridge electrode BE2 may be arranged lower than the emission control output line EMO and/or the first input line IL1. For example, as illustrated in FIG. 14, the first bridge electrode BE1 and the second bridge electrode BE2 may be arranged in (or directly on) substantially the same layer as the upper electrode CE2 arranged in the main island portion 11 (see FIG. 4). However, the disclosure is not limited thereto, and the first bridge electrode BE1 and the second bridge electrode BE2 may be arranged in (or directly on) substantially the same layer as the first gate electrode G1 arranged in the main island portion 11 (see FIG. 4).

In an embodiment, the connection line CW may be arranged between the first organic insulating layer 109 and the second organic insulating layer 111. That is, the connection line CW may be arranged in (or directly on) substantially the same layer and may include a same material as the first connection electrode CL1 (see FIG. 7A) of the main island portion 11 (see FIG. 4). In an embodiment, for example, the first portion VGHL1 of the high voltage connection line may be arranged in (or directly on) substantially the same layer as the first connection electrode CL1 (see FIG. 7A) in the 2nd-1 island portion IP21 and may be connected to the gate high voltage line VGH through a contact hole CNT21. In such an embodiment, the first portion VGLL1 of the low voltage connection line may be arranged in (or directly on) substantially the same layer as the first connection electrode CL1 (see FIG. 7A)) and may be connected to the gate low voltage line VGL through a contact hole. The second portion VGHL2 of the high voltage connection line and the second portion VGLL2 of the low voltage connection line may be arranged in (or directly on) substantially the same layer as the first connection electrode CL1 (see FIG. 7A) and may extend over the 1st-1 bridge portion BP11, to transmit a voltage to the 1st-1 island portion IP11.

As illustrated in FIG. 14, the second portion VGHL2 of the high voltage connection line and the first portion EMO11 of the first emission control output line may overlap each other and may be arranged in (or directly on) different layers, respectively, and the second portion VGLL2 of the low voltage connection line and the first portion EMO21 of the second emission control output line may overlap each other and may be arranged in (or directly on) different layers, respectively. Through this structure, the connection line CW and the emission control output line EMO may have the maximum width in the 1st-1 bridge portion BP11. That is, the load may be reduced compared to a case where the emission control output line EMO and the connection line CW are all arranged in (or directly on) a same layer in the 1st-1 bridge portion BP11. In an embodiment, the above structure may be applied not only to the 1st-1 bridge portion BP11 but also to all of the first vertical bridge portions VBP1 (see FIG. 12), such that the load of lines of the display apparatus 1 may be significantly reduced and thus an image of high quality may be implemented.

Figure 15:
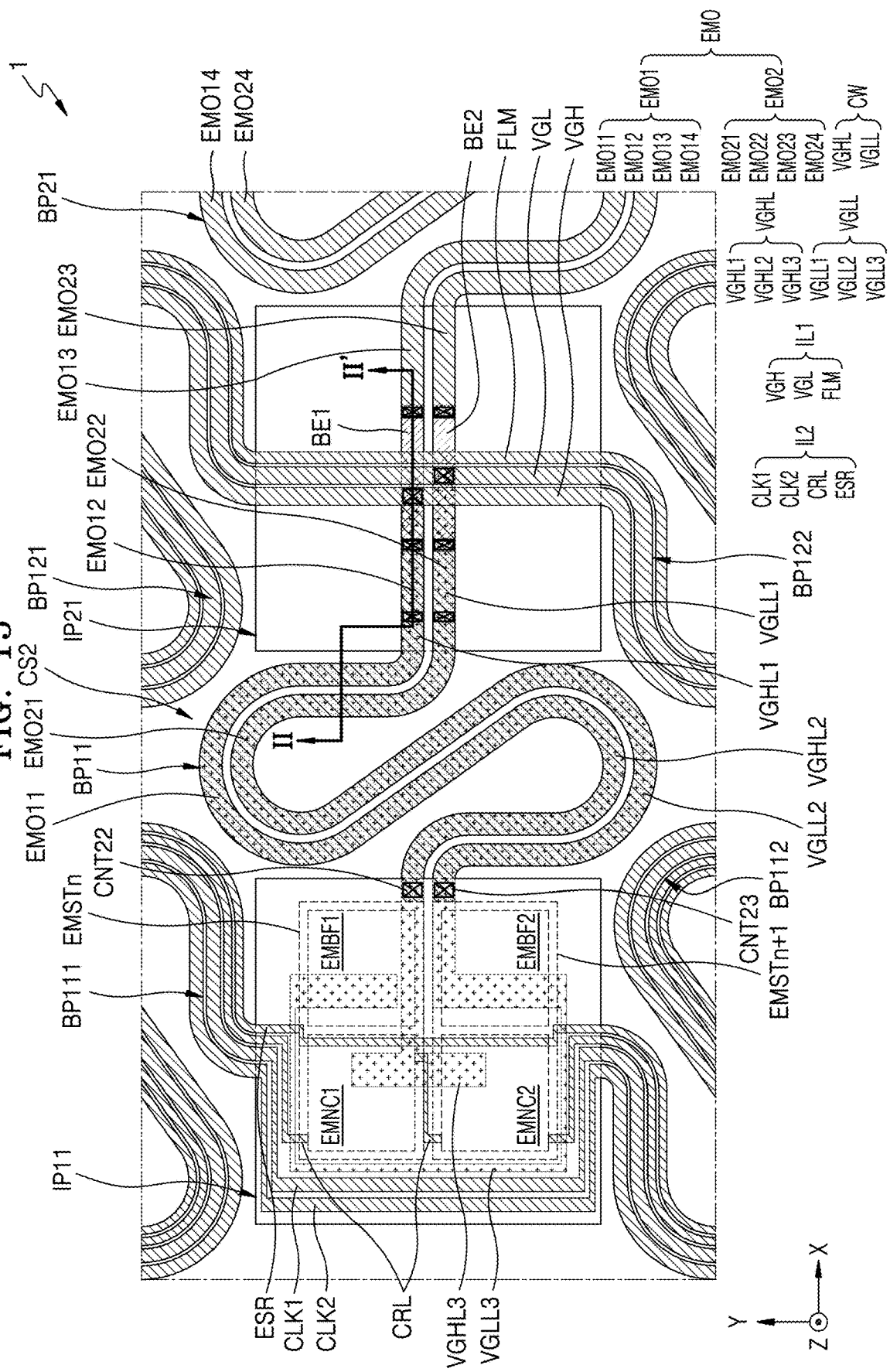
FIG. 15 is a schematic enlarged plan view of a portion of a display apparatus according to another embodiment.
Figure 16:
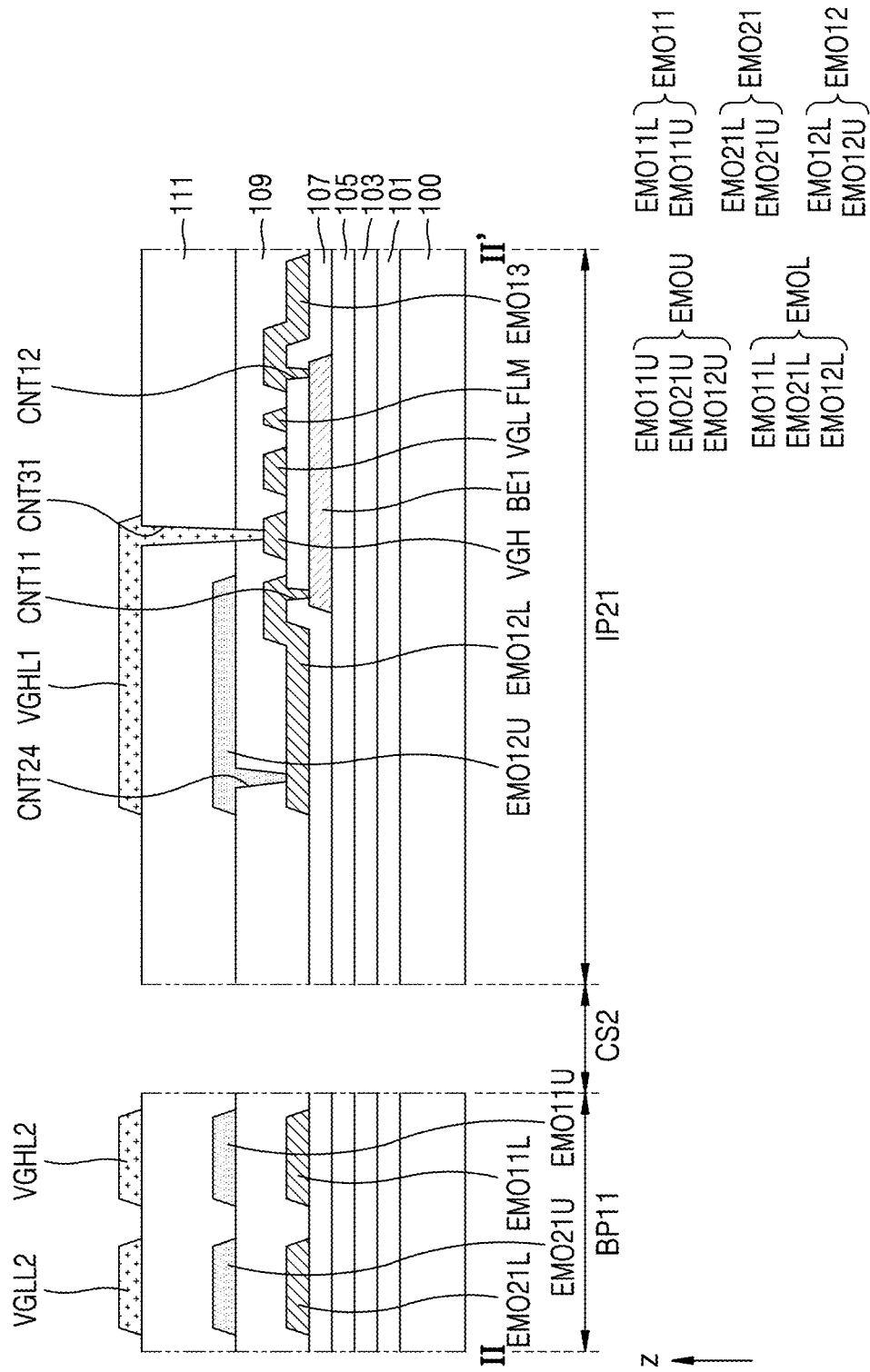
FIG. 16 is a cross-sectional view illustrating a portion of a display apparatus according to another embodiment, which corresponds to a cross-section taken along line II-II' of FIG. 15.

FIG. 15 is a schematic enlarged plan view of a portion of a display apparatus according to another embodiment. FIG. 16 is a cross-sectional view illustrating a portion of a display apparatus according to another embodiment, which corresponds to a cross-section taken along line II-II' of FIG. 15.

Referring to FIGS. 15 and 16, except for the features of the emission control output line EMO and the connection line CW, other features may be the same as those described above with reference to FIGS. 12 to 14. Among the components in FIGS. 15 and 16, the same or like elements as those described above with reference to FIGS. 12 to 14 are labeled with the same or like reference numerals, any repetitive detailed description thereof will be omitted, and differences therebetween will be mainly described below.

Referring to FIG. 15, the emission control output line EMO may include a first emission control output line EMO1 connected to the n-th emission control stage EMSTn and a second emission control output line EMO2 connected to the (n+1)-th emission control stage EMSTn+1. Also, the first emission control output line EMO1 may include a first portion EMO11 of the first emission control output line, a second portion EMO12 of the first emission control output line, a third portion EMO13 of the first emission control output line, and a fourth portion EMO14 of the first emission control output line, and the second emission control output line EMO2 may include a first portion EMO21 of the second emission control output line, a second portion EMO22 of the second emission control output line, a third portion EMO23 of the second emission control output line, and a fourth portion EMO24 of the second emission control output line. The shape of the emission control output line EMO may be the same as the shape of the emission control output line EMO of FIG. 13.

In an embodiment, each of the output lines of the display apparatus 1 may have a dual-line structure. In an embodiment, for example, the output line may include a lower output line and an upper output line disposed over the lower output line, and at least one insulating layer may be arranged between the lower output line and the upper output line.

In an embodiment, the emission control output line EMO may extend in a structure in which a lower emission control output line EMOL and an upper emission control output line EMOU overlap each other. Because the lower emission control output line EMOL and the upper emission control output line EMOU are configured to transmit the same output signal of the emission control stage EMSTn (see FIG. 12), the lower emission control output line EMOL and the upper emission control output line EMOU may be connected through contact holes CNT22 and CNT23. The contact holes CNT22 and CNT23 connecting the lower emission control output line EMOL with the upper emission control output line EMOU are defined over the driver island portion DIP (see FIG. 12), that is, the 1st-1 island portion IP11. Also, because the lower emission control output line EMOL is connected to the first bridge electrode BE1 to transmit a signal, the upper emission control output line EMOU may be electrically connected to the lower emission control output line EMOL through a contact hole CNT24 arranged in the 2nd-1 island portion IP21.

Referring to FIG. 16, a first portion EMO11L of the first lower emission control output line, a first portion EMO21L of the second lower emission control output line, and a second portion EMO12L of the first lower emission control output line may be arranged between the second interlayer insulating layer 107 and the first organic insulating layer 109. That is, the first portion EMO11L of the first lower emission control output line, the first portion EMO21L of the second lower emission control output line, and the second portion EMO12L of the first lower emission control output line may be arranged in (or directly on) substantially the same layer and may include a same material as the source electrode S1 (see FIG. 7A) arranged in the main island portion 11 (see FIG. 4). A first portion EMO11U of the first upper emission control output line, a first portion EMO21U of the second upper emission control output line, and a second portion EMO12U of the first upper emission control output line may be arranged between the first organic insulating layer 109 and the second organic insulating layer 111. That is, the first portion EMO11U of the first upper emission control output line, the first portion EMO21U of the second upper emission control output line, and the second portion EMO12U of the first upper emission control output line may be arranged in (or directly on) substantially the same layer and may include a same material as the first connection electrode CL1 (see FIG. 7A) of the main island portion 11 (see FIG. 4).

In such an embodiment, because the lower emission control output line EMOL is arranged in (or directly on) substantially the same layer as the source electrode S1 (see FIG. 7A) and the upper emission control output line EMOU is arranged in (or directly on) substantially the same layer as the first connection electrode CL1 (see FIG. 7A), the lower emission control output line EMOL and the upper emission control output line EMOU may be arranged in (or directly on) different layers although configured to transmit a same signal. Accordingly, because the emission control output line EMO may have a greater width compared to a case where the emission control output line is arranged as a single layer, the load thereof may be further reduced. In such an embodiment, because the above dual-line structure may be applied not only to the 1st-1 bridge portion BP11 but also to all of the first vertical bridge portions VBP1 (see FIG. 12), the load of lines of the display apparatus 1 may be minimized and thus an image of high quality may be implemented.

Referring to FIGS. 15 and 16, the third portion EMO13 of the first emission control output line and the fourth portion EMO14 of the first emission control output line are illustrated as having a single-layer structure rather than a dual-line structure. However, the disclosure is not limited thereto, and the third portion EMO13 of the first emission control output line and the fourth portion EMO14 of the first emission control output line may have a dual-line structure like the first portion EMO11 of the first emission control output line. That is, the output line may have a dual-line structure not only in the first vertical bridge portion VBP1 (see FIG. 12) but also in the second vertical bridge portion VBP2.

In an embodiment, where the connection line CW is arranged in (or directly on) a different layer than the emission control output line EMO to minimize the load thereof, the connection line CW may be disposed over the second organic insulating layer 111. That is, the connection line CW may be arranged in (or directly on) substantially the same layer and may include the same material as the second connection electrode CL2 (see FIG. 7A) of the main island portion 11 (see FIG. 4).

in an embodiment, the first portion VGHL1 of the high voltage connection line may extend in a same layer as the second connection electrode CL2 (see FIG. 7A) in the 2nd-1 island portion IP21 and may be connected to the gate high voltage line VGH through a contact hole CNT31 defined through the first organic insulating layer 109 and the second organic insulating layer 111. The second portion VGHL2 of the high voltage connection line and the second portion VGLL2 of the low voltage connection line may extend in a same layer as the second connection electrode CL2 (see FIG. 7A)) over the 1st-1 bridge portion BP11, may respectively overlap the first portion EMO11 of the first emission control output line and the first portion EMO21 of the second emission control output, and may be arranged on different layers.

Figure 17:
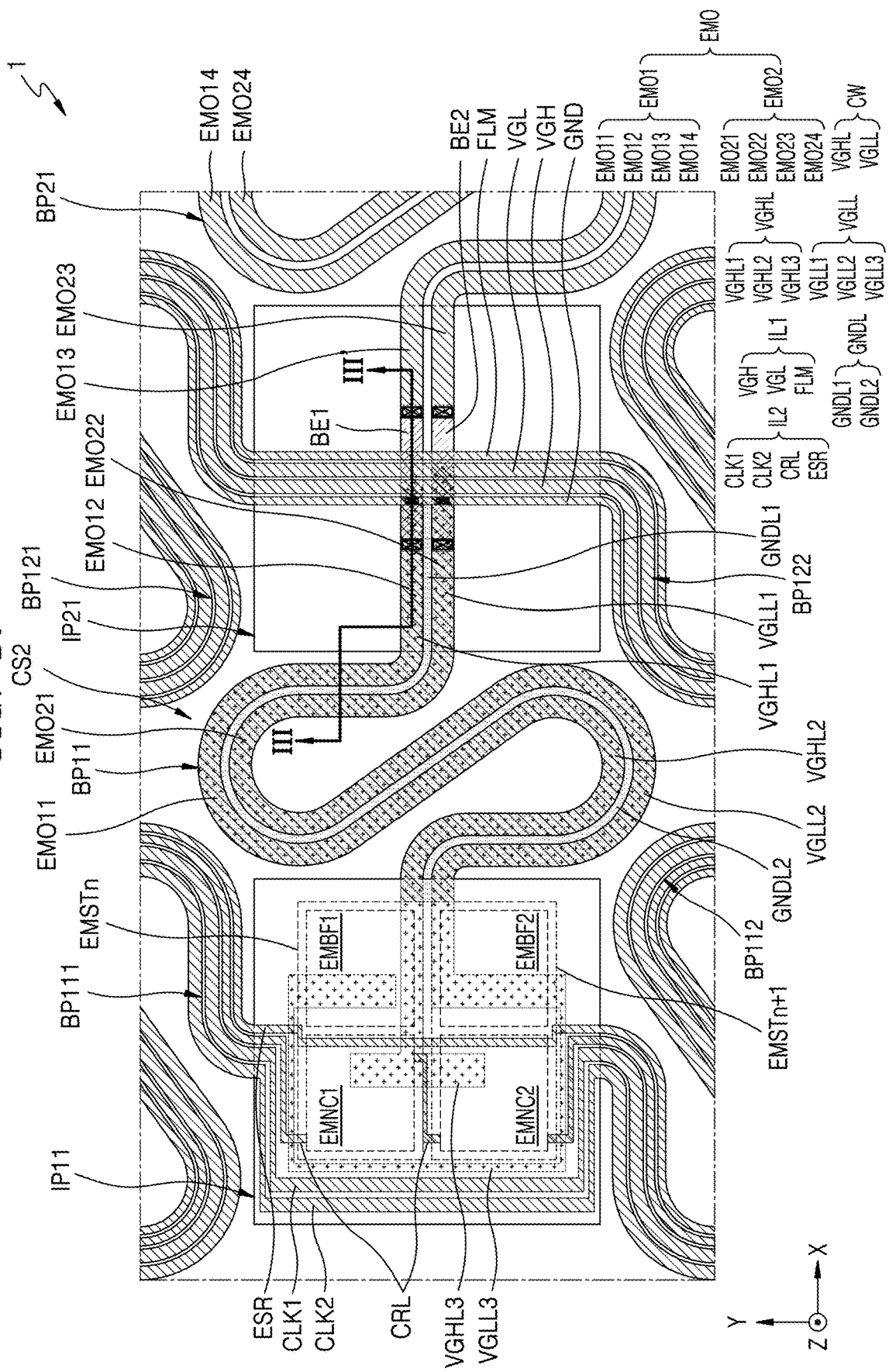
FIG. 17 is a schematic enlarged plan view of a portion of a display apparatus according to another embodiment.
Figure 18:
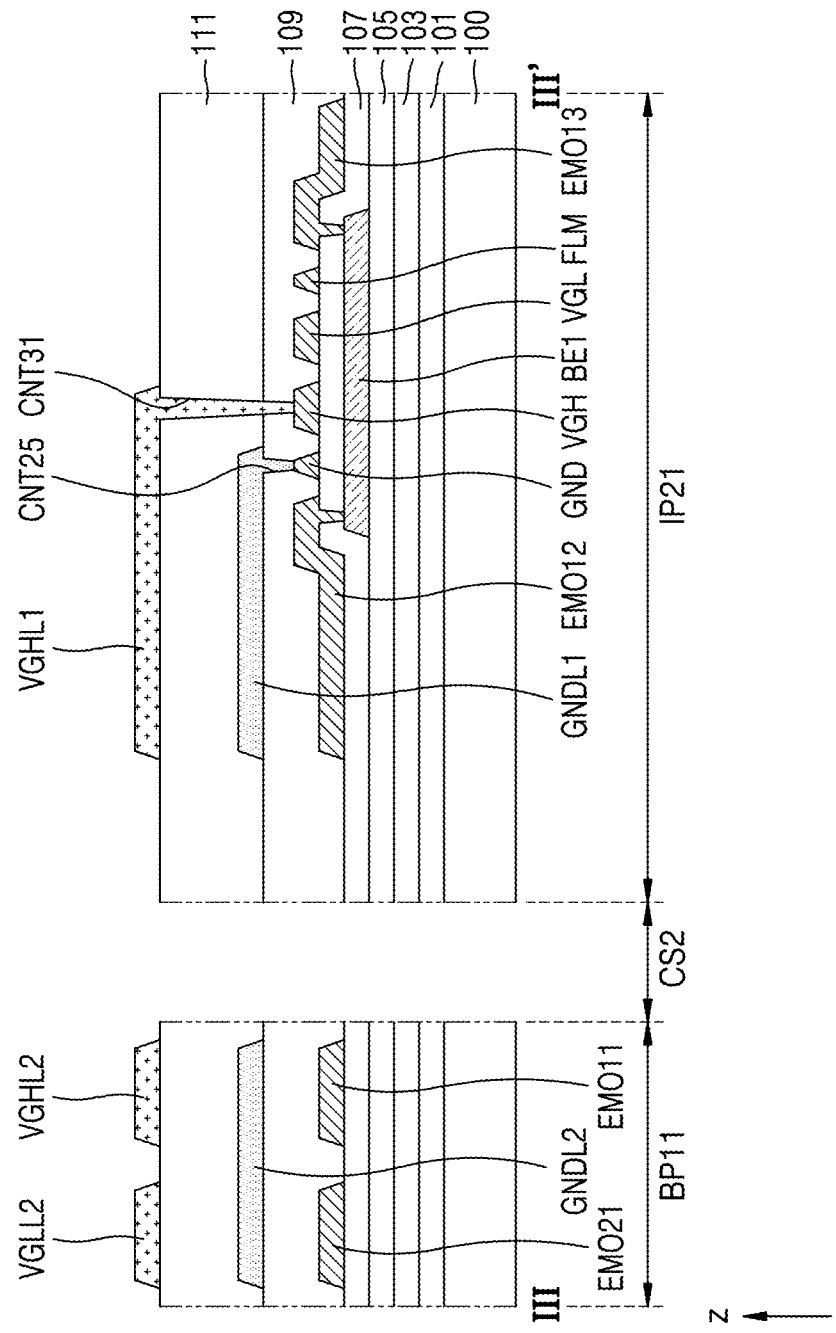
FIG. 18 is a cross-sectional view illustrating a portion of a display apparatus according to another embodiment, which corresponds to a cross-section taken along line III-III' of FIG. 17.
Figure 19:
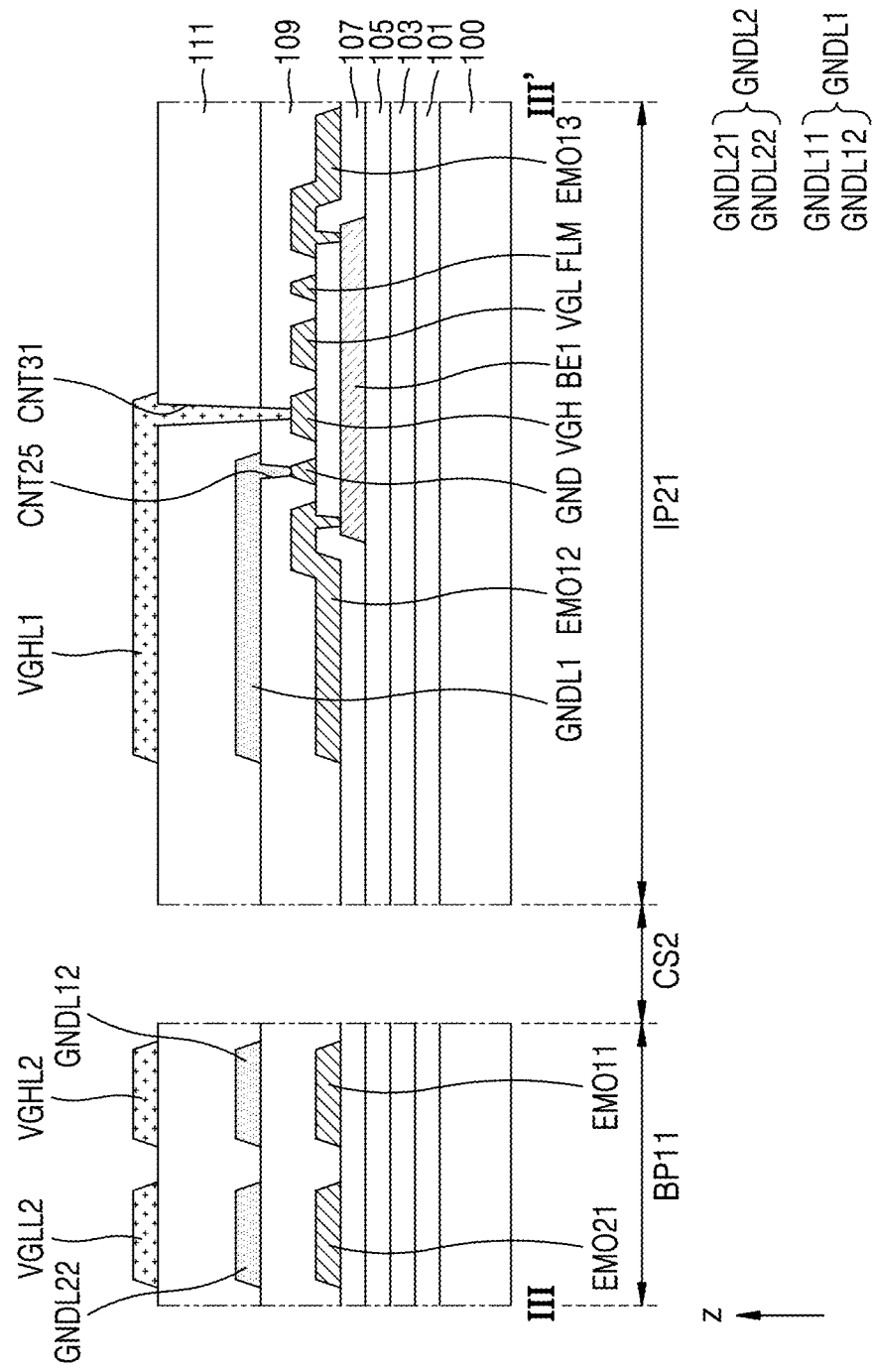
FIG. 19 is a cross-sectional view illustrating a portion of a display apparatus according to another embodiment, which corresponds to a cross-section taken along line III-III' of FIG. 17.

FIG. 17 is a schematic enlarged plan view of a portion of a display apparatus according to another embodiment. FIG. 18 is a cross-sectional view illustrating a portion of a display apparatus according to another embodiment, which corresponds to a cross-section taken along line III-III' of FIG. 17. FIG. 19 is a cross-sectional view illustrating a portion of a display apparatus according to another embodiment, which corresponds to a cross-section taken along line III-III' of FIG. 17.

Referring to FIGS. 17 and 19, except for the features of the shielding line GNDL and the connection line CW, other features may be the same as those described above with reference to FIGS. 12 to 14. Among the components in FIGS. 17 to 19, the same or like elements as those described above with reference to FIGS. 12 to 14 are labeled with the same or like reference numerals, any repetitive detailed description thereof will be omitted, and differences therebetween will be mainly described below.

Referring to FIG. 17, the emission control output line EMO may include a first emission control output line EMO1 connected to the n-th emission control stage EMSTn and a second emission control output line EMO2 connected to the (n+1)-th emission control stage EMSTn+1. Also, the first emission control output line EMO1 may include a first portion EMO11 of the first emission control output line, a second portion EMO12 of the first emission control output line, a third portion EMO13 of the first emission control output line, and a fourth portion EMO14 of the first emission control output line, and the second emission control output line EMO2 may include a first portion EMO21 of the second emission control output line, a second portion EMO22 of the second emission control output line, a third portion EMO23 of the second emission control output line, and a fourth portion EMO24 of the second emission control output line. The shape of the emission control output line EMO may be the same as the shape of the emission control output line EMO of FIG. 13.

In such an embodiment, as described above with reference to FIG. 14, the emission control output line EMO may be arranged between the second interlayer insulating layer 107 and the first organic insulating layer 109. That is, the emission control output line EMO may be arranged in (or directly on) substantially the same layer and may include a same material as the source electrode S1 (see FIG. 7A) arranged in the main island portion 11 (see FIG. 4).

In such an embodiment, the connection line CW is arranged on a different layer than the emission control output line EMO to minimize the load thereof, such that the connection line CW may be disposed over the second organic insulating layer 111. That is, the connection line CW may be arranged in (or directly on) substantially the same layer and may include the same material as the second connection electrode CL2 (see FIG. 7A) of the main island portion 11 (see FIG. 4).

Particularly, the first portion VGHL1 of the high voltage connection line may extend in the same layer as the second connection electrode CL2 (see FIG. 7A) in the 2nd-1 island portion IP21 and may be connected to the gate high voltage line VGH through a contact hole CNT31 passing through the first organic insulating layer 109 and the second organic insulating layer 111. The second portion VGHL2 of the high voltage connection line and the second portion VGLL2 of the low voltage connection line may extend in the same layer as the second connection electrode CL2 (see FIG. 7A) over the 1st-1 bridge portion BP11, may respectively overlap the first portion EMO11 of the first emission control output line and the first portion EMO21 of the second emission control output, and may be arranged in (or directly on) different layers from the first portion EMO11 of the first emission control output line and the first portion EMO21 of the second emission control output.

In the display apparatus 1 according to another embodiment, as shown in FIG. 18, a shielding line GNDL may be arranged between the emission control output line EMO and the connection line CW. In such an embodiment, by applying a ground voltage to the shielding line GNDL, the emission control output line EMO and the connection line CW may be effectively prevented from being affected by each other's electrical characteristics. In such an embodiment, as the shielding line GNDL with a ground voltage is arranged between the emission control output line EMO and the connection line CW, the coupling of the emission control output line EMO and the connection line CW may be shielded.

In such an embodiment, a ground voltage line GND may be additionally arranged in order for the shielding line GNDL to receive a ground voltage applied thereto. The ground voltage line GND may be arranged in the wiring island portion WIP, that is, the 2nd-1 island portion IP21, and may be arranged adjacent to a plurality of first input lines IL1.

Referring to FIGS. 18 and 19, like the plurality of first input lines IL1, the ground voltage line GND may be arranged in (or directly on) substantially the same layer as the source electrode S1 (see FIG. 7A). In an embodiment where the shielding line GNDL is arranged between the emission control output line EMO and the connection line CW, the shielding line GNDL may be arranged in (or directly on) substantially the same layer as the first connection electrode CL1 (see FIG. 7A). Accordingly, the shielding line GNDL may be connected to the ground voltage line GND through a contact hole CNT25 defined through the first organic insulating layer 109. Accordingly, in the display apparatus 1 according to another embodiment, because the coupling noise between the emission control output line EMO and the connection line CW may be reduced through the shielding line GNDL, an image of high quality may be implemented.

However, the shielding line GNDL may be variously implemented in various embodiments. In an embodiment, as illustrated in FIG. 18, the shielding line GNDL may include one line. In an embodiment, where the emission control output line EMO includes a first emission control output line EMO1 and a second emission control output line EMO2, the first emission control output line EMO1 and the second emission control output line EMO2 may be arranged apart from each other. As the connection line CW also includes a high voltage connection line VGHL and a low voltage connection line VGLL, the high voltage connection line VGHL and the low voltage connection line VGLL may be arranged apart from each other. In an embodiment, the shielding line GNDL may include one line over the 1st-1 bridge portion BP11. In such an embodiment where the shielding line GNDL includes one line, because the area capable of shielding the noise increases and no empty space exists between lines, it may be more difficult for an electrical signal to pass through the shielding line GNDL. Accordingly, in the display apparatus 1 according to another embodiment illustrated in FIG. 18, the coupling between the emission control output line EMO and the connection line CW may be shielded much more effectively.

In another embodiment, the shielding line GNDL may include a plurality of lines as illustrated in FIG. 19. In an embodiment, for example, the shielding line GNDL may include a first shielding line GNDL1 overlapping the first emission control output line EMO1 and a second shielding line GNDL2 overlapping the second emission control output line EMO2. That is, a second portion GNDL12 of the first shielding line and a second portion GNDL22 of the second shielding line may be arranged apart from each other, and although not illustrated in FIG. 19 due to the cross-sectional position, a first portion GNDL11 of the first shielding line and a first portion GNDL21 of the second shielding line may also be arranged apart from each other. In such an embodiment, because an empty space exists between the first shielding line GNDL1 and the second shielding line GNDL2 and the area of the shielding line GNDL decreases, the parasitic capacitance that may occur between the emission control output line EMO and the shielding line GNDL or between the connection line CW and the shielding line GNDL may be reduced. Accordingly, in the display apparatus 1 illustrated in FIG. 19, the parasitic capacitance may be reduced and simultaneously the coupling noise that may occur between the emission control output line EMO and the connection line CW may be alleviated.

According to an embodiment, it may be possible to provide a display apparatus that may prevent damage due to concentration of stress and may stretch in various directions. Also, the display apparatus according to an embodiment may implement an image of high quality by minimizing a load of lines. However, these effects are merely examples and the scope of the disclosure is not limited thereto.

The invention should not be construed as being limited to the embodiments set forth herein. Rather, these embodiments are provided so that this disclosure will be thorough and complete and will fully convey the concept of the invention to those skilled in the art.

While the invention has been particularly shown and described with reference to embodiments thereof, it will be understood by those of ordinary skill in the art that various changes in form and details may be made therein without departing from the spirit or scope of the invention as defined by the following claims.

What is claimed is:

1. A display apparatus comprising:
   a substrate comprising a first island portion and a second island portion spaced apart from each other and a bridge portion connected between the first island portion and the second island portion;
   a gate driving circuit arranged in the first island portion;
   a plurality of first input lines arranged in the second island portion;
   an output line arranged in the bridge portion and connected to the gate driving circuit; and
   a connection line arranged in the bridge portion and connected to at least one of the plurality of first input lines,
   wherein the output line and the connection line are arranged in different layers, respectively, and arranged to overlap each other.

2. The display apparatus of claim 1, wherein the bridge portion is arranged at a center of a side surface of each of the first island portion and the second island portion.

3. The display apparatus of claim 1, wherein the first island portion and the second island portion are arranged alternately in a first row in a first direction,
   the first island portion is continuously arranged in a first column in a second direction intersecting the first direction, and
   the second island portion is continuously arranged in a second column in the second direction.

4. The display apparatus of claim 3, wherein a first bridge portion and a second bridge portion are arranged on opposing sides of the second island portion in the first direction,
   the connection line is arranged in only one of the first bridge portion and the second bridge portion, and
   the output line extends through the first bridge portion and the second bridge portion.

5. The display apparatus of claim 3, wherein a third bridge portion and a fourth bridge portion are arranged on opposing sides of the second island portion in the second direction, and
   the plurality of first input lines extend through the third bridge portion and the fourth bridge portion.

6. The display apparatus of claim 1, wherein the substrate includes a display area and a non-display area surrounding the display area, and the first island portion and the second island portion are arranged in the non-display area.

7. The display apparatus of claim 6, wherein the substrate further comprises a plurality of main island portions arranged in the display area, and
a planar area of each of the first island portion and the second island portion is greater than a planar area of one of the plurality of main island portions.

8. The display apparatus of claim 1, wherein the gate driving circuit comprises at least one selected from an emission control driving circuit, a bypass driving circuit, an initialization driving circuit, and a data write driving circuit.

9. The display apparatus of claim 8, wherein the output line comprises at least one selected from an emission control output line which transmits an output signal of the emission control driving circuit, a bypass output line which transmits an output signal of the bypass driving circuit, an initialization output line which transmits an output signal of the initialization driving circuit, and a data write output line which transmits an output signal of the data write driving circuit.

10. The display apparatus of claim 1, wherein the plurality of first input lines comprise at least one selected from a gate high voltage line, a gate low voltage line, and a start signal line.

11. The display apparatus of claim 10, wherein the connection line comprises at least one selected from a high voltage connection line connected to the gate high voltage line and a low voltage connection line connected to the gate low voltage line.

12. The display apparatus of claim 1, further comprising:
a plurality of second input lines arranged in the first island portion,
wherein the plurality of second input lines comprise at least one selected from a clock line, a carry line, and a reset signal line.

13. The display apparatus of claim 12, wherein the plurality of second input lines extend through a bridge portion connected between the first island portion and another first island portion adjacent to the first island portion.

14. The display apparatus of claim 1, wherein the bridge portion has a serpentine shape.

15. The display apparatus of claim 1, wherein the output line extends from the bridge portion to be arranged in the second island portion, and extends in a direction intersecting the plurality of first input lines.

16. The display apparatus of claim 15, further comprising:
a bridge electrode arranged in an area overlapping the plurality of first input lines in the second island portion, and intersecting the plurality of first input lines,
wherein the output line is connected to opposing ends of the bridge electrode, and
the bridge electrode is disposed under the output line and the plurality of first input lines.

17. The display apparatus of claim 1, wherein the connection line is disposed over the output line, and
at least one insulating layer is arranged between the connection line and the output line.

18. The display apparatus of claim 17, wherein the output line comprises a plurality of lines in the bridge portion, and
the plurality of lines are arranged apart from each other in a plan view.

19. The display apparatus of claim 17, wherein the substrate further comprises a plurality of main island portions arranged in a display area,
wherein a pixel driving circuit unit and a light emitting element connected to the pixel driving circuit unit are arranged in each of the plurality of main island portions, and
the pixel driving circuit unit and the light emitting element are connected to each other through a first connection electrode disposed over the pixel driving circuit unit and a second connection electrode disposed over the first connection electrode.

20. The display apparatus of claim 19, wherein the output line is arranged in a same layer as at least one selected from a source electrode and a drain electrode of the pixel driving circuit unit, and includes a same material as the source electrode or the drain electrode, and
the connection line is arranged in a same layer as the first connection electrode, and includes a same material as the first connection electrode.

21. The display apparatus of claim 19, wherein the output line has a dual-line structure including a lower output line and an upper output line disposed over the lower output line, and
at least one insulating layer is arranged between the lower output line and the upper output line.

22. The display apparatus of claim 21, wherein the lower output line and the upper output line are connected to each other through a contact hole, and
the contact hole is arranged in the first island portion.

23. The display apparatus of claim 21, wherein the lower output line is arranged in a same layer as at least one selected from a source electrode and a drain electrode of the pixel driving circuit unit,
the upper output line is arranged in a same layer as the first connection electrode, and
the connection line is arranged in a same layer as the second connection electrode.

24. The display apparatus of claim 19, further comprising:
a shielding line arranged between the output line and the connection line,
wherein at least one insulating layer is arranged between the output line and the shielding line, and
at least one insulating layer is arranged between the shielding line and the connection line.

25. The display apparatus of claim 24, further comprising:
a ground voltage line arranged adjacent to the plurality of first input lines in the second island portion,
wherein the shielding line is connected to the ground voltage line.

26. The display apparatus of claim 24, wherein the output line is arranged in a same layer as at least one selected from a source electrode and a drain electrode of the pixel driving circuit unit,
the shielding line is arranged in a same layer as the first connection electrode, and
the connection line is arranged in a same layer as the second connection electrode.

27. The display apparatus of claim 24, wherein the shielding line comprises a single line in the bridge portion.

28. The display apparatus of claim 24, wherein the shielding line comprises a plurality of shielding lines in the bridge portion, and the plurality of shielding lines are arranged apart from each other.

* * * * *